(12) United States Patent
Luch

(10) Patent No.: US 7,452,656 B2
(45) Date of Patent: Nov. 18, 2008

(54) ELECTRICALLY CONDUCTIVE PATTERNS, ANTENNAS AND METHODS OF MANUFACTURE

(75) Inventor: Daniel Luch, Morgan Hill, CA (US)

(73) Assignee: Ertek Inc., Los Altos, CA (US)

( * ) Notice: Subject to any disclaimer, the term of this patent is extended or adjusted under 35 U.S.C. 154(b) by 74 days.

(21) Appl. No.: 10/988,044

(22) Filed: Nov. 12, 2004

(65) Prior Publication Data

US 2005/0123857 A1    Jun. 9, 2005

Related U.S. Application Data

(63) Continuation-in-part of application No. 10/408,532, filed on Apr. 7, 2003, now abandoned, which is a continuation-in-part of application No. 09/818,128, filed on Mar. 26, 2001, now Pat. No. 6,582,887.

(51) Int. Cl.
*G03F 7/00* (2006.01)
*H01Q 1/12* (2006.01)

(52) U.S. Cl. ............... 430/270.1; 430/311; 343/878; 343/700

(58) Field of Classification Search ............ 430/270.1, 430/311; 343/700
See application file for complete search history.

(56) References Cited

U.S. PATENT DOCUMENTS

| | | | |
|---|---|---|---|
| 3,523,875 A | 8/1970 | Minklei | |
| 3,619,382 A | 11/1971 | Lupinski | |
| 3,682,786 A | 8/1972 | Brown et al. | |
| 3,865,699 A | 2/1975 | Luch | |
| 4,009,093 A | 2/1977 | Luch | |
| 4,038,042 A | 7/1977 | Adelman | |
| 4,101,385 A | 7/1978 | Luch | |
| 4,158,612 A | 6/1979 | Luch et al. | |
| 4,191,617 A | 3/1980 | Hurley et al. | |
| 4,195,117 A | 3/1980 | Luch | |
| 4,278,510 A | 7/1981 | Chien et al. | |
| 4,395,362 A | 7/1983 | Satoh et al. | |
| 4,425,262 A | 1/1984 | Kawai et al. | |
| 4,429,020 A | 1/1984 | Luch | |
| 4,510,079 A | 4/1985 | Kawai et al. | |
| 4,603,092 A | 7/1986 | Luch | |
| 4,835,541 A | 5/1989 | Johnson et al. | |
| 4,862,184 A | 8/1989 | Ploussios | |
| 4,985,116 A | 1/1991 | Mettler et al. | |
| 4,985,600 A | 1/1991 | Heerman | |
| 4,996,391 A | 2/1991 | Schmidt | |
| 5,206,657 A | 4/1993 | Downey | |
| 5,355,142 A | 10/1994 | Marshall et al. | |
| 5,444,453 A | 8/1995 | Lalezari | |
| 5,495,260 A | 2/1996 | Couture | |
| 5,508,709 A | 4/1996 | Krenz et al. | |
| 5,547,516 A | 8/1996 | Luch | |
| 5,567,296 A | 10/1996 | Luch | |

(Continued)

FOREIGN PATENT DOCUMENTS

EP    0942441    9/1999

*Primary Examiner*—Amanda C. Walke

(57) ABSTRACT

The invention teaches improved, novel methods and materials for the production of antennas. The invention contemplates the use of Directly Electroplateable Resins for the production of these antennas. The unique suitability of Directly Electroplateable Resins to allow facile manufacture of the antennas desired using a broad range of processing and manufacturing approaches is demonstrated.

37 Claims, 38 Drawing Sheets

U.S. PATENT DOCUMENTS

| | | |
|---|---|---|
| 5,569,879 A | 10/1996 | Gloton et al. |
| 5,648,788 A | 7/1997 | Bumsted |
| 5,709,832 A | 1/1998 | Hayes et al. |
| 5,735,966 A | 4/1998 | Luch |
| 5,809,633 A | 9/1998 | Mundigl et al. |
| 5,847,931 A | 12/1998 | Gaumet et al. |
| 5,896,111 A | 4/1999 | Houdeau et al. |
| 5,898,215 A | 4/1999 | Miller et al. |
| 5,900,841 A | 5/1999 | Hirata et al. |
| 5,911,454 A | 6/1999 | Crothall |
| 5,914,690 A | 6/1999 | Lehtola et al. |
| 5,973,598 A | 10/1999 | Beigel |
| 5,995,050 A | 11/1999 | Moller et al. |
| 5,995,052 A | 11/1999 | Sadler et al. |
| 6,027,027 A | 2/2000 | Smithgall |
| 6,049,314 A | 4/2000 | Munson et al. |
| 6,049,463 A | 4/2000 | O'Malley et al. |
| 6,052,090 A | 4/2000 | Simmons et al. |
| 6,052,889 A | 4/2000 | Yu et al. |
| 6,067,056 A | 5/2000 | Lake |
| 6,075,489 A | 6/2000 | Sullivan |
| 6,081,236 A | 6/2000 | Aoki |
| 6,107,920 A | 8/2000 | Eberhardt et al. |
| 6,137,452 A | 10/2000 | Sullivan |
| 6,147,660 A | 11/2000 | Elliott |
| 6,157,344 A | 12/2000 | Bateman et al. |
| 6,161,761 A | 12/2000 | Ghaem et al. |
| 6,163,260 A | 12/2000 | Conwell et al. |
| 6,168,855 B1 | 1/2001 | Cohen et al. |
| 6,184,833 B1 | 2/2001 | Tran |
| 6,195,858 B1 | 3/2001 | Ferguson et al. |
| 6,239,352 B1 | 5/2001 | Luch |
| 6,255,999 B1 | 7/2001 | Faulkener et al. |
| 6,259,369 B1 | 7/2001 | Monico |
| 6,265,977 B1 | 7/2001 | Vega et al. |
| 6,271,793 B1 | 8/2001 | Brady et al. |
| 6,331,838 B1 | 12/2001 | Scott et al. |
| 6,343,208 B1 | 1/2002 | Ying |
| 6,414,235 B1 | 7/2002 | Luch |
| 6,459,032 B1 | 10/2002 | Luch |
| 6,582,887 B2 | 6/2003 | Luch |
| 6,697,248 B1 | 2/2004 | Luch |
| 7,120,005 B1 | 10/2006 | Luch |

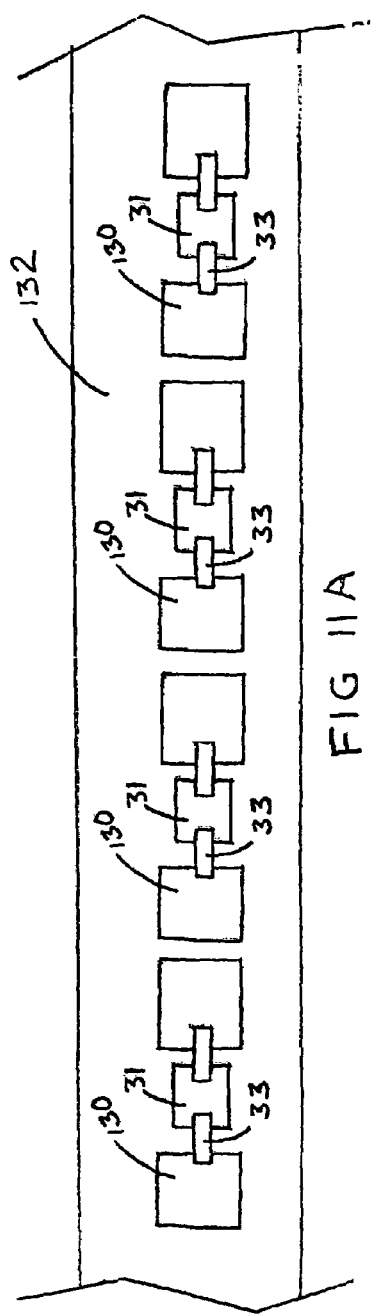
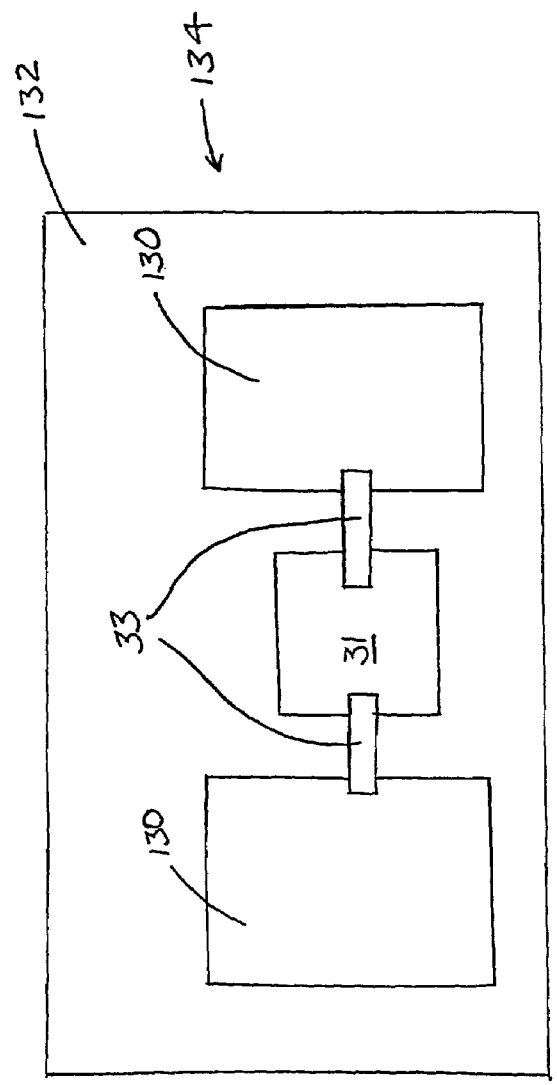

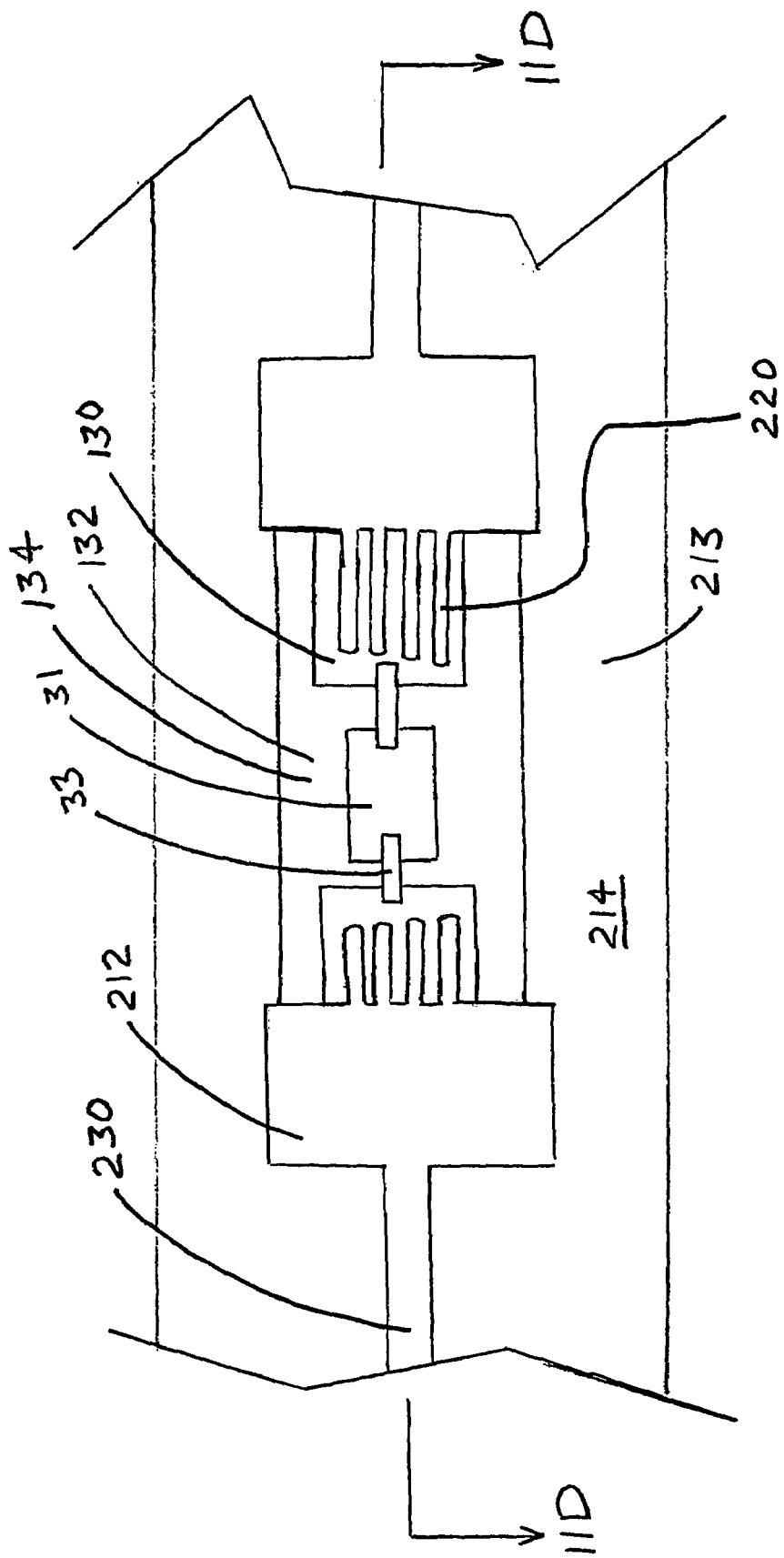

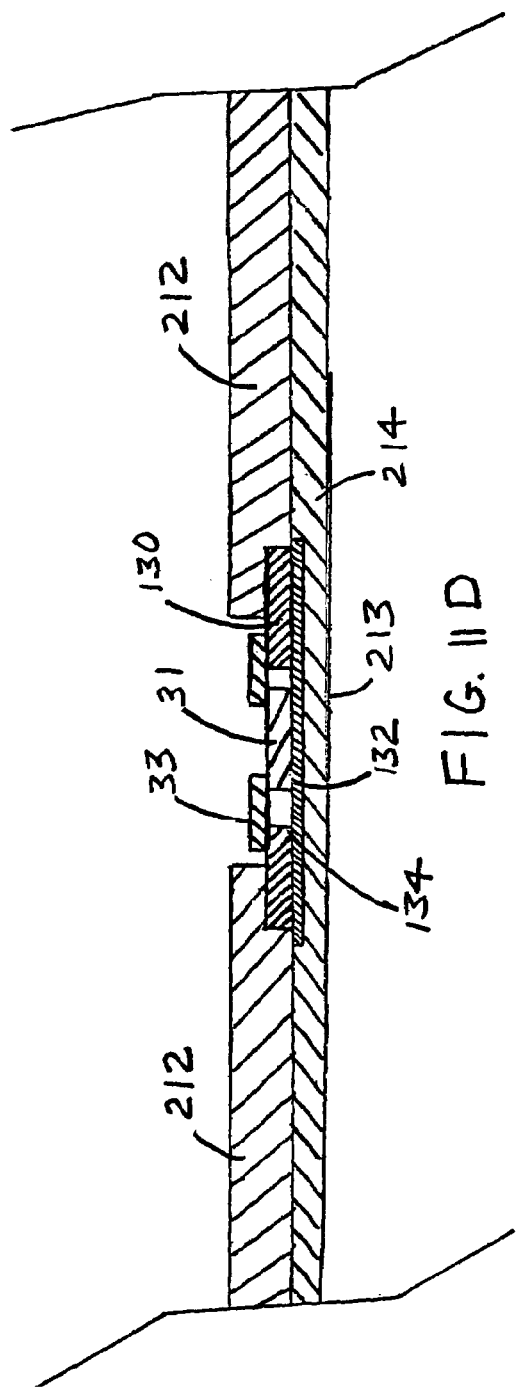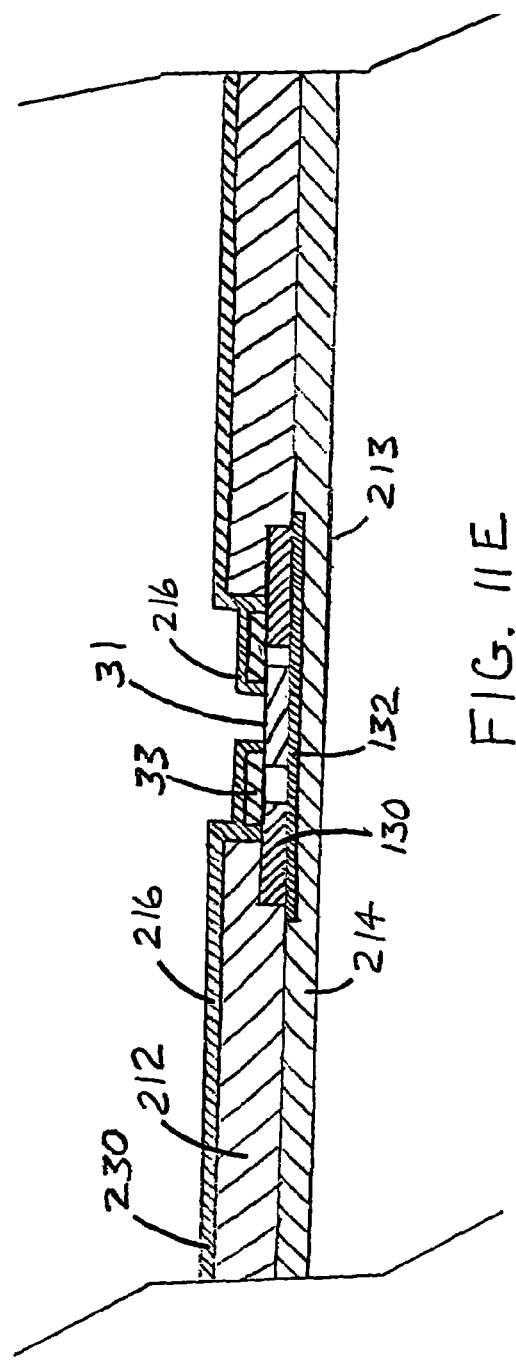

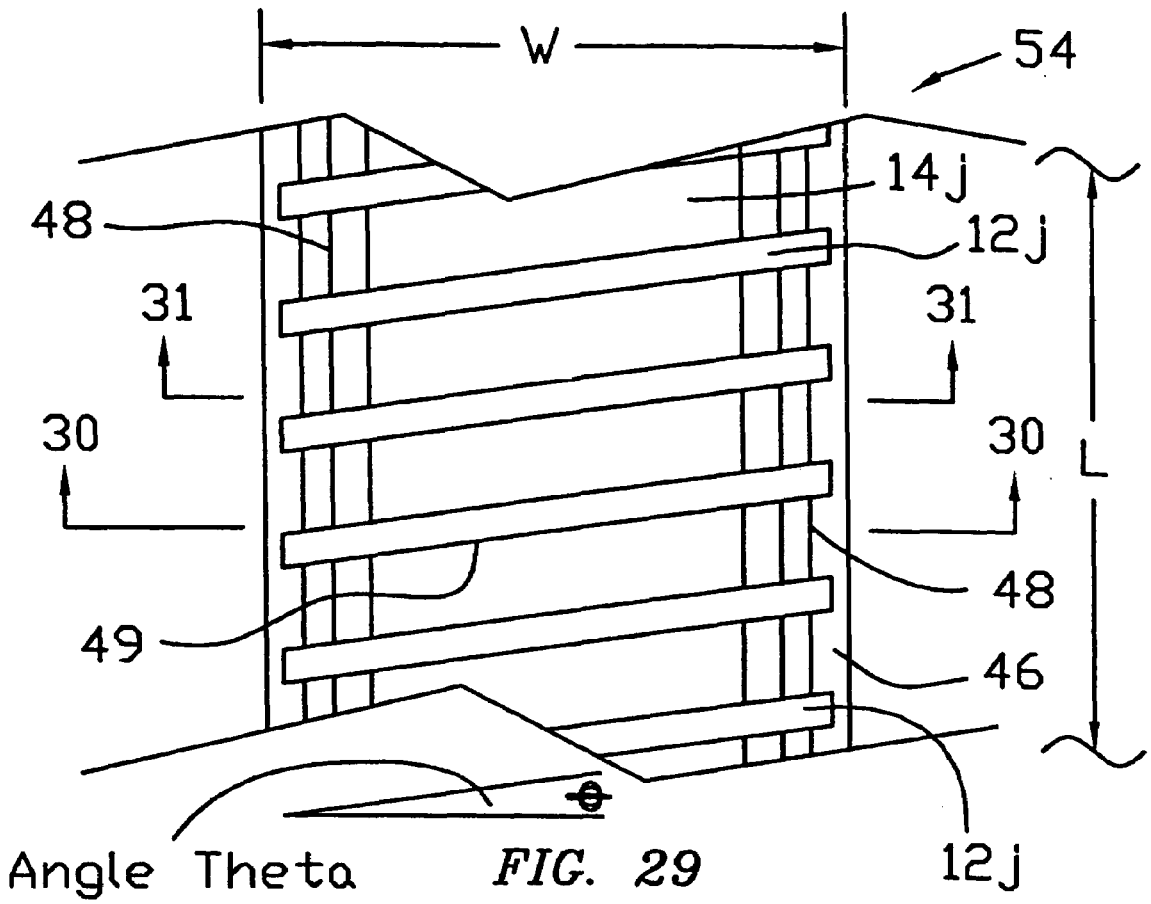
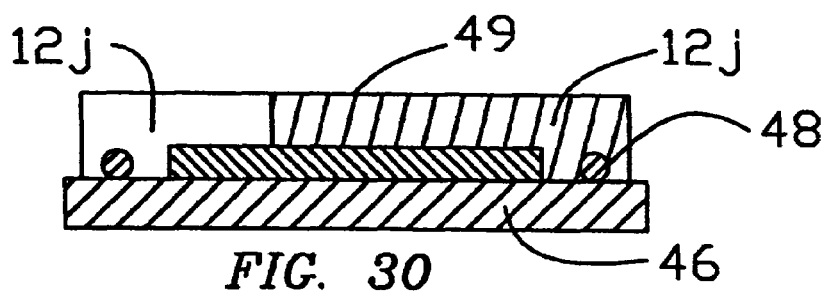
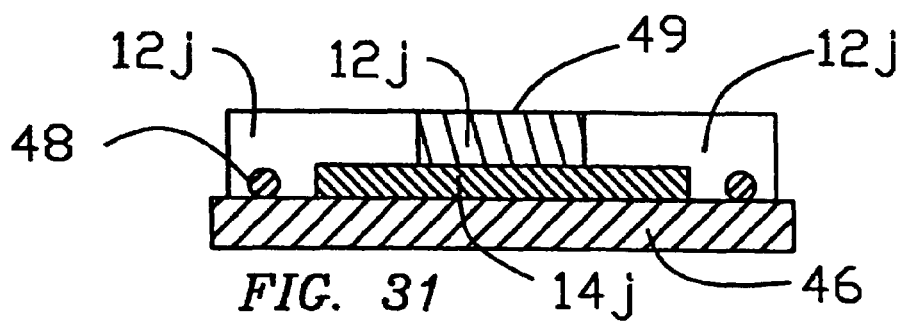

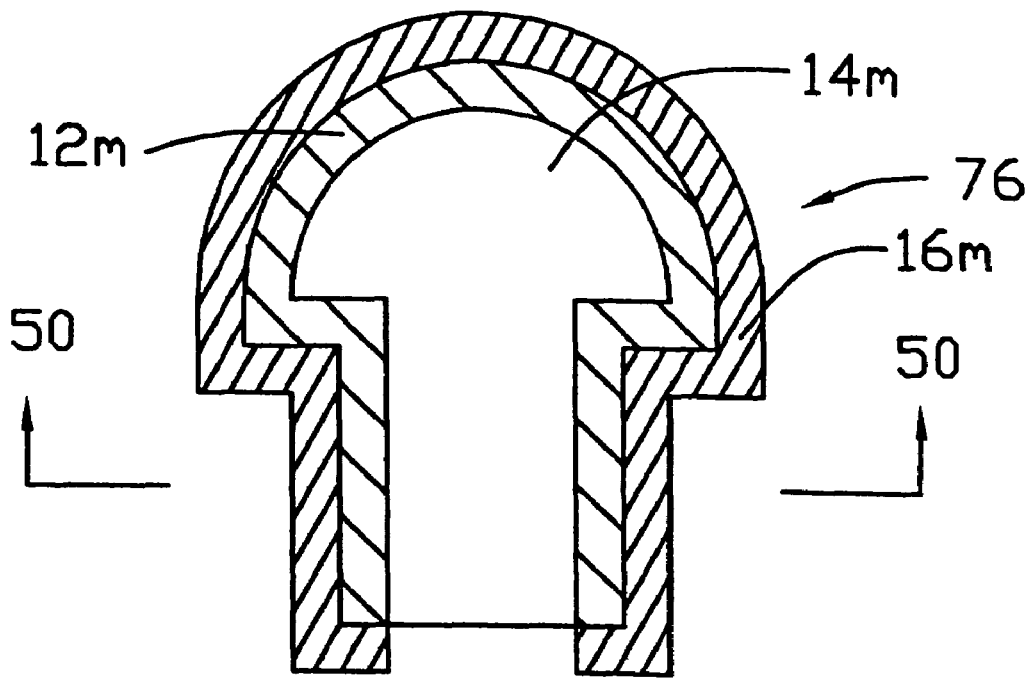
*FIG. 49*
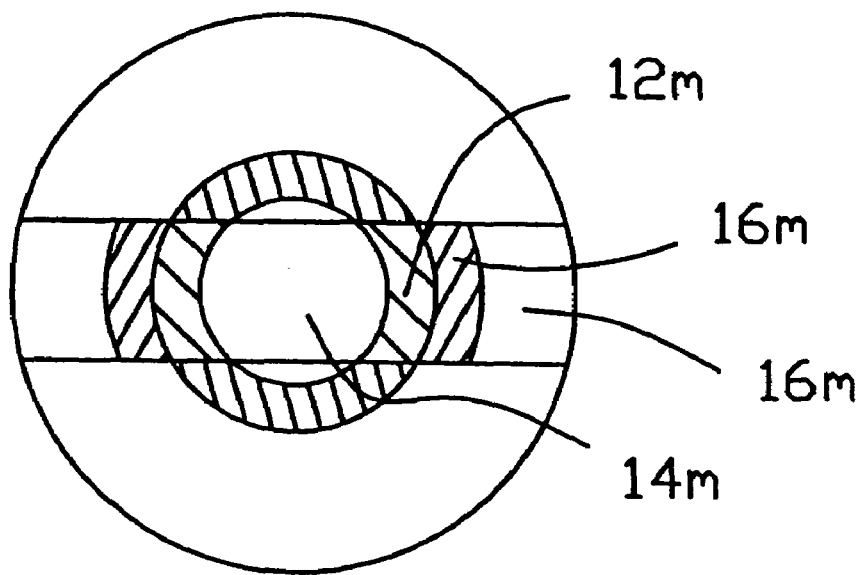
*FIG. 50*

(MPL)

ELECTRICALLY CONDUCTIVE PATTERNS, ANTENNAS AND METHODS OF MANUFACTURE

CROSS-REFERENCE TO RELATED APPLICATIONS

This application is a Continuation-in-Part of U.S. patent application Ser. No. 10/408,532 filed Apr. 7, 2003 now abandoned entitled Electrically Conductive Patterns, Antennas, and Methods of Manufacture, which is a Continuation-in-Part of U.S. patent application Ser. No. 09/818,128 filed Mar. 26, 2001 entitled Electrically Conductive Patterns, Antennas, and Methods of Manufacture, and now U.S. Pat. No. 6,582,887. The entire contents of the above identified applications are incorporated herein by this reference.

BACKGROUND OF THE INVENTION

The explosive proliferation of "wireless" electronic devices is to continue into the future. These ubiquitous items include cellular phones and pagers, so-called contactless "smart cards", radio frequency identification (RFID) tags and the emerging wireless data transmission devices. One common component of all these devices is an antenna. As is commonly considered, an antenna is an apparatus designed to receive, transmit, reflect and/or scatter electromagnetic waves or energy. Antennas come in many different forms depending on the requirements of the device. However, a common characteristic of many antennas is that they comprise a structural combination of conductive and dielectric insulating materials. One simple form of antenna involves formation of conductive traces or patches on a substantially flat surface. These conductive structures are included in many types of antenna designs, including coil, monopole, dipole and microstrip forms. Examples of these simple antenna structures are those incorporated into contactless "smart cards" and RFID tags. These antennas can be formed from a coil or loop of conductive line traces. The coil or loop antenna inductively powers the semiconductor chip and also accomplishes data transfer. The cards are generally restricted to a thickness of about 1 millimeter, which dictates that the conductive traces be substantially two dimensional in structure. This relatively simple geometry permits a number of manufacturing options to be considered. For example, U.S. Pat. No. 5,896,111 to Houdeau et al. teaches a technique whereby parallel conductor tracks are formed on strips of flexible, non-conductive carrier strips. The tracks were applied using printing technology, although a detailed description of the materials and processes used to form the tracks was not presented. Bending and connecting opposite ends of adjacent traces results in a substantially planar coil antenna. The technique requires stripping of insulation and individually connecting the opposite ends of adjacent traces which is time consuming and increases manufacturing costs.

U.S. Pat. No. 5,569,879 to Gloton, et al. teaches smart card production comprising lamination of a dielectric onto a prepunched metal strip. In one embodiment a portion of the metal strip is used as part of a microstrip antenna. However, the manufacture includes additional second surface metallization and possibly photo-etching which increases complexity and cost. An additional embodiment of the U.S. Pat. No. 5,569,879 patent shows a portion of the metal strip used as an inductor, but it is not clear how such a geometry would be supported prior to lamination to the dielectric strip.

U.S. Pat. No. 6,067,056 to Lake teaches methods of forming conductive lines and substantially planar antennas by selectively overcoating a first conductive layer with a patterned second conductive layer and etching to remove exposed portions of the first conductive layer. However, etching is wasteful and difficult from an environmental standpoint.

U.S. Pat. No. 5,809,633 to Mundigl et al. teaches manufacturing a coil antenna for a contactless smart card by winding wire in an automatic wire winding machine through a plurality of turns prior to placement on a carrier body. However, the wire used in a smart card antenna must be relatively thin to prevent unacceptable bulges in the final laminated card. Thus it would appear that the unsupported wire bending taught in U.S. Pat. No. 5,809,633 could be difficult to achieve in volume manufacturing.

U.S. Pat. No. 5,898,215 to Miller et al. describes smart card antennas embedded in a plastic laminate. The antenna is formed by winding an insulated copper wire, a process requiring removal of insulation in the region of contact. Alternate methods of manufacture for the antenna such as plating, etching, conductive ink printing and foil lamination were mentioned, although no specific process was taught in detail.

Other teachings for forming antenna structures on substantially flat surfaces involve printing the antenna design onto the surface using conductive inks or pastes. This method is taught, for example, in European Patent Publication EP 0942441A2 to Sugimura, PCT Publication WO 9816901A1 to Azdasht et al. and U.S. Pat. No. 5,900,841 to Hirata et al. These techniques suffer from the relatively high costs of the conductive inks and a high resistivity of these materials compared to substantially pure metals. It also may be difficult to make the required electrical contacts to these conductive inks.

U.S. Pat. No. 5,995,052 to Sadler, et al. and U.S. Pat. No. 5,508,709 to Krenz, et al. illustrate mobile phone antennas comprising conductive structures formed on substantially flat dielectric surfaces. Neither of these disclosures provided a detailed description of methods for forming and adhering the patterned conductive structures onto the dielectric surfaces.

Other techniques for formation of antenna structures on substantially flat surfaces utilize the photoetch technology widely employed for manufacture of printed circuits. These manufacturing techniques are taught in the "printed circuit" antenna structures of U.S. Pat. No. 5,709,832 to Hayes et al., U.S. Pat. No. 5,495,260 to Couture, and U.S. Pat. No. 5,206,657 to Downey. Hayes taught production of a printed monopole antenna, while Couture taught a dipole antenna produced using the circuit board techniques. Downey taught production of a coaxial double loop antenna by selective etching of a double metal cladded circuit board. These techniques involve creating a conductive antenna structure on a substantially flat surface through processes involving patterned etching. Techniques for producing antennas by selective etching suffer from excessive material waste, pollution control difficulties and limited design flexibility.

Another form of antenna often employed with wireless communication devices is the so-called "whip" antenna. These antennas normally comprise straight or helical coil wire structures, or combinations thereof, and are often moveable between extended and retracted positions. A typical example of such antenna design is taught in U.S. Pat. No. 5,995,050 to Moller, et al. Moller et al. teaches production of so-called extendable "whip" antennas combining wound helical and straight portions of wire. U.S. Pat. No. 6,081,236 to Aoki taught using a coaxial cable as a radiation element in conjunction with a helical antenna. U.S. Pat. No. 6,052,090 to Simmons, et al. teaches a combination of helical and straight radiating elements for multi-band use. The wire forming techniques proposed in these disclosures are, of course, limited in design flexibility. In many cases, the antenna and especially the helical coil must be encapsulated with insulating material for dimensional and structural integrity as well as aesthetic considerations. This encapsulation is often done by insert injection molding with a thermoplastic encapsulant. Care must be taken to ensure that the high injection pressures and speeds inherent in injection molding do not cause undesirable movement and dimensional changes of the wire coil. This problem was addressed by Bumsted in U.S. Pat. No. 5,648, 788. However, the specialized tooling taught by Bumsted would appear to further reduce design flexibility and likely increase costs.

Other problems are associated with the "whip" antennas. They are subject to damage, especially when extended, and can cause inadvertent personal injury. The fact that they must be retractable increases mechanical wear and limits possible size reductions for the device. U.S. Pat. No. 6,075,489 to Sullivan addresses this latter problem by teaching a telescoping "whip" antenna combining a helix mounted on slideable components to enable telescopic extension. This design allows a longer antenna but increases complexity and cost and increases possibility of damage when extended.

As size continues to be an issue, increasing attention is devoted toward conformal antennas. Conformal antennas generally follow the shape of the surface on which they are supported and generally exhibit a low profile. There are a number of different types of conformal antennas, including microstrip, stripline, and three-dimensional designs. The low-profile resonant microstrip antenna radiators generally comprise a conductive radiator surface positioned above a more extensive conductive ground plane. The conductive surfaces are normally substantially opposing and spaced apart from one another. The substantially planar conductive surfaces can be produced by well-known techniques such as conductive coating, sheet metal forming or photo-etching of doubly clad dielectric sheet.

A factor to consider in design and construction of high efficiency microstrip antennas is the nature of the separating dielectric material. U.S. Pat. No. 5,355,142 to Marshall, et al. and U.S. Pat. No. 5,444,453 to Lalezari teach using air as the dielectric. This approach tends to increase the complexity of manufacture and precautions must be made to ensure and maintain proper spacing between radiator and ground plane.

U.S. Pat. No. 6,157,344 to Bateman, et al. teaches manufacture of flat antenna structures using well-known photomasking and etching techniques of copper cladded dielectric substrates.

U.S. Pat. No. 6,049,314 to Munson, et al., U.S. Pat. No. 4,835,541 to Johnson, et al. and U.S. Pat. No. 6,184,833 to Tran all teach manufacture of a microstrip antennas produced by cutting and forming an initially planar copper sheet into the form of a "U". Cutting and forming of planar metal sheets offers limited design options. In addition, provision must be made to provide a dielectric supporting structure between the two arms of the "U" since the sheet metal would likely not maintain required planar spacing without such support.

One notes that most of the technologies for antenna production involve the placement and combining of conductive material patterns with either a supportive or protective dielectric substrate. Antenna production often involves the production of well-defined patterns, strips or traces of conductive material held in position by a dielectric material.

As technology evolves, consumers have demanded a greater number of features incorporated in a specific device. These requirements tend to increase the size of the device. Simultaneously, there has been the need to make these portable devices smaller and lighter to maximize convenience. These conflicting requirements extend to the antenna, and attempts have been made to advance the antenna design toward three-dimensional structures to maximize performance and minimize size.

For example, U.S. Pat. No. 5,914,690 to Lehtola et al. teaches an internal conformal antenna of relatively simple, three dimensional construction for a wireless portable communication device. The antenna comprises an assembly of multiple pieces. A radiator plate is positioned between a cover structure and a support frame positioned over and connected to an electrically conductive earth plane. The radiator plate is formed from a flexible thin metal plate. The multiple pieces required for accurate positioning of the radiator plate relative to the earth plane increases the manufacturing cost of the Lehtola et al. structures.

Unfortunately, more complicated three-dimensional metal-based patterns often required for antenna manufacture can be difficult or impossible to produce using conventional mechanical wire winding, sheet forming or photoetching techniques. Photoetching requires a conforming mask to define the circuitry. U.S. Pat. No. 5,845,391 to Bellus, et al. illustrates the complications associated with prior art photoetch methods of forming three-dimensional metallic patterns on a dielectric substrate. Bellus, et al. teaches manufacture of a three-dimensional tapered notch antenna array formed on an injected molded thermoplastic grid. Multiple operations, specialized masking and other complications are involved in production of the photoetched metallic patterns. In addition, the metallic patterns produced were still restricted to a three dimensional structure made up of essentially flat dielectric panels.

Mettler et al., U.S. Pat. No. 4,985,116 taught the use of thermoforming a plastic sheet coated with a vacuum formable ink into a mask having the surface contour of a three dimensional article. A computer controlled laser is used to remove ink in a desired patterned design. The mask was then drawn tightly to a resist coated workpiece. Using known methods of photo and metal deposition processing, a part having patterned three-dimensional structure is produced. The Mettler, et al. patent also discussed the limitations of using a photomask on a three dimensional substrate by using the example of a mushroom. A photomask cannot easily conform to the stem of the mushroom while still permitting the mask to be installed or removed over the cap of the mushroom. Thus, a significant limitation on design flexibility exists with conventional photoetching techniques for production of three dimensional antenna structures.

A number of patents envision antenna structures comprising metal-based materials deposited into trenches or channels formed in a dielectric support. For example, Crothall in U.S. Pat. No. 5,911,454 teaches a method of forming a strip of conductive material by depositing a conductive material into a channel formed by two raised portions extending upward from a surface of an insulating material. The conductive material was deposited to overlay portions of the raised material. The conductive material overlaying the raised portions was then removed to result in a sharply defined conductive strip. The process taught by Crothall is clearly limited in its design flexibility by the material removal requirement. Ploussios, U.S. Pat. No. 4,862,184 teaches deposition of metal into a helical channel support. The selective deposition process was described only to the extent that it was achieved by known plating techniques. U.S. Pat. No. 4,996,391 to Schmidt and U.S. Pat. No. 4,985,600 to Heerman both teach injection molded substrates upon which a circuit is applied. In both patents, the pattern of the eventual circuitry is molded in the form of trenches or depressions below a major, substantially planar surface. In this way, plating resist lacquer applied by roller coating will coat only those surface areas of the major, substantially planar surface, and subsequent chemical metal deposition occurs only in the trenches remaining uncoated by the plating resist. This technique avoids the complications of photoetching, but is still design limited by the requirement of applying the plating resist. Application of the plating resist becomes increasingly difficult as the contours of the major surface become more complicated. In addition, chemical metal deposition is relatively slow in building thickness and the chemistry used is relatively expensive.

As wireless communication devices continue to evolve, the demands on the design, size and manufacturability of the required antennas will become increasingly challenging. There is clearly a need for improved materials, processes and manufacturing techniques to produce the antennas of the future.

U.S. Pat. No. 6,052,889 to Yu, et al. teaches a method for preparing a radio frequency antenna having a plurality of radiating elements. The three dimensional assembly includes multiple steps including electroless metal deposition on components to a metal thickness of at least 0.0015 inch. Electroless metal deposition involves relatively slow deposition rates and thus extended processing times are required to deposit such thickness. The Yu, et al. teaching also involves photoetching to selectively remove metal, further complicating the methods taught.

Elliott, in U.S. Pat. No. 6,147,660 addresses the design limitations intrinsic in helical wire-winding processing and teaches use of a molded helical antenna. Techniques taught to produce the molded antennas included zinc die casting, metal injection molding, or molding of a material such as ABS, which can be plated by conventional technology. Elliot taught non-circular or non-symmetrical helical antennas, difficult to manufacture by conventional wire winding methods. The manufacturing methods proposed would be difficult and costly.

A number of recent approaches to production of improved antennas involve a technology generally described as "plating on plastics". The "plating on plastics" technology is intended to deposit an adherent coating of a metal or metal-based material onto the surface of a plastic substrate. Conventional "plating on plastics" typically envisions the deposition of an initial metal coating using "electroless" plating followed by an optional deposition of additional metal using electrodeposition. Electroless plating of a plastics involves chemically coating a nonconductive surface such as a plastic with a metallic film. Unlike conventional electroplating, electroless plating does not require the use of electricity to deposit the metal. Instead, a series of chemical steps involving etchants and catalysts prepare the non-conductive plastic substrate to accept a metal layer deposited by chemical reduction of metal from solution. The process often involves depositing a thin layer of highly conductive copper followed by a nickel topcoat, which protects the copper sublayer from oxidation and corrosion. The thickness of the nickel topcoat can be adjusted depending on the abrasion and corrosion requirements of the final product. Because electroless plating is an immersion process, uniform coatings can be applied to almost any configuration regardless of size or complexity. Electroless plating also provides a conductive, essentially pure metal surface. Electrolessly plated parts can be subsequently electroplated if required.

Unfortunately, the "plating on plastics" process comprises many steps involving expensive and harsh chemicals. This increases costs dramatically and involves environmental difficulties. The process can be sensitive to processing variables used to fabricate the plastic substrate, limiting applications to carefully molded parts and designs. It may be difficult to properly mold conventional plateable plastics using the rapid injection rates often required for the thin walls of electronic components. The rapid injection rates can cause poor surface distribution of etchable species, resulting in poor surface roughening and subsequent inferior bonding of the chemically deposited metal. Finally, the rates at which metals can be chemically deposited are relatively slow, typically about one micrometer per hour. The conventional technology for metal plating on plastic (etching, chemical reduction, optional electroplating) has been extensively documented and discussed in the public and commercial literature. See, for example, Saubestre, Transactions of the Institute of Metal Finishing, 1969, Vol. 47, or Arcilesi et al., Products Finishing, March 1984.

Despite the difficulties, a number of attempts have been made to utilize the "plating on plastics" technology for the production of antennas. Most antenna applications involve selective placement of a metal conductor in relation to an insulating material. Selective metallization using the "plating on plastics" technology can be achieved in a number of ways. A first method is to coat the entire insulating substrate with metal and then selectively remove metal using photoetching techniques that have been used for many years in the production of printed circuits. However, these techniques are very limited in design flexibility, as discussed previously. A second method is to apply a plating stopoff coating prior to chemically depositing the metal. The stopoff is intended to prevent metal deposition onto the coated surfaces. This approach was incorporated into the teachings of Schmidt, U.S. Pat. No. 4,996,391, and Heerman, U.S. Pat. No. 4,985,600 referenced above. This approach is design limited by the need for the stopoff coating. Another more recent approach is to incorporate a plating catalyst into a resin and to combine the "catalyzed resin with an "uncatalyzed" resin in a two shot molding operation. Only the surfaces formed by the "catalyzed" resin will stimulate the chemical reaction reducing metal, and thus conceptually only those surfaces will be metallized. This approach is taught, for example, in U.S. Pat. No. 6,137,452 to Sullivan.

Selective metallizing using either stopoff lacquer of catalyzed resin approaches can be difficult, especially on complex parts, since the electroless plating may tend to coat any exposed surface unless the overall process is carefully controlled. Poor line definition, "skip plating" and complete part coverage due to bath instabilities often occurs. Despite much effort to develop consistent and reliable performance through material and process development, these problems still remain.

There is a clear need for improved technology to enable facile production of antennas comprising electroplated plastic structures.

A number of attempts have been made to simplify the electroplating of plastics. If successful such efforts could result in significant opportunities as well as cost reductions for electroplated plastics used for antennas. In addition expanded possibilities such as the continuous manufacture of low-cost antennas could be envisioned. Some simplification attempts involve special chemical techniques, other than conventional electroless metal deposition, to produce an electrically conductive film on the surface. Typical examples of the approach are taught by U.S. Pat. No. 3,523,875 to Minklei, U.S. Pat. No. 3,682,786 to Brown et al., and U.S. Pat. No. 3,619,382 to Lupinski. The electrically conductive surface film produced was intended to be electroplated. Multiple performance problems thwarted these attempts.

Other approaches contemplate making the plastic surface itself conductive enough to allow it to be electroplated directly thereby avoiding the "electroless plating" processes. Polymers can be made electrically conductive through incorporation of conductive fillers. Alternatively, intrinsically conductive polymers are known in the art.

Efforts have been made to advance systems contemplating metal electrodeposition directly onto the surface of electrically conductive polymers made conductive through incorporating conductive fillers. When considering polymers rendered electrically conductive by loading with electrically conductive fillers, it may be important to distinguish between "microscopic resistivity" and "bulk" or macroscopic resistivity". "Microscopic resistivity" refers to a characteristic of a polymer/filler mix considered at a relatively small linear dimension of for example 1 micrometer or less. "Bulk" or "macroscopic resistivity" refers to a characteristic determined over larger linear dimensions. To illustrate the difference between "microscopic" and "bulk, macroscopic" resistivities, one can consider a polymer loaded with conductive fibers at a fiber loading of 10 weight percent. Such a material might show a low "bulk, macroscopic" resistivity when the measurement is made over a relatively large distance. However, because of fiber separation (holes) such a composite might not exhibit consistent "microscopic" resistivity. When producing an electrically conductive polymer intended to be electroplated, one should consider "microscopic resistivity" in order to achieve uniform, "hole-free" deposit coverage. Thus, it may be advantageous to consider conductive fillers comprising those that are relatively small, but with loadings sufficient to supply the required conductive contacting. Such fillers include metal powders and flake, metal coated mica or spheres, conductive carbon black and the like.

Efforts to produce electrically conductive polymers suitable for direct electroplating have encountered a number of obstacles. The first is the combination of fabrication difficulty and material property deterioration brought about by the heavy filler loadings often required. A second is the high cost of many conductive fillers employed such as silver flake.

Another obstacle involved in the electroplating of electrically conductive polymers is a consideration of adhesion between the electrodeposited metal and polymeric substrate (metal/polymer adhesion). In some cases such as electroforming, where the electrodeposited metal is eventually removed from the substrate, metal/polymer adhesion may actually be detrimental. However, in most cases sufficient adhesion is required to prevent metal/polymer separation during extended environmental and use cycles.

A number of methods to enhance adhesion have been employed. For example, etching of the surface prior to plating can be considered. Etching can be achieved by immersion in vigorous solutions such as chromic/sulfuric acid. Alternatively, or in addition, an etchable species can be incorporated into the conductive polymeric compound. The etchable species at exposed surfaces is removed by immersion in an etchant prior to electroplating. Oxidizing surface treatments can also be considered to improve metal/plastic adhesion. These include processes such as flame or plasma treatments or immersion in oxidizing acids.

In the case of conductive polymers containing finely divided metal, one can propose achieving direct metal-to-metal adhesion between the electrodeposit and the filler. However, here the metal particles are generally encapsulated by the resin binder, often resulting in a resin rich "skin". To overcome this effect, one could propose methods to remove the "skin", exposing active metal filler to bond to subsequently electrodeposited metal.

Another approach to impart adhesion between conductive resin substrates and electrodeposits is incorporation of an "adhesion promoter" at the surface of the electrically conductive resin substrate. This approach was taught by Chien et al. in U.S. Pat. No. 4,278,510 where maleic anhydride modified propylene polymers were taught as an adhesion promoter. Luch, in U.S. Pat. No. 3,865,699 taught that certain sulfur bearing chemicals could function to improve adhesion of initially electrodeposited Group VIII metals.

An additional major obstacle confronting development of electrically conductive polymeric resin compositions capable of being directly electroplated is the initial "bridge" of electrodeposit on the surface of the electrically conductive resin. In electrodeposition, the substrate to be plated is often made cathodic through a pressure contact to a metal rack tip, itself under cathodic potential. However, if the contact resistance is excessive or the substrate is insufficiently conductive, the electrodeposit current favors the rack tip to the point where the electrodeposit will have difficulty bridging to the substrate.

Moreover, a further problem is encountered even if specialized racking successfully achieves electrodeposit bridging to the substrate. Many of the electrically conductive polymeric resins have resistivities far higher than those of typical metal substrates. The polymeric substrate can be relatively limited in the amount of electrodeposition current which it alone can convey. Thus, in these cases the conductive polymeric substrate may not cover almost instantly with electrodeposit as is typical with metallic substrates. Rather the electrodeposit coverage occurs by lateral growth over the surface. Except for the most heavily loaded and highly conductive polymer substrates, a significant portion of the electrodeposition current, including that associated with the lateral electrodeposit growth, must pass through the previously electrodeposited metal. In a fashion similar to the bridging problem discussed above, the electrodeposition current favors the electrodeposited metal and the lateral growth can be extremely slow and erratic. This restricts the size and "growth length" of the substrate conductive pattern which can reasonably be employed, increases plating costs, and can also result in large non-uniformities in electrodeposit integrity and thickness over the pattern.

Lateral electrodeposit coverage rate issues likely can be characterized by a continuum, being dependent on many factors such as the nature of the initially electrodeposited metal, electroplating bath chemistry and operational parameters, the polymeric binder, resistivity, and the thickness of the conductive polymeric substrate. In many cases, thin electrodeposited metal patterns having extended length are desired. Often, these patterns are to be electroplated on electrically conductive polymeric substrates having limited current carrying capacity. For example, a pattern formed using a typical electrically conductive coating or ink may have a dry thickness less than 25 micrometers, and often less than about 10 micrometers. In these cases, lateral electrodeposit coverage rates may be of concern even for highly conductive inks.

In addition to thickness, an additional factor affecting substrate current carrying capacity is resistivity. As an additional rule of thumb, the instant inventor estimates that coverage rate problems would demand attention if the resistivity of the conductive polymeric substrate rose above 0.001 ohm-cm regardless of thickness.

Beset with the problems of achieving adhesion and satisfactory electrodeposit coverage rates, investigators have attempted to produce directly electroplateable polymers by heavily loading polymers with relatively small metal containing fillers to create electrically conductive polymers. Such heavy loadings are sufficient to reduce both microscopic and macroscopic resistivity to a level where the coverage rate phenomenon may be manageable. However, attempts to make an acceptable directly electroplateable resin using the relatively small metal containing fillers alone encounter a number of barriers. First, the fine metal containing fillers are relatively expensive. The loadings required to achieve the particle-to-particle proximity for acceptable conductivity increases the cost of the polymer/filler blend dramatically. The metal containing fillers are accompanied by further problems. They tend to cause deterioration of the mechanical properties and processing characteristics of many resins. This significantly limits options in resin selection. All polymer processing is best achieved by formulating resins with processing characteristics specifically tailored to the specific process (injection molding, extrusion, blow molding, printing etc.). A required heavy loading of metal filler severely restricts ability to manipulate processing properties in this way. A further problem is that metal fillers can be abrasive to processing machinery and may require specialized screws, barrels, and the like. Finally, despite being electrically conductive, a simple metal-filled polymer still offers no mechanism to produce adhesion of an electrodeposit since the metal particles are generally encapsulated by the resin binder, often resulting in a resin-rich "skin". For the above reasons, fine metal particle containing plastics have not been widely used as substrates for discrete self supporting directly electroplateable articles. Rather, they have found applications in production of conductive adhesives, pastes, and paints.

The least expensive (and least conductive) of the readily available conductive fillers for plastics are carbon blacks. Attempts have been made to produce electrically conductive polymers based on carbon black loading intended to be subsequently electroplated. Examples of this approach are the teachings of U.S. Pat. Nos. 4,038,042, 3,865,699, and 4,278,510 to Adelman, Luch, and Chien et al. respectively.

Adelman taught incorporation of conductive carbon black into a polymeric matrix to achieve electrical conductivity required for electroplating. The substrate was pre-etched in chromic/sulfuric acid to achieve adhesion of the subsequently electroplated metal. However, the rates of electrodeposit coverage reported by Adelman may be insufficient for many applications.

Luch in U.S. Pat. No. 3,865,699 and Chien et al. in U.S. Pat. No. 4,278,510 also chose carbon black as a filler to provide an electrically conductive surface for the polymeric compounds to be electroplated. The Luch Patent 3,865,699 and the Chien Patent 4,278,510 are hereby incorporated in their entirety by this reference. However, these inventors further taught inclusion of materials to increase the rate of metal coverage or the rate of metal deposition on the polymer. These materials can be described herein as "electrodeposit growth rate accelerators" or "electrodeposit coverage rate accelerators". An electrodeposit coverage rate accelerator is a material functioning to increase the electrodeposition coverage rate over the surface of an electrically conductive polymer independent of any incidental affect it may have on the conductivity of an electrically conductive polymer. In the embodiments, examples and teachings of U.S. Pat. Nos. 3,865,699 and 4,278,510, it was shown that certain sulfur bearing materials, including elemental sulfur, can function as electrodeposit coverage or growth rate accelerators to overcome problems in achieving electrodeposit coverage of electrically conductive polymeric surfaces having relatively high resistivity or thin electrically conductive polymeric substrates having limited current carrying capacity.

In addition to elemental sulfur, sulfur in the form of sulfur donors such as sulfur chloride, 2-mercapto-benzothiazole, N-cyclohexyle-2-benzothiaozole sulfonomide, dibutyl xanthogen disulfide, and tetramethyl thiuram disulfide or combinations of these and sulfur were identified. Those skilled in the art will recognize that these sulfur donors are the materials which have been used or have been proposed for use as vulcanizing agents or accelerators. Since the polymer-based compositions taught by Luch and Chien et al. could be electroplated directly they could be accurately defined as directly electroplateable resins (DER). These DER materials can be generally described as electrically conductive polymers characterized by having an electrically conductive surface with the inclusion of an electrodeposit coverage rate accelerator. In the following, the acronym "DER" will be used to designate a directly electroplateable resin as defined in this specification.

Specifically for the present invention, directly electroplateable resins, (DER), are characterized by the following features:

(a) presence of an electrically conductive polymer characterized by having an electrically conductive surface;

(b) presence of an electrodeposit coverage rate accelerator;

(c) presence of the electrically conductive polymer characterized by having an electrically conductive surface and the electrodeposit coverage rate accelerator in the directly electroplateable composition in cooperative amounts appropriate to allow direct coverage of the composition with an electrodeposited metal or metal-based alloy.

In his Patents, Luch specifically identified elastomers such as natural rubber, polychloroprene, butyl rubber, chlorinated butyl rubber, polybutadiene rubber, acrylonitrile-butadiene rubber, styrene-butadiene rubber etc. as suitable for the matrix polymer of a directly electroplateable resin. Other polymers identified by Luch as useful included polyvinyls, polyolefins, polystyrenes, polyamides, polyesters and polyurethanes.

In his Patents, Luch identified carbon black as a means to render a polymer and its surface electrically conductive. As is known in the art, other conductive fillers can be used to impart conductivity to a polymer. These include metallic flakes or powders such as those comprising nickel or silver. Other fillers such as metal coated minerals may also suffice. Furthermore, one might expect that compositions comprising intrinsically conductive polymers may be suitable.

Regarding electrodeposit coverage rate accelerators, both Luch and Chien et al. in the above discussed U.S. Patents demonstrated that sulfur and other sulfur bearing materials such as sulfur donors and vulcanization accelerators function as electrodeposit coverage rate accelerators when using an initial Group VIII "strike" layer. Thus, an electrodeposit coverage rate accelerator need not necessarily be electrically conductive, but may be a material that is normally characterized as a non-conductor. The coverage rate accelerator need not appreciably affect the conductivity of the polymeric substrate. As an aid in understanding the function of an electrodeposit coverage rate accelerator the following is offered:

a. A specific conductive polymeric structure is identified as having insufficient current carry capacity to be directly electroplated in a practical manner.

b. A material is added to the conductive polymeric material forming said structure. Said material addition has insignificant affect on the current carrying capacity of the structure (i.e. it does not appreciably reduce resistivity or increase thickness).

c. Nevertheless, inclusion of said material greatly increases the speed at which an electrodeposited metal laterally covers the electrically conductive surface.

A hypothetical example might be an extended trace of conductive ink having a dry thickness of 1 micrometer. Such inks typically include a conductive filler such as silver, nickel, copper, conductive carbon etc. The limited thickness of the ink reduces the current carrying capacity of this trace thus preventing direct electroplating in a practical manner. However, inclusion of an appropriate quantity of a coverage rate accelerator may allow the conductive trace to be directly electroplated in a practical manner.

One might expect that other Group 6A elements, such as oxygen, selenium and tellurium, could function in a way similar to sulfur. In addition, other combinations of electrodeposited metals and coverage rate accelerators may be identified. It is important to recognize that such an electrodeposit coverage rate accelerator is extremely important in order to achieve direct electrodeposition in a practical way onto polymeric substrates having low conductivity or very thin electrically conductive polymeric substrates having restricted current carrying ability.

It has also been found that the inclusion of an electrodeposit coverage rate accelerator promotes electrodeposit bridging from a discrete cathodic metal contact to a DER surface. This greatly reduces the bridging problems described above.

As pointed out above in this specification, attempts to dramatically simplify the process of electroplating on plastics have met with commercial difficulties. Nevertheless, the current inventor has persisted in personal efforts to overcome certain performance deficiencies associated with the initial DER technology. Along with these efforts has come a recognition of unique and eminently suitable applications employing electrically conductive polymers and specifically the DER technology especially for those applications related to antenna manufacture.

A first recognition, is that the "microscopic" material resistivity generally is not reduced below about 1 ohm-cm. by using conductive carbon black alone. This is several orders of magnitude larger than typical metal resistivities. Other well known finely divided conductive fillers (such as metal flake or powder, metal coated minerals, graphite, or other forms of conductive carbon) can be considered in DER applications requiring lower "microscopic" resistivity. In these cases the more highly conductive fillers can be considered to augment or even replace the conductive carbon black.

Moreover, the "bulk, macroscopic" resistivity of conductive carbon black filled polymers can be further reduced by augmenting the carbon black filler with additional highly conductive, high aspect ratio fillers such as metal containing fibers. This can be an important consideration in the success of certain applications. Furthermore, one should realize that incorporation of non-conductive fillers may increase the "bulk, macroscopic" resistivity of conductive polymers loaded with finely divided conductive fillers without significantly altering the "microscopic resistivity" of the conductive polymer. This is an important recognition regarding DER's in that electrodeposit coverage speed depends not only on the presence of an electrodeposit coverage rate accelerator but also on the "microscopic resistivity" and less so on the "macroscopic resistivity" of the DER formulation. Thus, large additional loadings of functional non-conductive fillers can be tolerated in DER formulations without undue sacrifice in electrodeposit coverage rates or adhesion. These additional non-conductive loadings do not greatly affect the "microscopic resistivity" associated with the polymer/conductive filler/electrodeposit coverage rate accelerator "matrix" since the non-conductive filler is essentially encapsulated by "matrix" material. Conventional "electroless" plating technology does not permit this compositional flexibility.

Yet another recognition regarding the DER technology is its ability to employ polymer resins generally chosen in recognition of the fabrication process envisioned and the intended end use requirements. Thus DER's can be produced in material forms that are often suitable for the manufacture of antennas. In order to provide clarity, examples of some such fabrication processes are presented immediately below in subparagraphs 1 through 7.

(1) Should it be desired to electroplate an ink, paint, coating, or paste which may be printed or formed on a substrate, a soluble resin having excellent film forming characteristics can be chosen to fabricate a DER ink (paint, coating, paste etc.).

(2) Very thin DER traces often associated with antenna structure can be printed and then electroplated due to the inclusion of a growth rate accelerator.

(3) DER inks have been formulated such that very fine line definition can be achieved with standard printing processes such as flexographic printing and rotary screen printing.

(4) Should it be desired to electroplate an antenna on a fabric, a DER ink can be used to coat all or a portion of the fabric intended to be electroplated. Furthermore, since DER's can be fabricated out of the thermoplastic materials commonly used to create fabrics, the fabric itself could completely or partially comprise a DER. This would obviously eliminate the need to coat the fabric.

(5) Should one desire to electroplate a thermoformed antenna, DER's would represent an eminently suitable material choice. DER's can be easily formulated using olefinic materials which are often a preferred material for the thermoforming process. Furthermore, DER's can be easily and inexpensively extruded into the sheet like structure necessary for the thermoforming process.

(6) Should one desire to electroplate an extruded antenna, for example a sheet or film, DER's can be formulated to possess the necessary melt strength advantageous for the extrusion process.

(7) Should one desire to electroplate a blow molded antenna, DER's can fabricated with required melt strength etc. necessary for these operations.

(8) Should one desire to electroplate an injection molded antenna having thin walls, broad surface areas etc. a DER composition comprising a high flow polymer can be chosen.

(9) One will recognize that DER's are eminently suitable for specialized injection molding techniques such as multi-shot molding, dual shot molding, co-injection molding, insert molding etc.

(10) Should one desire to vary adhesion between an electrodeposited DER structure supported by a substrate the DER material can be formulated to supply the required adhesive characteristics to the substrate.

All polymer fabrication processes require specific resin processing characteristics for success. The ability to "custom formulate" DER's to comply with these changing processing and end use requirements while still allowing facile, quality electroplating is a significant factor in the antenna manufacture teachings of the current invention. Conventional plastic electroplating technology does not permit great flexibility to "custom formulate".

Another important recognition regarding the suitability of DER's for antenna manufacturing is the simplicity of the electroplating process. Unlike many conventional electroplated plastics, DER's do not require a significant number of process steps during the manufacturing process. This allows for simplified manufacturing and improved process control. It also reduces the risk of cross contamination such as solution dragout from one process bath being transported to another process bath. The simplified manufacturing process will also result in reduced manufacturing costs. As will be shown in the subsequent embodiments, this simplified manufacturing also allows unique electrical joining techniques between antennas and electrical devices.

Yet another recognition of the benefit of DER's for antenna manufacturing is the ability they offer to selectively electroplate an article or structure. Antennas often consist of metal patterns selectively positioned in conjunction with insulating materials. Such selective positioning of metals is often expensive and difficult. However, the attributes of the DER technology make the technology eminently suitable for the production of such selectively positioned metal structures. As will be shown in later embodiments, selective electroplating of a DER/insulating antenna structure can be simply and inexpensively achieved.

Yet another recognition of the benefit of DER's for antenna manufacturing is the ability they offer to continuously electroplate an article or structure. As will be shown in later embodiments, it is often desired to continuously electroplate articles to form electroplated plastic antennas. Examples include antennas for RFID tags and contactless smart cards. DER's are eminently suitable for such continuous electroplating. Furthermore, DER's allow for the selective electroplating of antennas in a continuous manner.

Yet another recognition of the benefit of DER's for antenna manufacturing is their ability to withstand the pre-treatments often required to prepare other materials for electroplating. For example, were a DER to be combined with another electroplateable material, the DER material would be resistant to many of the pre-treatments which may be necessary to electroplate the additional electroplateable material.

Yet another recognition of the benefit of DER's for antenna manufacturing is that the desired plated structure often requires the plating of long and/or broad surface areas. As discussed previously, the coverage rate accelerators included in DER formulations allow for such extended surfaces to be covered in a relatively rapid manner.

These and other attributes of DER's in the production of antennas will become clear through the following remaining specification, accompanying figures and claims.

In order to eliminate ambiguity in terminology of the present specification and claims, the following definitions are supplied.

"Polymers" (also referred to as plastics or resins) include any of the group of synthetic or natural organic materials that may be shaped when soft and then hardened. This includes thermoplastics and three-dimensional curing materials such as epoxies and thermosets. In addition, certain silicon based materials such as silicones can be considered as polymers or resins. Polymers also include any coating, ink, or paint fabricated using a polymer binder or film forming material.

"Alloy" refers to a substance composed of two or more intimately mixed materials.

"Metal-based" refers to a material or structure having at least one metallic property and comprising one or more components at least one of which is a metal or metal-containing alloy.

"Group VIII metal-based" refers to a substance containing by weight 50% to 100% metal from Group VIII of the Periodic Table of Elements.

OBJECTS OF THE INVENTION

An object of the invention is to produce new structures for conductive antennas.

A further object of the invention is to produce novel methods of facile manufacture of conductive antennas.

A further object of the invention is to expand permissible design options for the production of conductive antennas.

SUMMARY OF THE INVENTION

The present invention involves production of patterned surfaces comprising a directly electroplateable resin. The directly electroplateable resin can be self-supporting, but often is used in combination with an electrically insulating support material. In preferred embodiments the directly electroplateable resin is further coated with an adherent layer of highly conductive electrodeposit. Novel manufacturing methods and structures made possible by the use of directly electroplateable resins are taught.

BRIEF DESCRIPTION OF THE DRAWINGS

FIG. 11A is a top plan view of an embodiment of an intermediate article of manufacture illustrating a process by which multiple electronic assemblies can be produced.

FIG. 11B is an expanded top plan view of a device obtained by subdividing the article of FIG. 11A.

FIG. 11C is a top plan view of the article of FIG. 1B further joined to additional structure having the form of an electrical pattern.

FIG. 11D is a sectional view taken substantially from the perspective of line 11D-11D of FIG. 11C.

FIG. 11E is a view similar to FIG. 11D following an additional processing step.

FIG. 29 is a top plan view of the arrangement embodied in FIGS. 27 and 28 following an additional processing step.

FIG. 30 is a sectional view taken substantially from the perspective of line 30-30 of FIG. 29.

FIG. 31 is a sectional view taken substantially from the perspective of line 31-31 of FIG. 29.

FIG. 49 is a sectional view similar to FIG. 48 of the article embodied in FIGS. 47 and 48 following additional processing steps.

FIG. 50 is a sectional view taken substantially from the perspective of line 50-50 of FIG. 49.

DESCRIPTION OF PREFERRED EMBODIMENTS

Figure 1:
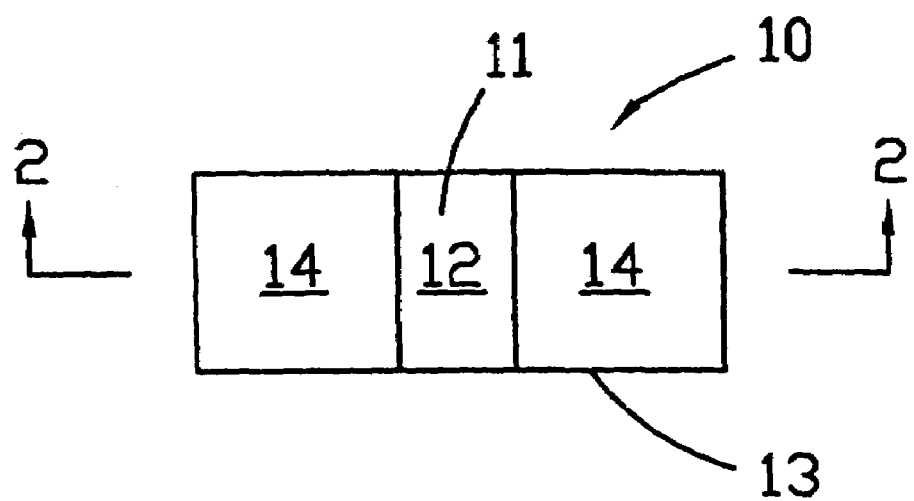
FIG. 1 is a top plan view of an embodiment of the invention.

The following teaching of preferred embodiments, taken along with the descriptive figures, will reveal and teach the eminently suitable characteristics of directly electroplateable resins in the production of antennas. As taught above, a number of unique characteristics of DER formulations allow these advances. In the following, the acronym "DER" will be used to designate a directly electroplateable resin.

Reference will now be made in detail to the preferred embodiments of the invention, examples of which are illustrated in the accompanying drawings. In the drawings, like reference numerals designate identical or corresponding parts throughout several views and an additional letter designation is characteristic of a particular embodiment.

Figure 2:
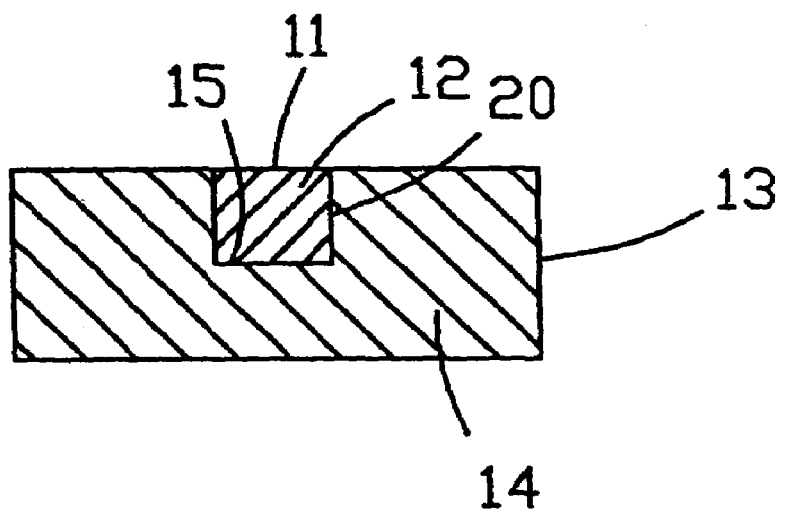
FIG. 2 is a sectional view of the FIG. 1 embodiment taken substantially from the perspective of line 2-2 of FIG. 1.
Figure 3:
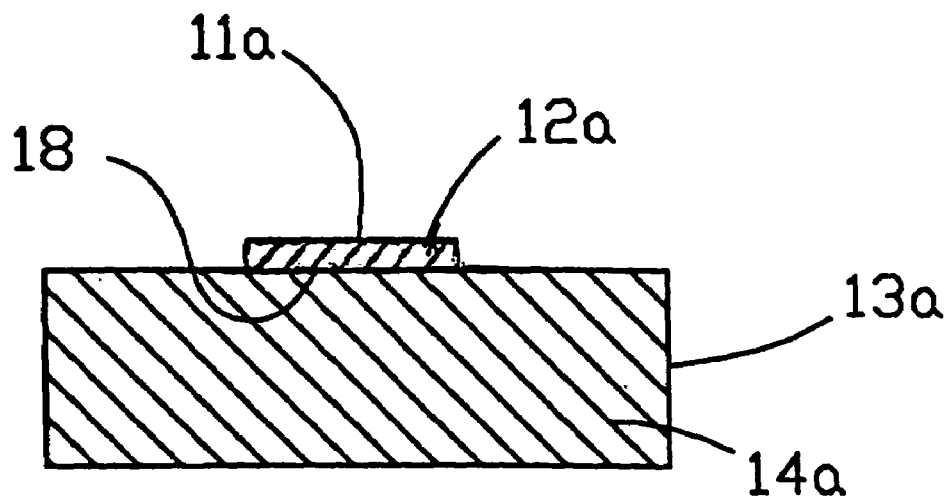
FIG. 3 is a sectional view, similar to FIG. 2, of an alternate embodiment.

Referring to FIG. 1, there is shown a top plan view of an article generally designated by numeral 10. Article 10 is characterized by having a strip 11 of directly electroplateable resin (DER) 12 supported by a substrate 13 comprising electrically insulating material 14. It is recognized that substrate 13 can comprise a wide variety of insulating materials 14 including solids, foams, fabrics, polymers and paper. FIG. 2 is a sectional view of the FIG. 1 structure taken substantially along the line 2-2 of FIG. 1. As shown in FIG. 2, DER material 12 is contained in a trench 15 formed in substrate 13. FIG. 3 is a view similar to FIG. 2 of an alternate embodiment wherein DER material 12a is formed as a strip 11a on the top, essentially flat surface of substrate 13a. In some instances the structure of FIG. 2 may be desirable by permitting greater latitude in the selection of materials for the DER binder and the insulating support. For example, structural features can be introduced into the abutting surfaces 20 of the trench 15 of FIG. 2 to assist in mechanical retention of the DER strip 11. An alternate embodiment is shown in FIG. 3. FIG. 3 shows abutting flat surfaces at 18 wherein DER strip 12a rests on insulating substrate 13a.

Figure 4:
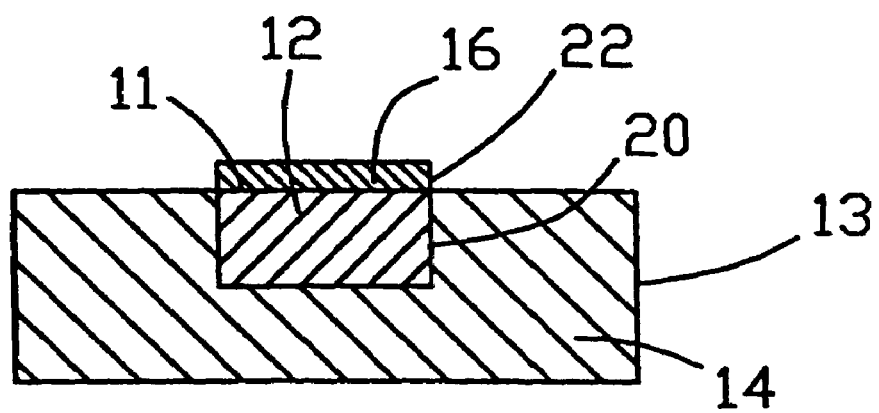
FIG. 4 is a sectional view of the embodiment of FIG. 2 following an additional processing step.

Referring now to FIG. 4, the structure of FIG. 2 is shown following an additional processing step of electrodepositing metal-based conductive electrodeposit 16 onto the DER strip 11. Metal-based electrodeposit 16 is shown in FIG. 4 as a single layer. However, it is understood that electrodeposit 16 in this and subsequent embodiments can comprise a laminate of multiple layers of electrodeposit to achieve functional or aesthetic benefits. In addition, electrodeposit 16 may be representative of other materials which may be deposited using various electrochemical techniques. As is appreciated, many antennas consist of a structure combining conductive and insulating materials. Thus selective placement of the conductive material is required. The selective metallization of plastic substrates using conventional "plating on plastics" techniques can be difficult and expensive. Conceptually electroplating of conductive polymers could simplify selective metal placement. Unfortunately problems associated with electroplating on known electrically polymers have prevented widespread use. This is especially true for antenna manufacture wherein the desired metallized patterns often are characterized as extended traces. As previously discussed, such patterns may be difficult to electroplate in a practical way. DER's offer an eminently suitable technology for the selective electroplated metal placement to form an antenna.

Continuing to refer to FIG. 4, it has been found that penetration of electroplating solution into the abutting surface region 20 does not readily occur (and thus is generally not a problem) even when there is reduced adhesive compatibility between the DER material 12 and insulating material 14. The abutting surfaces at 20 are generally in close proximity and the electroplating solution is incapable of necessary air displacement to allow such penetration. In addition, the polymers chosen for DER 12 and substrate 13 are often hydrophobic and would generally resist such penetration of solution. Were penetration of electroplating solution into the abutting surface region 20 to become a problem, one could choose a material for substrate 13 having a lower coefficient of thermal expansion than the DER 12. In this way, the DER would form an expanded "plug" at the elevated temperatures of the electroplating baths to temporarily seal the interfacial gap.

Figure 5:
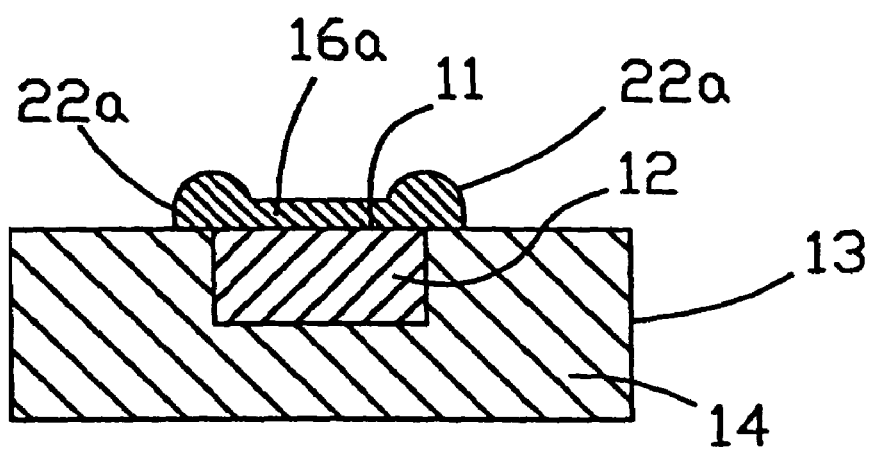
FIG. 5 is a sectional view similar to FIG. 4 illustrating a problem associated with the additional processing included in the FIG. 4 embodiment.

Continuing to refer to FIG. 4, there is shown a sharp line of demarcation at the edges 22 of electrodeposit 16. This sharp line is achieved by the electrically "digital" nature of surface conductivity between the conductive DER 12 and insulating substrate material 14. Acceptable sharp line or edge definition can often be achieved using standard electroplating techniques known in the art. However, reference to FIG. 5, a view similar to FIG. 4, illustrates an effect of electrodeposition which can blur line definition at thicker electrodeposits or where there is deviation from optimal processing. FIG. 5 shows a substantial increase in thickness of electrodeposit 16a at edges 22a. This phenomenon, known as "berry buildup", results from the well-known tendency of electrodeposits to concentrate deposition at edges or sharp corners. In many cases this characteristic results in formation of nodules (or berries), which further accentuates the detrimental effect.

Figure 6:
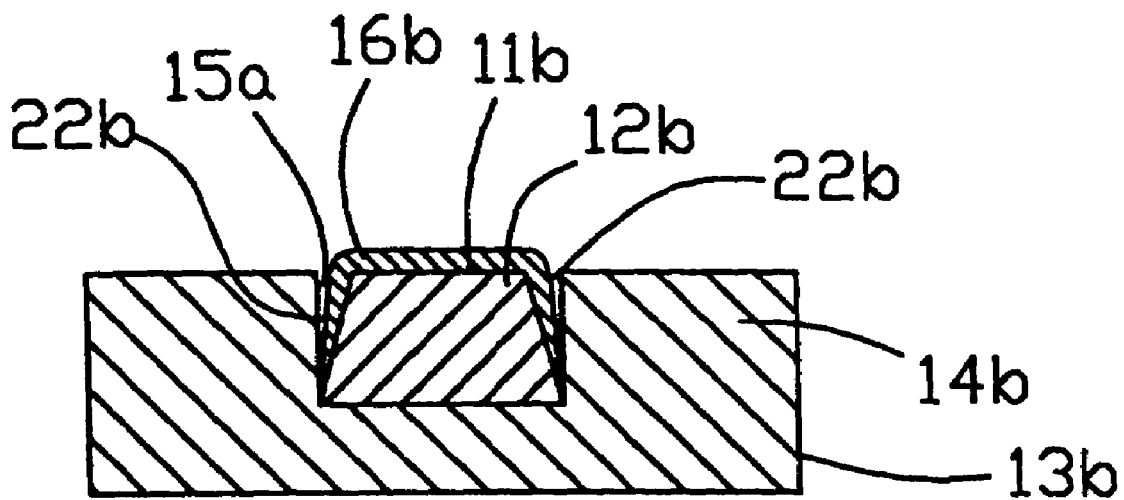
FIG. 6 is a sectional view teaching an alternative structure to eliminate the problem illustrated in the FIG. 5 embodiment.
Figure 7:
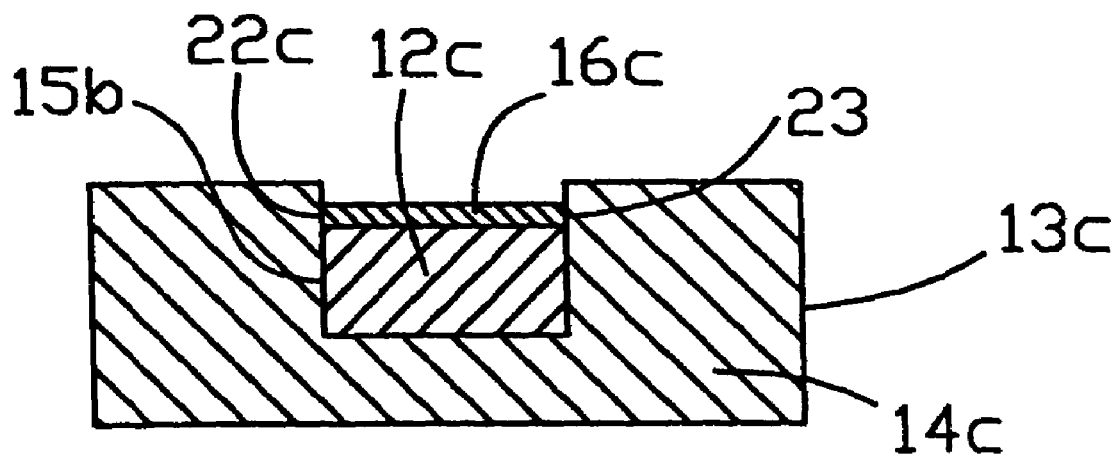
FIG. 7 is a sectional view teaching an additional alternative structure to eliminate the problem illustrated in the FIG. 5 embodiment.

Reference to FIGS. 6 and 7 is made to show how the blurring of line definition at electrodeposit edges can be avoided using the teachings of the instant invention. In FIG. 6, there is shown a structure wherein the DER material 12b does not completely fill the trench 15a formed in substrate 13b. Here the edges 22b of electrodeposit 16b are positioned in a depression or recess. It is known that recessed areas receive reduced amounts of electrodeposited material, the opposite effect to having a raised sharp edge. Thus, proper choice of the width and depth of the recess provides for maintenance of adequately sharp line definition for the selectively conductive surface patterns of the current invention when thick metal layers are demanded.

FIG. 7 shows an alternate design embodiment intended to produce a sharp line demarcation between conductive electrodeposit 16c and insulating substrate 13c. In the FIG. 7 embodiment, DER material 12c does not completely fill the trench 15b formed in substrate 13c. Nodule or "berry" buildup at edges 22c of electrodeposit 16c is prevented by the shielding effect of trench walls 23 of substrate 13c, thereby containing the lateral extent of electrodeposit 16c.

Figure 8:
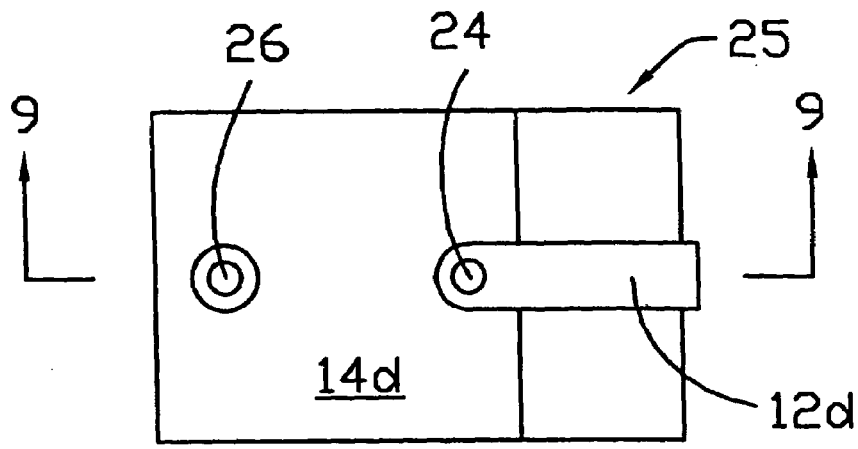
FIG. 8 is a top plan view of an intermediate article in the manufacture of a three dimensional conductive trace according to the teachings of the invention.
Figure 9:
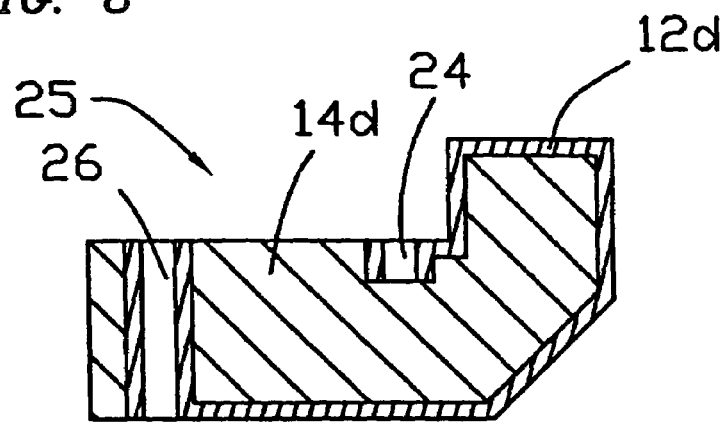
FIG. 9 is a sectional view taken substantially from the perspective of line 9-9 of FIG. 8.
Figure 10:
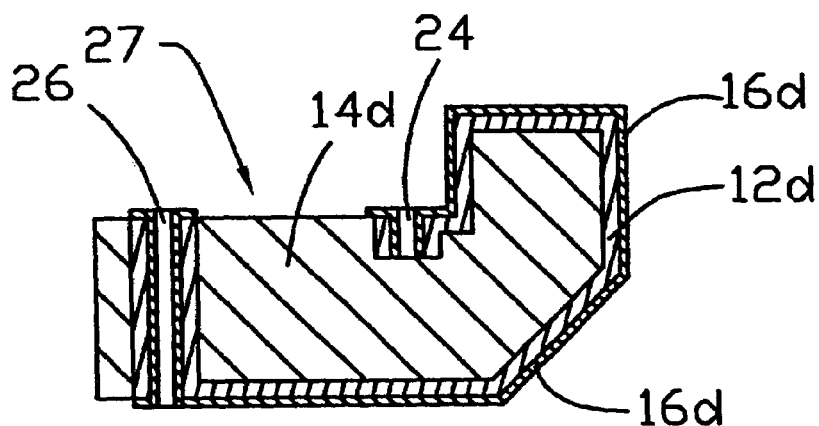
FIG. 10 is a sectional view of the article of FIGS. 8 and 9 following an additional processing step.

FIGS. 1 through 7 illustrate embodiments of production of simple electrically conductive traces or strips supported by an insulating substrate. A more complex, three-dimensional structure is illustrated in the embodiments of FIGS. 8 and 9. These figures illustrate a multicomponent article identified as 25 using DER to produce a geometrically complex three-dimensional conductive pattern. In FIGS. 8 and 9, DER material is identified as numeral 12d, and insulating material as 14d. It is contemplated that the article of FIGS. 8 and 9 is produced by a multi-component (generally referred to as multi-color or dual shot) molding process. In one form of this process, an insulating substrate is first molded with channels defining a pattern intended for the eventual conductive pattern. DER material is then injected into the channels. Alternatively, the DER pattern could be molded initially with the insulating material being injected with the second shot. FIGS. 8 and 9 also illustrate a well 24 and through-hole 26 which are molded into the object. FIG. 10 illustrates the article, now identified as 27, following exposure to an electroplating process. In FIG. 10, numeral 16d indicates the metal-based electrodeposit. Electrodeposit 16d is understood to be either a single layer or multiple layers of metal-based material as is understood in the electroplating art. The electrodeposit supplies a robust, highly conductive surface pattern that would be difficult to produce or achieve by alternate techniques currently available, such as photoetching. It is also important to recognize that the unique design and process taught by the present disclosure is accomplished in a fully additive fashion. No wasteful or costly material removal steps are needed to achieve most of the embodiments of the invention, a significant advantage over the prior art.

In most applications, an antenna must be electrically connected to the electrical leads of a device such as a chip, capacitor, etc. In many cases these connections are made by high temperature soldering. This process can limit the selection of materials and processes used for production of the integrated device.

Figure 11:
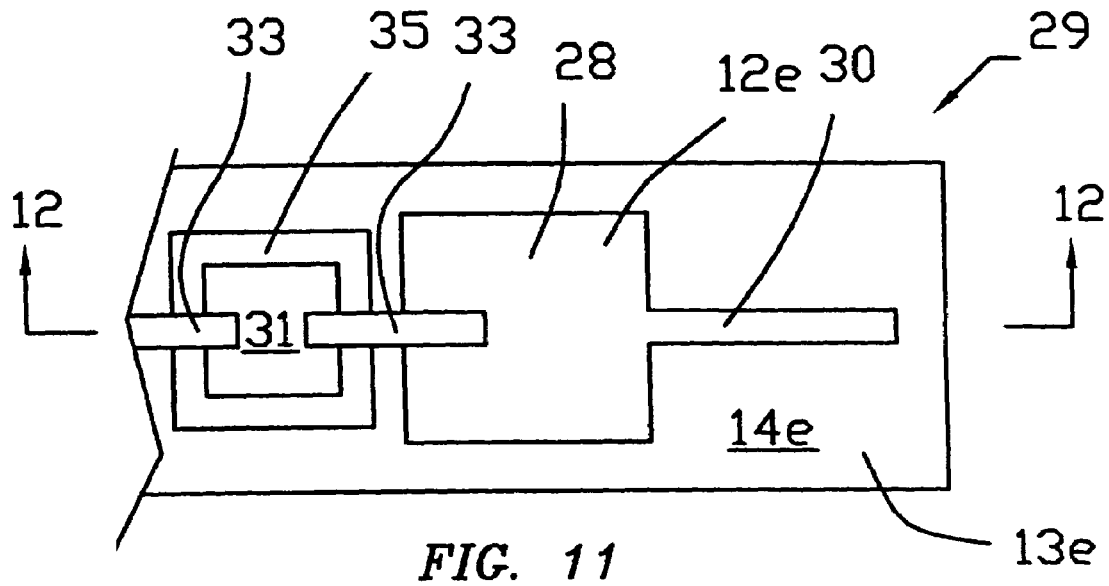
FIG. 11 is a top plan view of an intermediate article in the process of attaching metal inserts to conductive surface traces.
Figure 12:
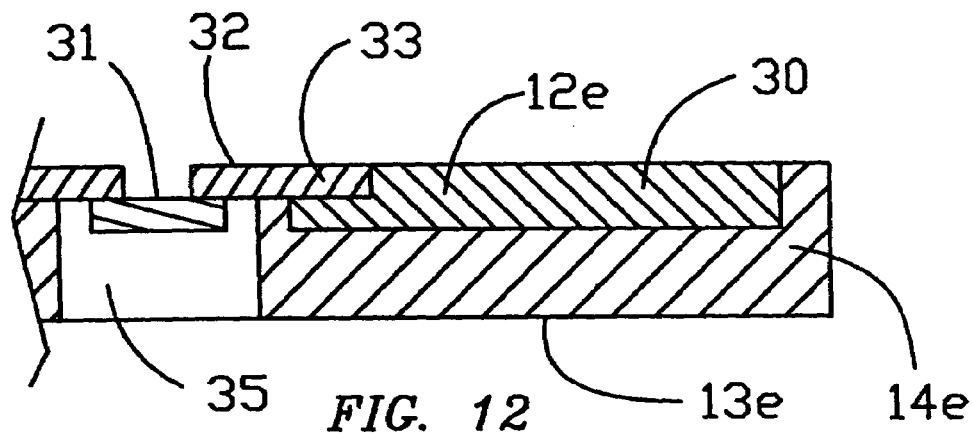
FIG. 12 is a sectional view of the article of FIG. 11 taken substantially from the perspective of line 12-12 of FIG. 11.
Figure 13:
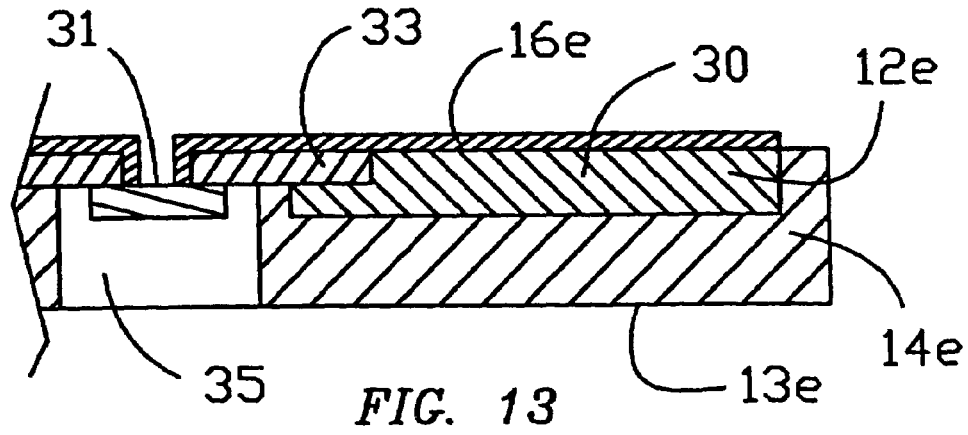
FIG. 13 is a sectional view showing the article of the embodiment of FIGS. 11 and 12 following an additional processing step.

FIGS. 11 through 13 illustrate an alternate method for electrically connecting the electrical leads of a device to an antenna by using an electrically conductive material capable of being electroplated. FIG. 11 shows a top plan view of an article, identified as 29, combining a device 31 with an electrically conductive material pattern. The electrical device, indicated as 31, is positioned in a hole 35 in substrate 13e. One will appreciate that hole 35 is not necessary if one were to position device 31 directly on the surface of substrate 13e. Substrate 13e comprises electrically insulating material 14e. Device 31 includes electrical leads 33 which are often metallic. An electrically conductive material pattern 12e comprises pad 28 and elongated strip 30. Strip 30 could form, for example, an antenna pattern. Electrical device 31, leads 33 and electrically conductive material pattern 12e are supported by insulating substrate 14e. FIG. 12 is a sectional view taken substantially from the perspective of line 12-12 of FIG. 11. In FIG. 12 it is seen that device lead 33 is embedded into the electrically conductive material 12e. In the embodiment shown, a portion of the surface of lead 33, indicated by 32, remains exposed. However, in another embodiment the total surface of leads 33 could be covered by electrically conductive material 12e. Embedding the leads 33 can be done by known techniques such as heat staking, molding of the electrically conductive material around lead 33 (insert molding) or printing of an electrically conductive material. FIG. 13 is a sectional view similar to FIG. 12 following an additional processing step of electroplating metal-based electrodeposit 16e. It is seen in FIG. 13 that metal-based electrodeposit extends continuously from leads 33 to the electrically conductive material (12e) pattern. The electrodeposit 16e forms a robust, continuous and highly conductive connection between the leads 33 and the now metal plated, highly conductive strip pattern 30 originally defined by the electrically conductive material (12e).

A number of factors allow this electrical connection through electrodeposition. First, adequate bonding between metals and subsequent electrodeposits normally requires some sort of cleaning treatment to remove contaminants or oxides from the metallic surface. Proper selection of the polymeric base resin for the electrically conductive material (12e) would allow these materials to be unaffected by required metal cleaning treatments. Second, since the electrically conductive materials (12e) can be electroplated without any requirement for very harsh chemical etching treatments used to plate non-conductive plastics by conventional means, potential damage to the metal leads from such treatments is avoided. In a preferred embodiment electrically conductive material 12e comprises a Directly Electroplateable Resin. As discussed above, any detrimental penetration of electroplating solution into the interfacial area between the metal lead and the DER has not been observed as a problem. Indeed, excellent bridging of electrodeposits between metal leads and the DER materials has been characteristic. However, were such solution penetration to be a problem, a simple pre-dip of the structure in distilled water would cause the interfacial volume to fill with innocuous water rather than any harsher chemical solutions.

Embodiments 11A thru 11E illustrate a proposed manufacturing process for producing electrical joining between an electrical device and an antenna. FIG. 11A shows in plan view multiple electrical devices 31 having leads 33. Leads 33 are further electrically joined to electrically conductive expanded surface pads 130. Device 31, leads 33, and pads 130, are supported by substrate 132. The repetitive pattern illustrated allows facile assembly of these multiple components.

FIG. 11B illustrates an individual structure or article, generally designated by 134, achieved by subdividing the extended strip shown in FIG. 11A. One function of pads 130 is to expand the conductive surface area available for contacting additional electronic structure, for example an antenna. It will be appreciated that pads 130 can comprise a number of different electrically conductive materials including Directly Electroplateable Resins.

FIG. 11C shows the article 134 of FIG. 11B after additional manufacturing steps to join the 11B 134 structure to additional structure having the form of an antenna. In FIG. 11C an electrically conductive material 212 is deposited to overlap expanded surface pads 130 of article 134. In a preferred embodiment the electrically conductive material 212 comprises a Directly Electroplateable Resin. To facilitate adhesion and electrical contacting a portion of the electrically conductive material overlapping pads 130 is in the form of fingers 220. This arrangement is optional, and it is understood that conductive material 212 can cover or contact any portion of pad 130. A portion of the envisioned antenna structure is represented by 230.

FIG. 11D is a sectional view taken substantially from the perspective of line 11D-11D of FIG. 11C. In FIG. 11D, it is seen that article 134 rests on insulating substrate 213. In this embodiment the hole 35 shown in FIGS. 11-13 is not used. FIG. 11D shows electrically conductive material 212 overlapping extended surface pads 130.

FIG. 11E is a view similar to 11D following electrodeposition of metal based electrodeposit 216 over the conductive surfaces formed by electrically conductive material 212, pads 130 and leads 33. It is seen that continuous integral metal-based joining is achieved between antenna form 230 and leads 33. It is appreciated that fingers 220 best seen in FIG. 11C will increase the linear contact between electrodeposit 216 covering the surface of conductive material 212 and pad 130. Other forms of structure such as holes in pad 130 would enhance the mechanical interlocking and consequent electrical connection between the electrodeposit covering pad 130 extending to antenna form 230.

In the embodiment of FIGS. 13 and 11E, it is seen that the device 31 remains exposed to electroplating solutions during deposition of electrodeposits 16e and 216 respectively. Damage to the device from this exposure is avoided in that the device is normally encapsulated in a protective resin moisture barrier, with only the metallic leads 33 exposed. One appreciates that such exposure could be avoided by electrically joining leads 33 and electrically conductive material 12e (or 212) by depositing electrodeposit 16 (or 216) via alternative techniques such as brush plating.

Figure 14:
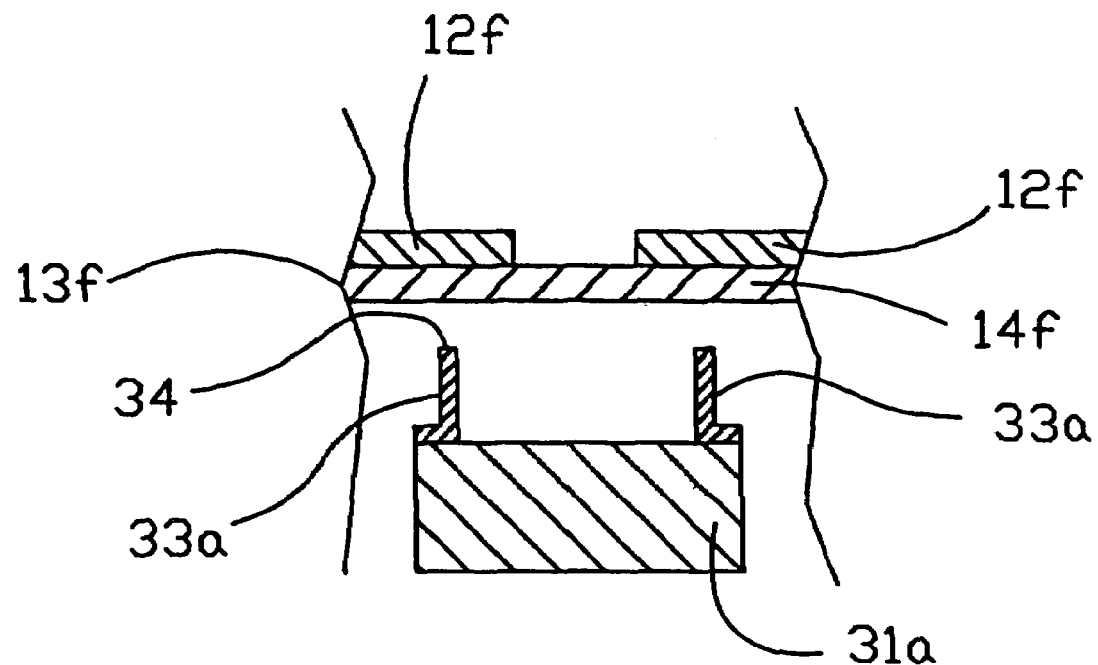
FIG. 14 is a sectional view illustrating article positioning for an alternate process for attaching metal inserts to conductive surface traces.
Figure 15:
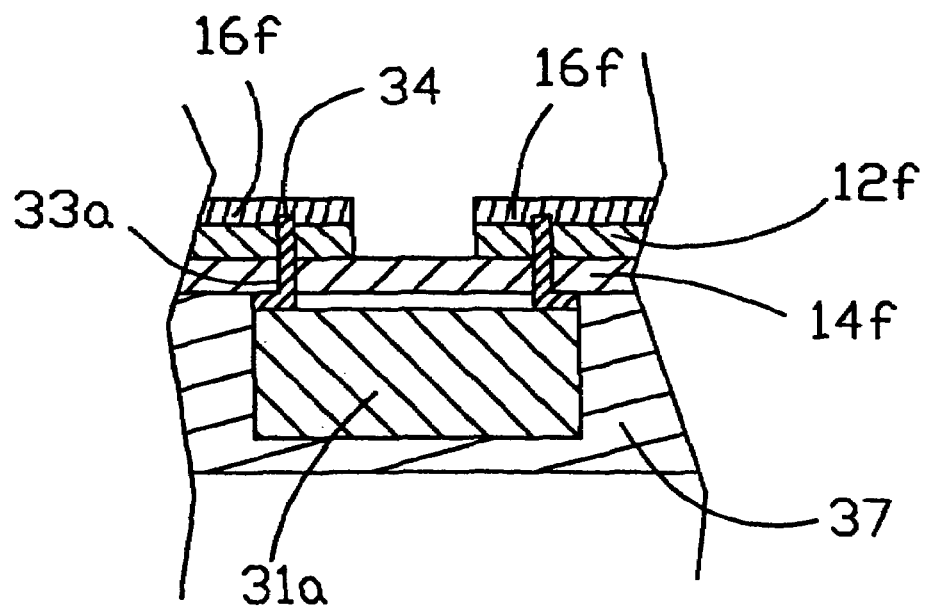
FIG. 15 is a sectional view of the embodiment of FIG. 14 following additional processing steps.

However, in some applications one may wish to further isolate the device from the electroplating solutions. A process to completely isolate the device from the electroplating solutions during the electrodeposition is illustrated in FIGS. 14 and 15. In FIG. 14, device 31a with leads 33a is positioned beneath insulating support substrate 13f. Electrically conductive material pattern 12f is positioned on the upper surface of support substrate 13f.

FIG. 15 is a sectional view of this embodiment after a number of additional processing steps as follows. First, the device 31a has been moved relative to insulator/electrically conductive material structure 14f/12f so that the terminal ends 34 of leads 33a penetrate through the electrically conductive material layer 12f and are exposed. Next, a layer of additional insulating material 37 is applied to encapsulate device 31a. This additional insulating layer can be applied by known techniques such as solution coating or film laminating. Finally, a layer of electrodeposited metal-based material 16f is deposited to electrically connect the terminal ends 34 of leads 33a to the metal-based pattern simultaneously formed by electroplating the electrically conductive material 12f. In a preferred embodiment electrically conductive material 12f comprises a Directly Electroplateable Resin.

One will appreciate in light of the teachings associated with FIGS. 11 through 15, that the attachment of a metal component to a conductive trace through the steps of embedding in an electrically conductive material followed by electroplating is not restricted to the leads of a particular device. Other metallic inserts, such as wires, connectors, spring contacts etc. can be considered for electrical attachment using these techniques.

Figure 16:
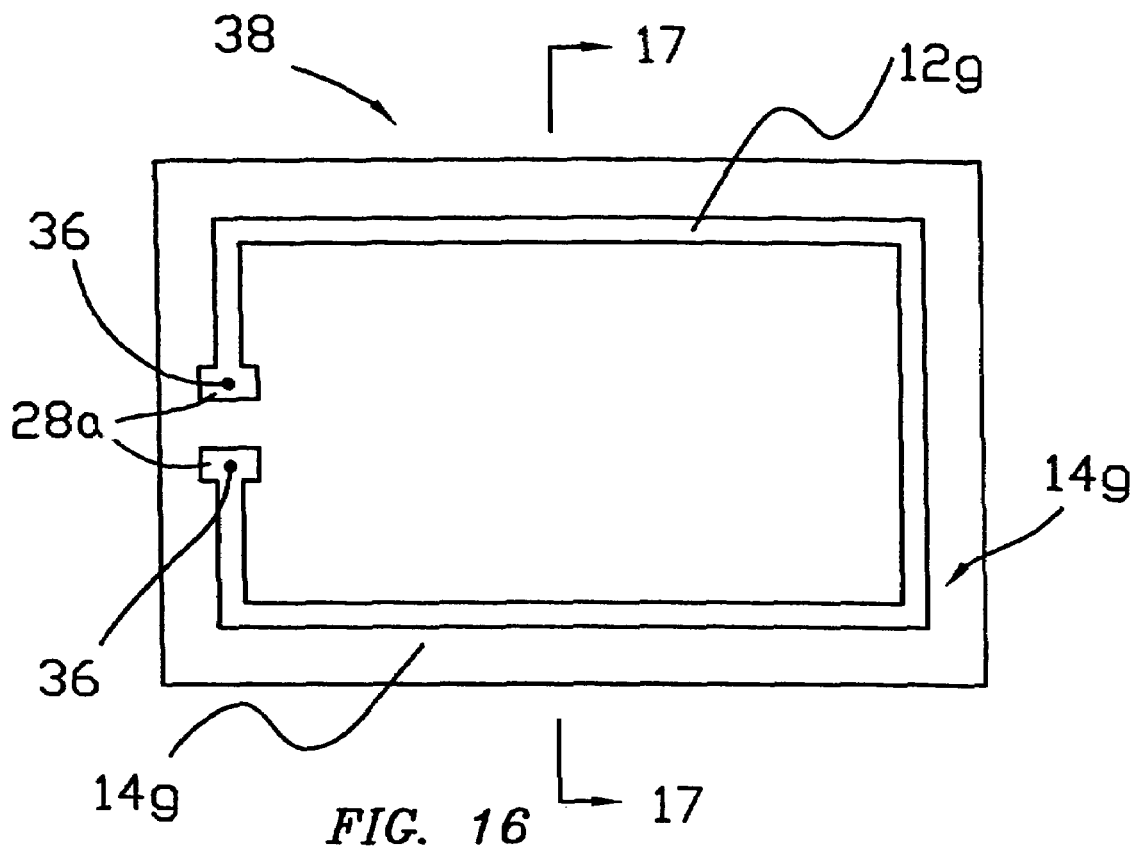
FIG. 16 is a top plan view of an intermediate article in the manufacture of a low profile loop antenna according to the teachings of the invention.
Figure 17:
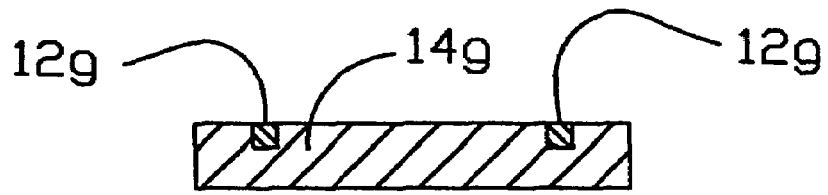
FIG. 17 is a sectional view taken substantially from the perspective of line 17-17 of FIG. 16.
Figure 18:
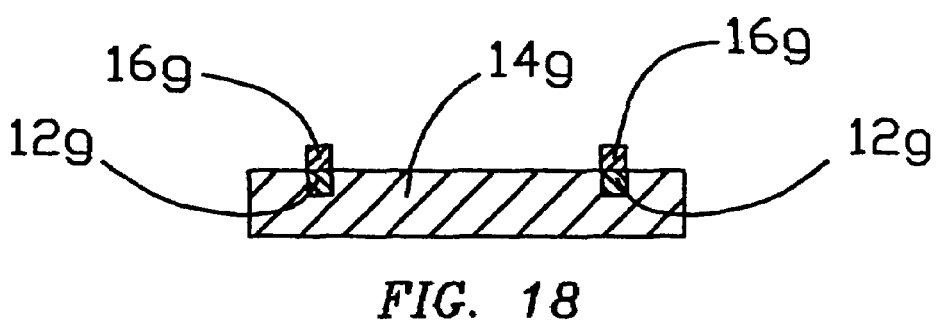
FIG. 18 is a sectional view of the intermediate article of FIGS. 16 and 17 following an additional processing step.

FIGS. 16 through 18 illustrate an embodiment of a low profile loop antenna produced by the teachings of the present invention. FIG. 16 is a top plan view of the starting structure indicated as 38. Structure 38 has a loop formed by a trace of DER material 12g supported on insulating material 14g. It will be understood that the loop structure formed by DER material 12g is but one many structural forms which could be considered. In addition the structural pattern defined by the DER material may form but a portion of the final intended antenna structure. Device mounting pads 28a are included in the pattern formed by DER material 12g. Device mounting holes 36 are located in pads 28a for accurately locating the leads of an electronic device (not shown).

FIG. 17 is a sectional view taken substantially from the perspective of line 17-17 of FIG. 16. FIG. 17 shows DER 12g loop trace being embedded in insulating substrate material 14g in a fashion similar to the structure of FIG. 2. FIG. 18 shows the cross-sectional structure following an additional processing step of electroplating metal-based electrodeposit 16g onto the DER material 12g. An electrical device (not shown) may be attached to pads 28a and simultaneously electrically connected to the DER/electrodeposit loop by techniques discussed in conjunction with FIGS. 11 through 15. Electrodeposit 16g now forms a highly conductive, low profile loop antenna/inductor to transmit information and/or power an electrical device (not shown) attached at pads 28a. Such an antenna is substantially flat, simple to mass produce, and physically and electrically robust. Such an antenna would be very suitable for production of low profile items such as a contactless "smart card", or a "RFID tag".

Many applications of the current invention will employ a generally planar, sheet-like structure having thickness much smaller than its length or width. This sheet like structure may also have a length far greater than its width, in which case it is commonly referred to as a "web". Because of its extensive length, a web can be conveyed through one or more processing steps in a way that can be described as "continuous". "Continuous" web processing is well known in the paper and packaging industries. It is often accomplished by supplying web material from a feed roll to the process steps and retrieving the web onto a takeup roll following processing (roll-to-roll or reel-to-reel processing).

Figure 19:
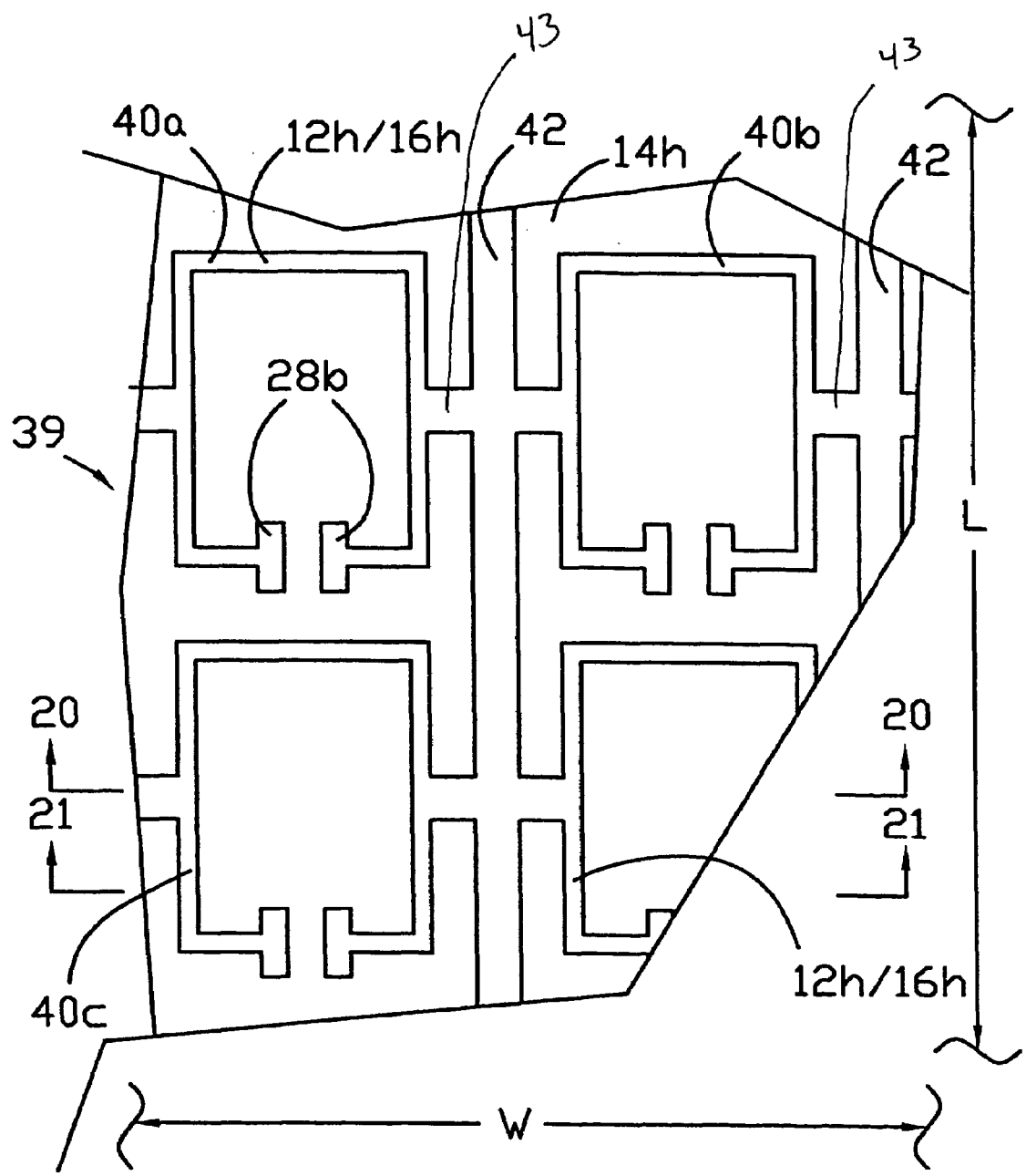
FIG. 19 is a top plan view of a structural arrangement in the mass production of substantially planar loop antennas according to the teachings of the invention.

FIGS. 19 through 23 illustrate a method of inexpensive mass production of a form of the low profile loop antenna introduced in FIGS. 16 through 18. In FIG. 19, there is shown a structure generally identified as 39. Structure 39 comprises electrically insulating web or film 14h. Web or film 14h is of a substantially planar nature and has a length in the direction designated by the letter "L" and a width designated by the letter "W". In the embodiment of FIG. 19, length "L" is contemplated to be considerably larger than width "W" and thus web or film 14h can be processed in an essentially continuous, roll-to-roll fashion. Thus, web or film 14h can be characterized as a continuous web or film.

Structure 39 of FIG. 19 is characterized by the following factors. Electrically insulating web material 14h supports a pattern of DER/electrodeposit composite material 12h/16h having multiple loops 40a, 40b, 40c . . . , similar to those taught in conjunction with FIGS. 16 through 18. Loop traces 40a, 40b, 40c . . . include mounting pads 28b. It is understood that loop traces 40a, 40b, 40c etc. represent one form of an antenna but many other structural patterns are also possible. In addition DER structure represented by 40a, 40b, 40c etc. in the embodiment could form but a portion of a completed antenna structure.

As one of normal skill in the art will understand, in order for the DER loop traces 40a, 40b, 40c etc. to be electroplated, there has to be electrical communication between the DER loop traces and a source of cathodic potential or contact. In the present embodiment, electrical buss structure 42 and fingers 43 serve to provide electrical communication between the DER loop traces 40a, 40b, 40c etc. and the source of cathodic potential or contact. Fingers 43 join loop traces 40a, 40b, 40c etc. to buss structure 42 and serve to supply electrical communication between loop traces 40a, 40b, 40c etc. and buss structure 42. It is understood that fingers 43 are not necessary if loop traces 40a, 40b, 40c etc. are in electrical contact with buss structure 42. Electrical buss structure 42 extends along the length of insulating web 14h and connects to individual loop traces 40a, 40b, 40c etc. thru fingers 43. Buss 42 and fingers 43 may comprise electroplateable material. However, they may also comprise any material capable of transporting the necessary current to allow for electroplating such as a coated metal wire or strip. The material used to form buss structure 42 may be different than that used to form finger 43 and/or DER loop traces 40a, 40b, 40c etc.

The initial structural arrangement of DER material 12h supported on a web of insulating material 14h can be produced by known techniques, including programmed extrusion of thermoplastic DER or printing of a DER formulation dissolved in solvent to form an ink, coating or paint. The pattern of DER loops can then be directly electroplated by continuously passing the web having the DER pattern disposed thereon through appropriate electroplating baths. In the electroplating operation, "busses" 42 provide electrical communication to conduct the electrodeposition current between (from or to) individual loops to a cathodic contact.

Figure 20:
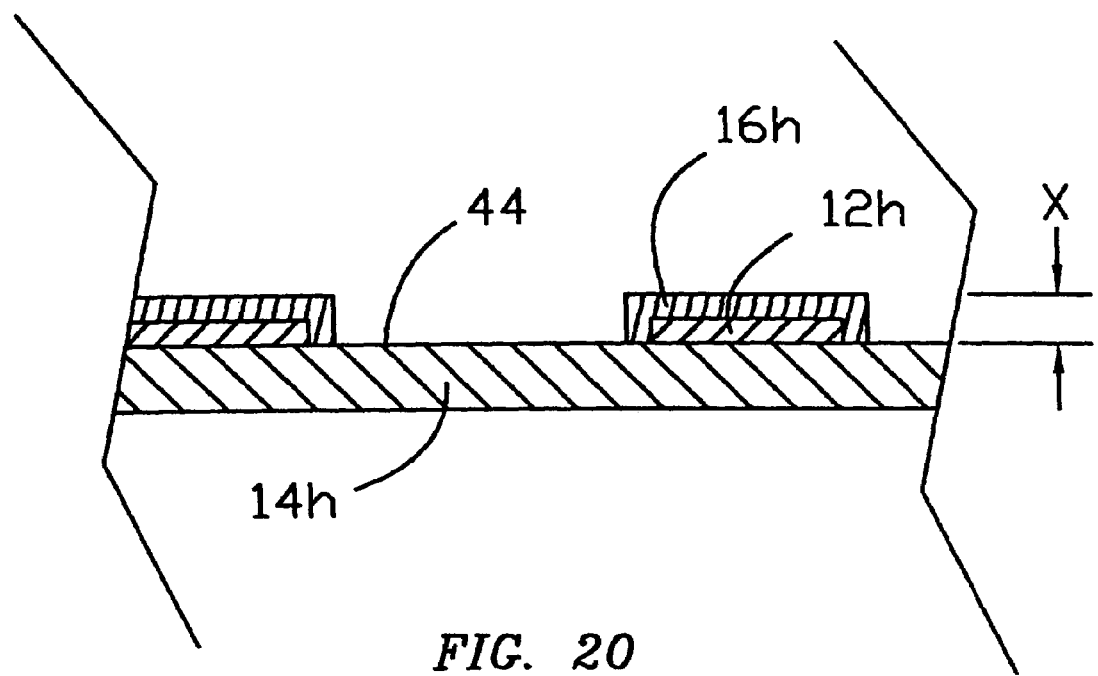
FIG. 20 is a sectional view taken substantially from the perspective of line 20-20 of FIG. 19.
Figure 21:
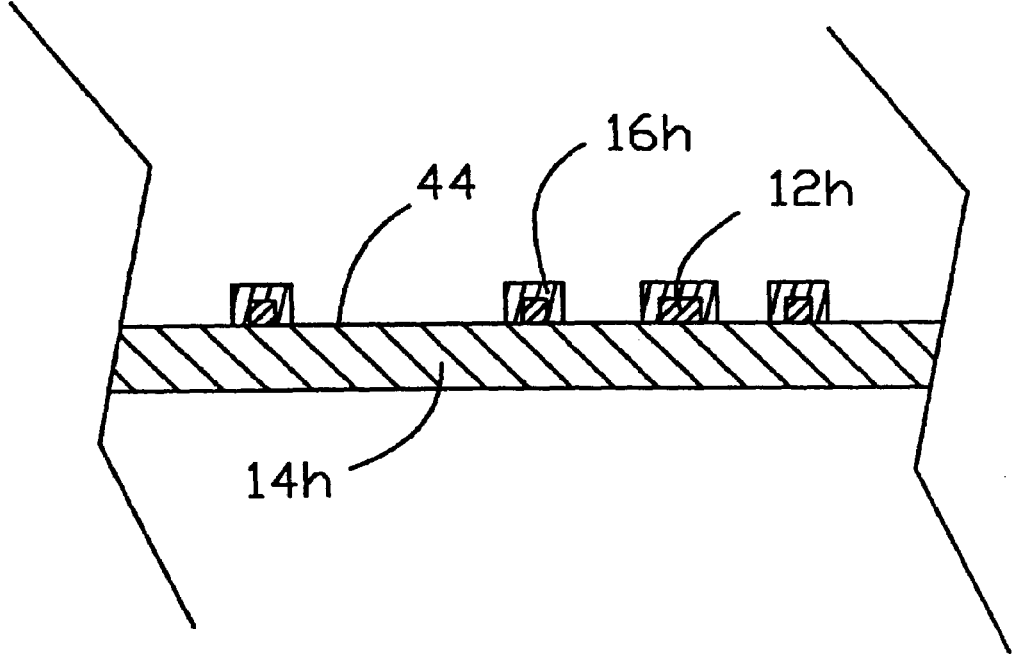
FIG. 21 is a sectional view taken substantially from the perspective of line 21-21 of FIG. 19.

FIGS. 20 and 21 are sectional views of the FIG. 19 structure taken substantially from the perspective of lines 20-20 and 21-21 of FIG. 19. FIGS. 20 and 21 show that the DER and electrodeposit, 12h and 16h respectively, are positioned on the top surface 44 of supporting insulating material 14h. Such a positioning is likely more easily achieved for the continuous web processing envisioned as compared to the embedded placement of the DER 12g in substrate 14g shown in the embodiments of FIGS. 16 through 18. Nevertheless, the total thickness of the composite DER/electrodeposit traces, indicated by dimension "X" in FIG. 20 can be made relatively small, for example approximately 75 micrometers or less. Thus, the low profile of the conductive traces is maintained.

Figure 22:
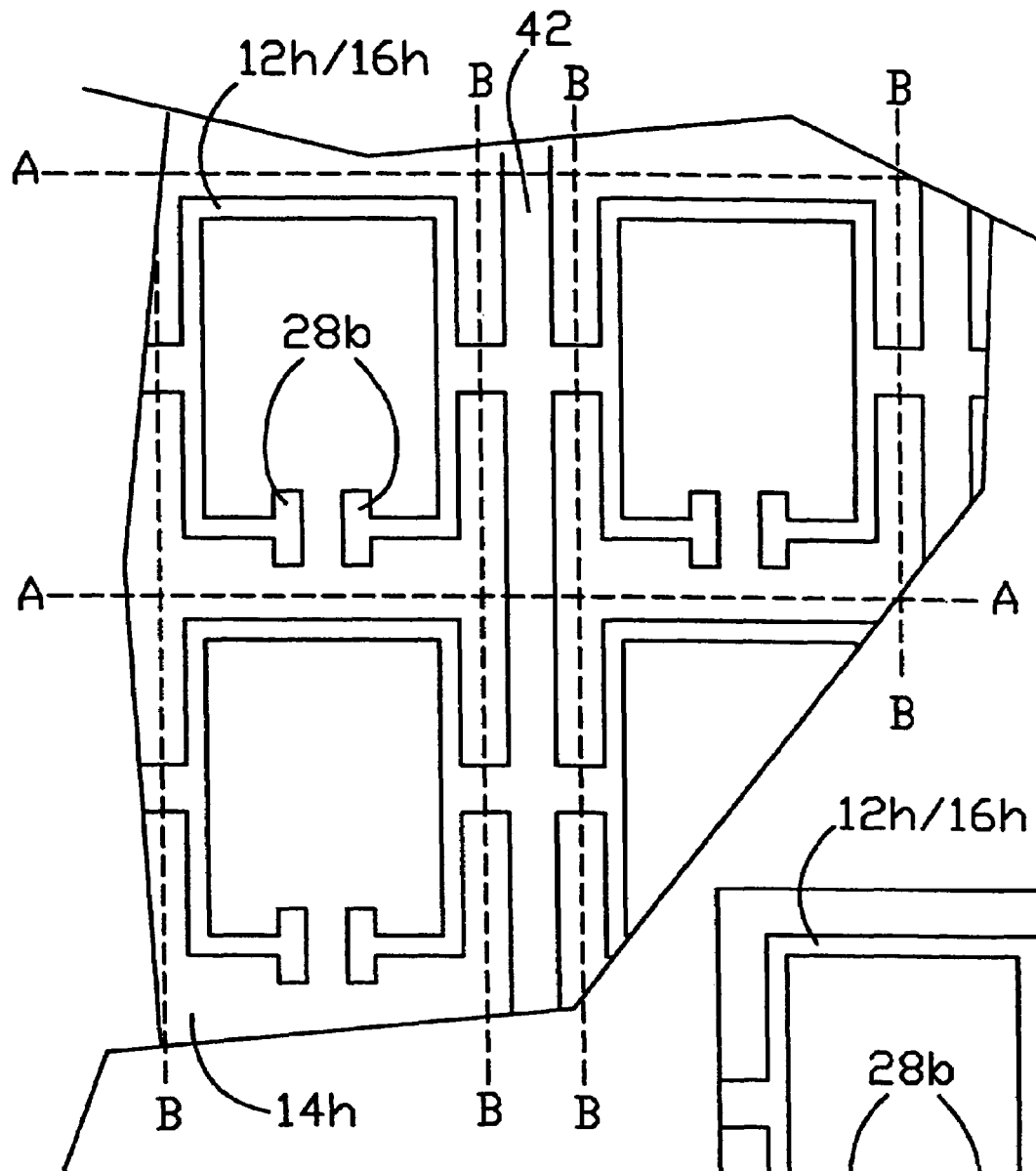
FIG. 22 is a top plan view similar to FIG. 19 indicating a cut line pattern for subdividing the arrangement to produce multiple individual loop antennas.
Figure 23:
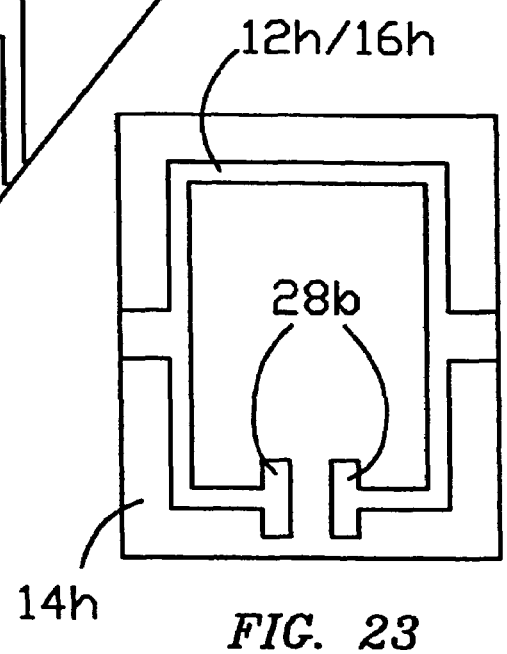
FIG. 23 is a top plan view of the individual antenna produced by the subdividing along the lines indicated in FIG. 22.

FIG. 22 is an additional plan view of the embodiment of FIGS. 19 through 21 showing dashed lines A, B along which the completed web is subdivided. This can be accomplished by known techniques such as slitting or punching. The subdividing results in individual conductive loop structures as shown in FIG. 23. It is understood that the subdivision can take place at many potential points along buss 42 or fingers 43. It is also understood that additional operations, such as attachment of an electrical device to pads 28b of the individual loops, can be considered while the web is in its initial "continuous" form prior to subdivision. In reviewing the embodiments illustrated in FIG. 19 through 23 it is readily appreciated that the structure 39 shown in FIG. 19 serves as an intermediate article of manufacture in the production of multiple antennas as depicted in FIG. 23.

Figure 24:
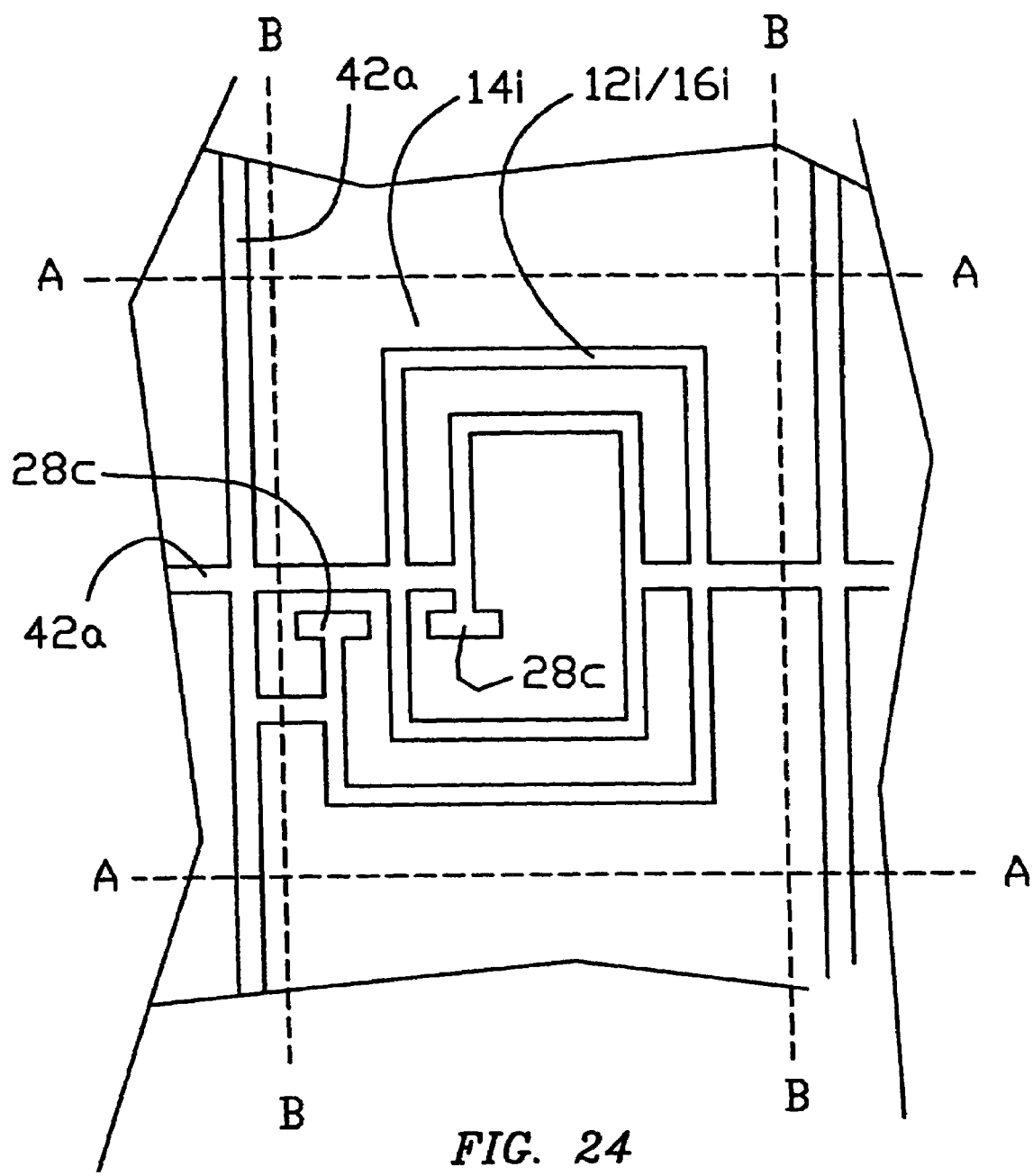
FIG. 24 is a top plan view of intermediate article in production of multiple loop, low profile antennas according to the teachings of the invention.
Figure 25:
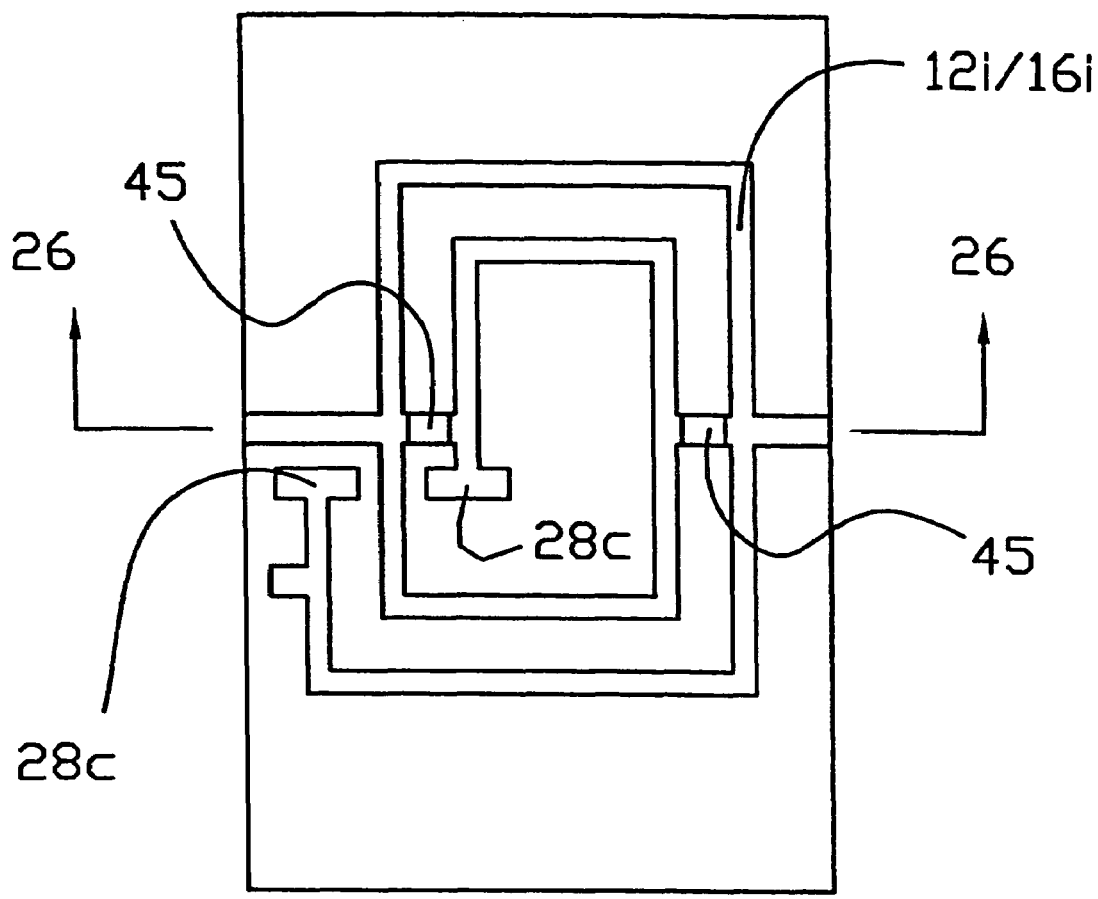
FIG. 25 is a top plan view of a discrete multiple loop, low profile antenna produced by additional processing of the article of FIG. 24.
Figure 26:
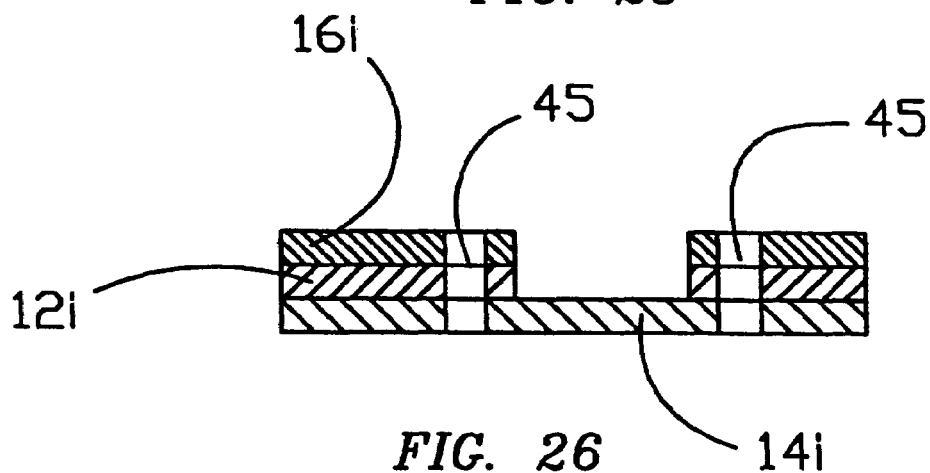
FIG. 26 is a sectional view of the article embodied in FIG. 25 taken substantially from the perspective of line 26-26 of FIG. 25.

The embodiments of FIGS. 16 through 23 illustrate a single loop of a highly conductive, low profile trace suitable for an antenna/inductor. In some cases, multiple loops of the conductive trace would be desirable. FIGS. 24 through 26 illustrate a method for production of such a multiple loop trace. FIG. 24, a top plan view similar to FIG. 19, shows a pattern of DER/electrodeposit trace 12i/16i supported on insulating material 14i. The pattern includes buss structure 42a, whose function was previously discussed in conjunction with FIGS. 19 through 23, and mounting pads 28c. FIG. 25 is a top plan view of the article produced by removing portions of the structure of FIG. 24. The structure of FIG. 25 is produced by slitting or otherwise cutting the web along the lines generally indicated by the dashed lines A and B of FIG. 24. As discussed previously, the slitting can take place at many locations. One appreciates that holes 45 suffice to sever the electrical connection between inner and outer loop portions of the coil pattern. This effect of holes 45, to sever electrical connections, can be achieved by any number of methods such as laser cutting, ablation, grinding, punching etc. FIG. 26, a sectional view taken from the perspective of line 26-26 of FIG. 25, further illustrates the structural arrangement following the slitting and punching operations.

Figure 27:
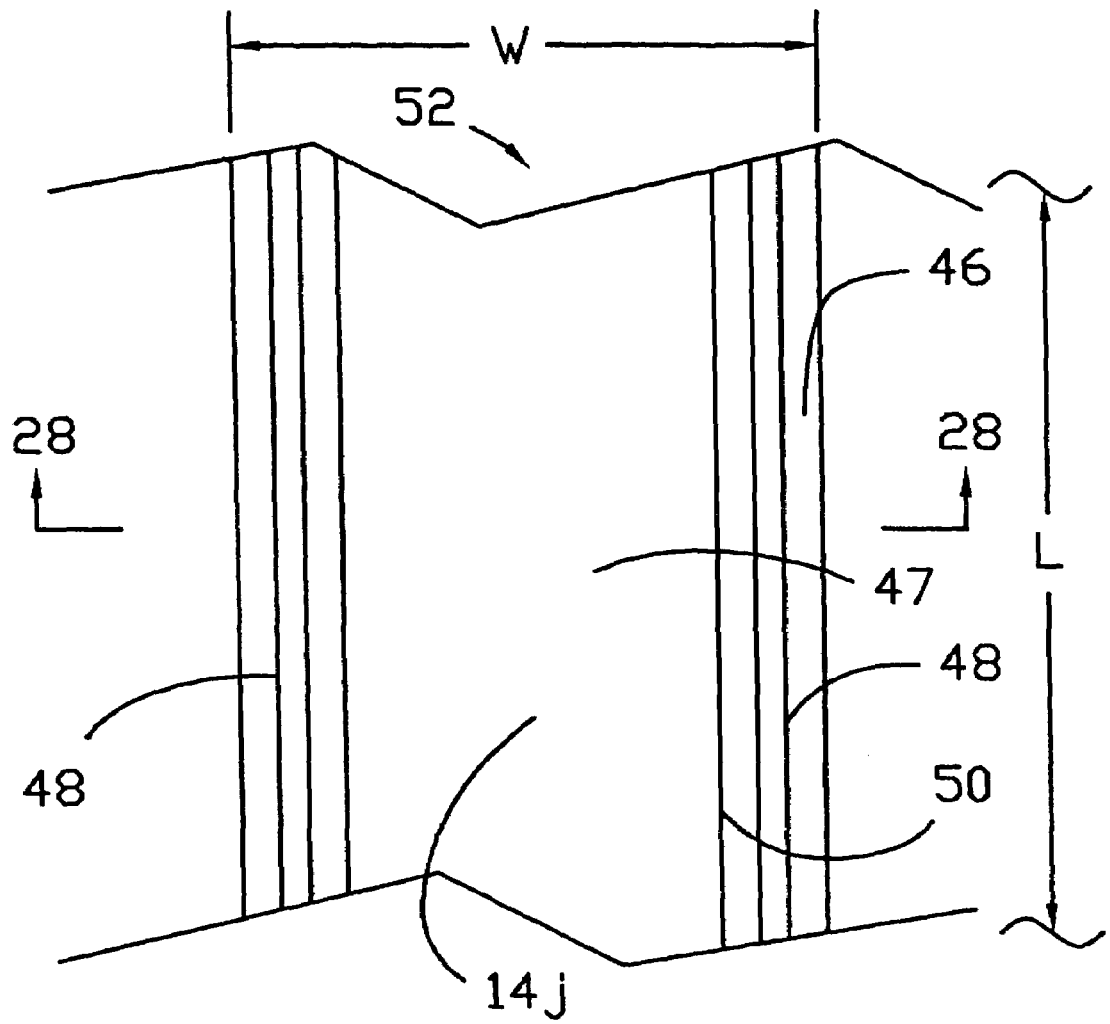
FIG. 27 is a top plan view of an intermediate structural arrangement in the manufacture of yet another embodiment of the invention.

Referring now to FIGS. 27 through 35, there is shown structure and process to produce a helical coil inductor/antenna having a substantially flat, low profile. FIG. 27 is a top plan view of a structural arrangement generally indicated by numeral 52 comprising a temporary support web 46, a core support web 47 of insulating material 14j and metal wires 48 positioned slightly removed from the edges 50 of core support web 47. Arrangement 52 has length as indicated by "L" and width indicated by "W" in FIG. 27. It is contemplated that length "L" of arrangement 52 is considerably greater than width "W" and that arrangement 52 can be processed essentially "continuously" in a roll-to-roll fashion in the length "L" direction.

Figure 28:
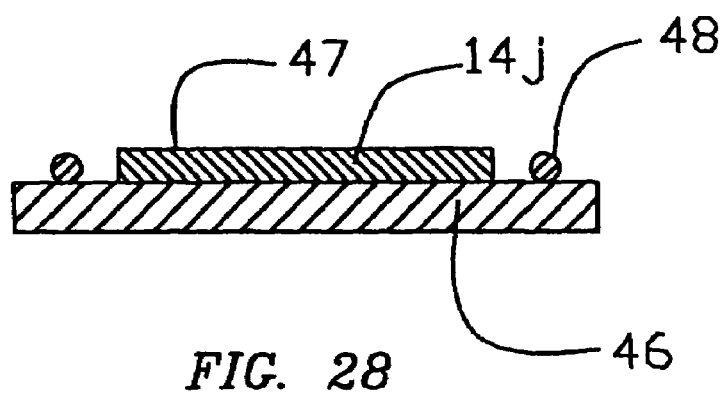
FIG. 28 is a sectional view taken substantially from the perspective of line 28-28 of FIG. 27.

FIG. 28, a sectional view taken substantially from the perspective of line 28-28 of FIG. 27, shows that core support web 47 and metal wires 48 rest on temporary support web 46. As will become clear, there should be little or no adhesion between core support web 47 or metal wires 48 and temporary support web 46 as an eventual process step requires release of core support web 47 and metal wires 48 from temporary support web 46.

FIG. 29 is a top plan view of the FIG. 27 arrangement after an additional process step. In the FIG. 29 embodiment, indicated by numeral 54, strips 49 of electrically conductive resin 12j have been applied to the top surface of the FIG. 27 arrangement. Strips 49 extend at an angle "theta" with respect to width "W" and extend sufficiently to overlay wires 48. As will become clear in the following, strips 49 define one half of the eventual helical structure. The positioning of strips 49 is further defined by reference to FIGS. 30 and 31. FIGS. 30 and 31 are sectional views taken substantially from the perspective of lines 30-30 and 31-31 of FIG. 29.

It is contemplated that strips 49 can be applied in the angled arrangement shown in FIGS. 29 through 31 using techniques known in the art such as thermoplastic melt extrusion or printing of conductive resin based pastes and inks.

The material used to form the conductive strips 49 can be chosen from any number of conductive resin-based materials. A particularly advantageous material choice would be a DER, although this choice is not required for this embodiment. The linear extent of strips 49 may be limited. In addition, metal wires 48 supply excellent electrical contact to both ends of strips 49. Thus, as will become clear in the following, the rapid electrodeposit coverage associated with DER materials may not be always necessary for production of certain coil structures according to the embodiments of FIGS. 27 through 35.

Figure 32:
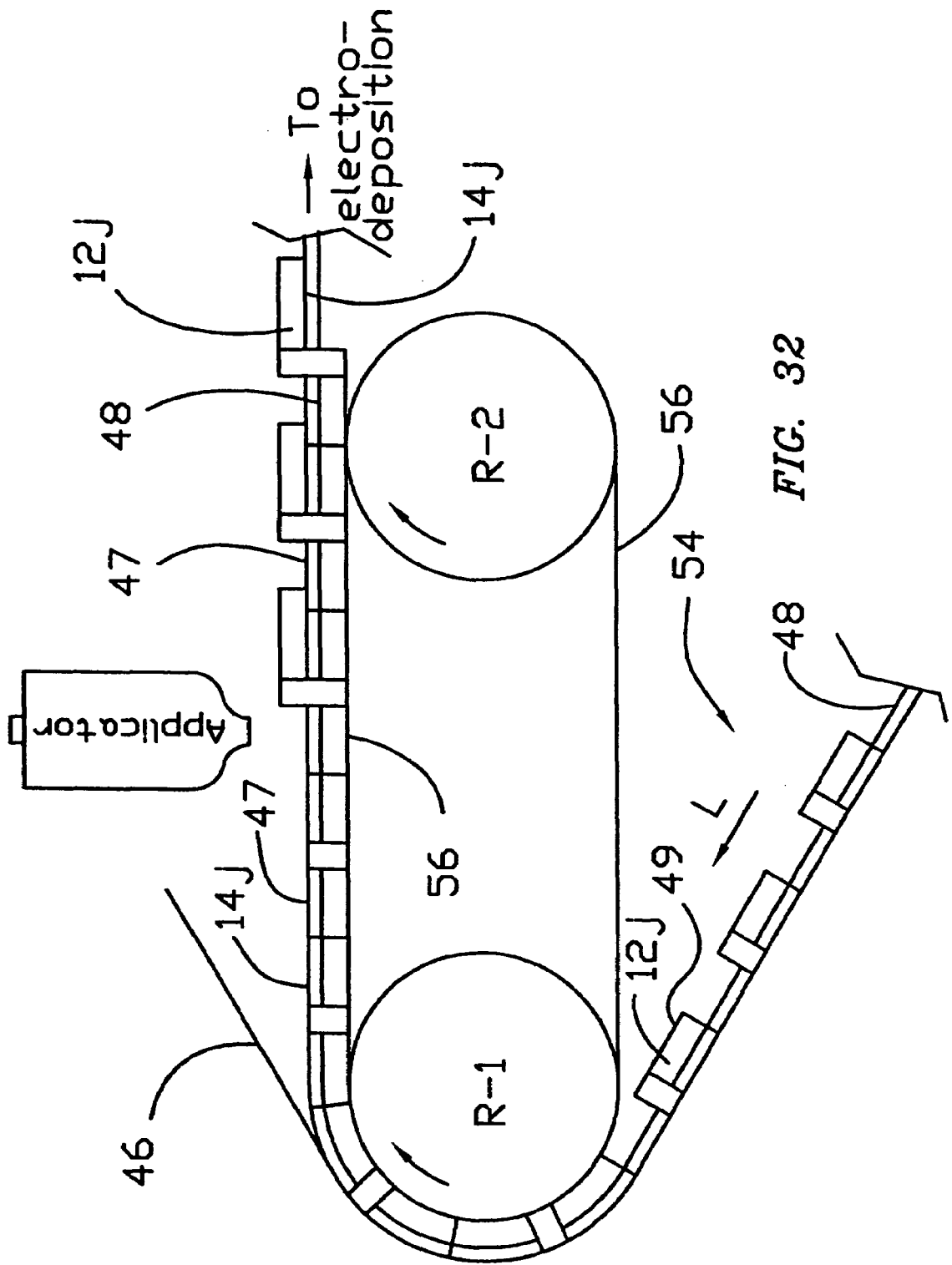
FIG. 32 is a side view illustrating additional processing to the embodiment of FIGS. 29 through 31.

FIG. 32 shows a process wherein the helical coil pattern of electrically conductive resinous material 12j is completed. The structure of FIGS. 29 through 30 is fed to roll R-1. As the structure changes its direction of linear motion as it passes over roll R-1, the temporary support web 46 is removed as shown and the structure is transferred to temporary support belt 56. Temporary support belt travels continuously between rolls R-1 and R-2 as shown. In traversing roll R-1, structure 54 releases its temporary support web 46 and gets "flipped over on its back" onto temporary support belt 56.

Figure 33:
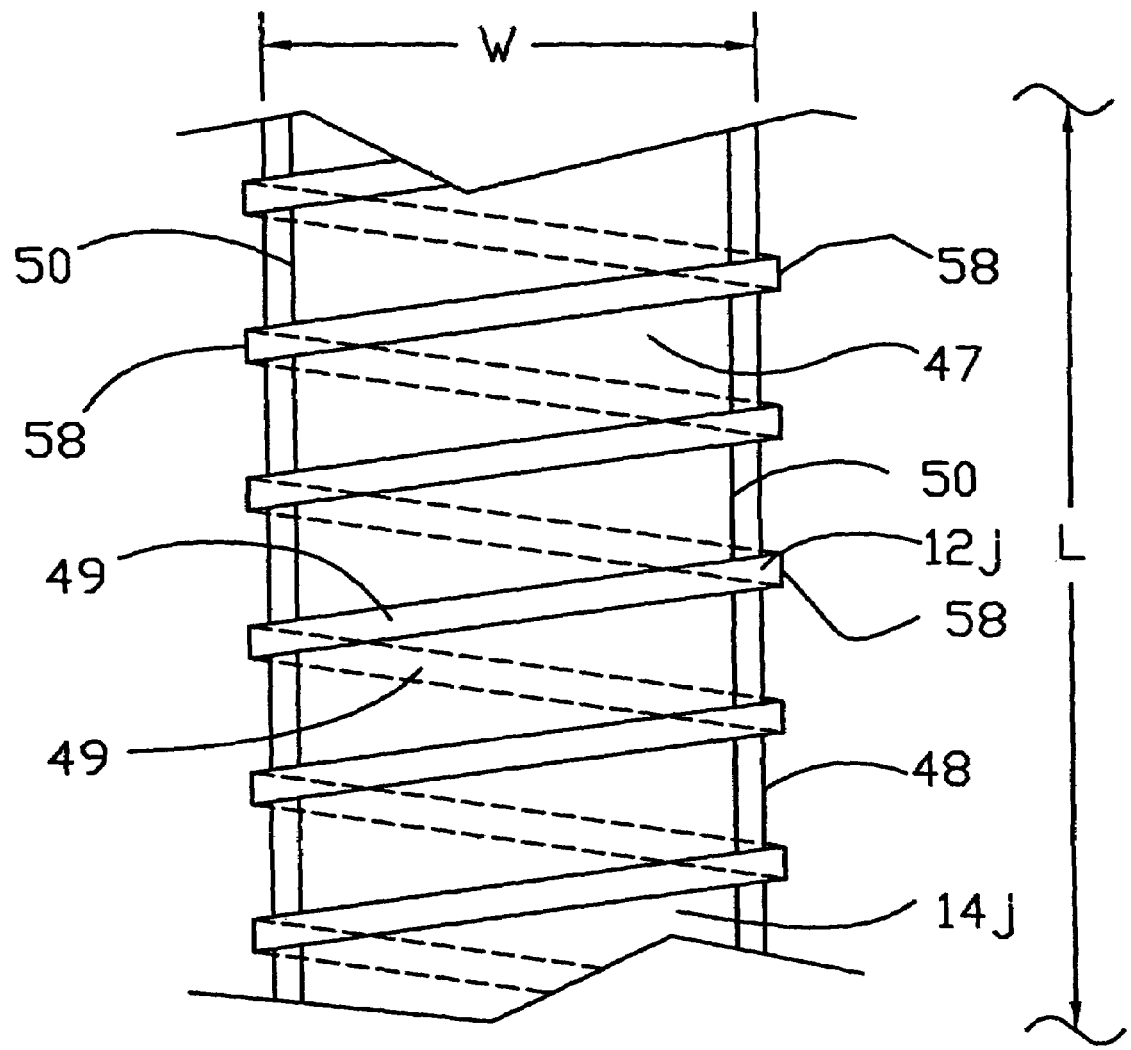
FIG. 33 is a top plan view embodying the structure resulting from the process illustrated in FIG. 32.

The remaining structure passes under an applicator which applies strips of electrically conductive resinous material at essentially the same angle theta to join the opposite ends of linearly sequential strips 49 of the intermediate article illustrated in FIGS. 29 through 31. The result of the process of FIG. 32 is the article shown in plan view in FIG. 33. In FIG. 33, electrically conductive resinous strips 49 extend in a continuous helical path around core support web 47. Strips 49 extend sufficiently in the width dimension "W" to enable them to overlay metal wires 48 at terminal ends of the strips 49.

One will appreciate that structures equivalent to that depicted in FIG. 33 can be produced by other techniques. For example, an alternate process would be to first apply angled conductive resinous strips spanning two wires, the resinous strips and wires all supported by a temporary support. Next, a core support web of width slightly less than the separation of the wires would be applied to overlay and bond to the conductive strips. Next, additional conductive resinous strips would be applied to join opposite ends of the sequentially adjacent, initially applied strips and the temporary support removed. This form of process could of course be accomplished without the change in direction of travel associated with the process depicted in FIG. 32.

Figure 34:
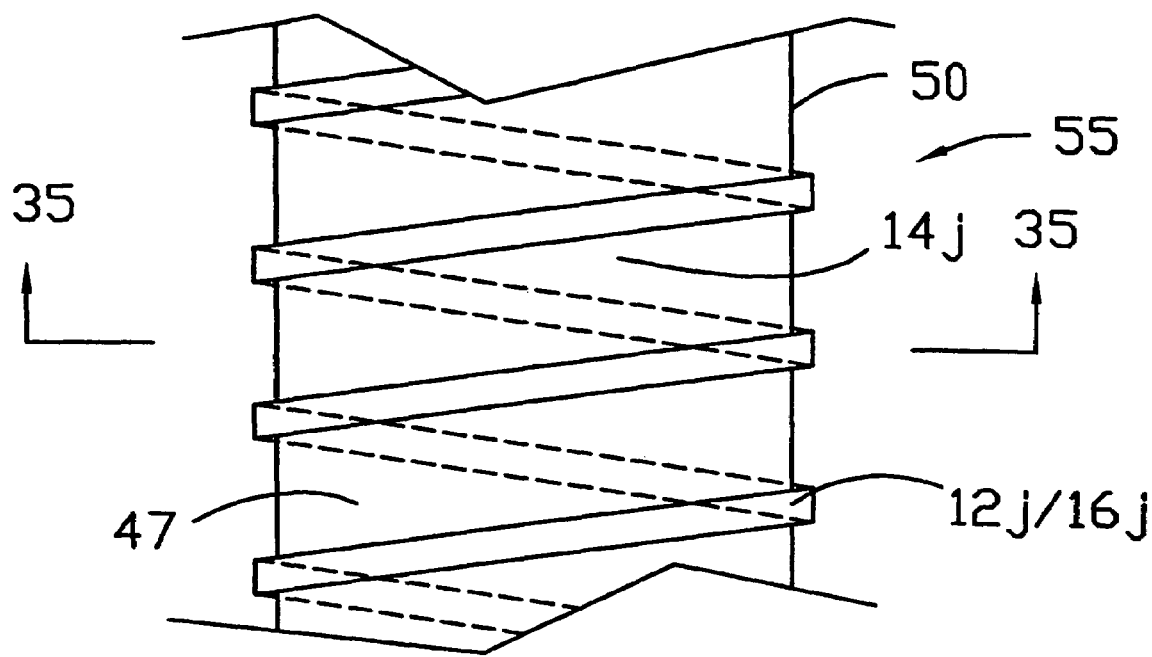
FIG. 34 is a top plan view of the embodiment of FIG. 33 following additional processing steps.
Figure 35:
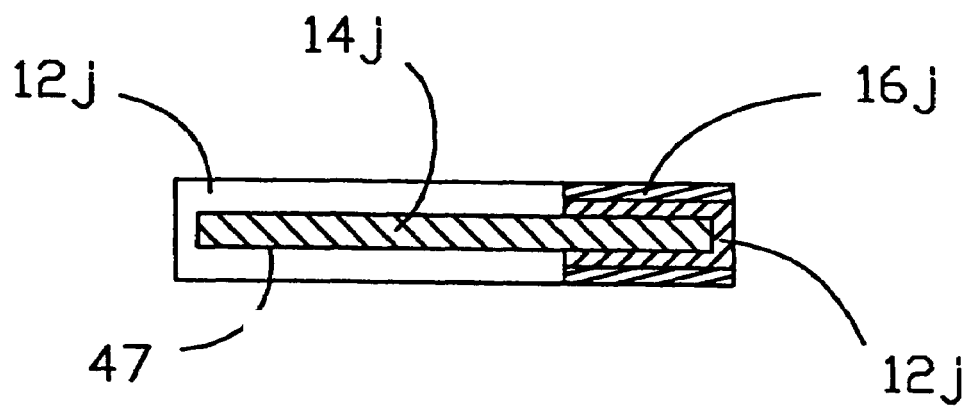
FIG. 35 is a sectional view of the article illustrated in FIG. 34 taken substantially from the perspective of line 35-35 of FIG. 34.

FIG. 34 illustrates the completed low profile helical coil antenna/inductor in plan view. The structure of FIG. 34, indicated by numeral 55, is achieved by first subjecting the article of FIG. 33 to an electrodeposition process, which in a preferred embodiment is conducted "continuously" using metal wires 48 as "busses" for passage of cathodic current to the strips 49, now comprising electrically conductive resin 12j and electrodeposit 16*j*. Following this electroplating, a cutting process is used to sever the metal wires 48. The remaining structure shown in the embodiment of FIG. 34 comprises a continuous electrodeposited metal-based helical structure 16*j* wrapped around a central supporting core web 47. FIG. 35 is a sectional view of the FIG. 34 structure viewed substantially from the perspective of line 35-35 of FIG. 34. FIG. 35 shows the composite structure of metal-based electrodeposit 16*j* on electrically conductive polymer 12*j* supported on core support web 47 of electrically insulating material 14*j*.

In light of the teachings embodied in FIGS. 27 through 35, those skilled in the art will realize the added performance benefits of the FIG. 34 structure possible through selection of appropriate materials to produce core support web 47. For example, a choice of a polymer-based compound incorporating a magnetic filler would likely alter the transformer characteristics of the structure.

A major contribution of the present invention is the substantial expansion of design options for production of three-dimensional conductive traces and antenna patterns. The limitations of photoetching and masking techniques were made clear in the prior art by Mettler et al. in U.S. Pat. No. 4,985,116. There it was pointed out that a photomask could be readily produced to form a conductive pattern on the head of a mushroom, but that masking to produce patterns on the stem of a mushroom would be far more difficult. Using the same example of a mushroom, the increased design flexibility offered by the present invention will be taught in conjunction with FIGS. 36 through 50.

Figure 36:
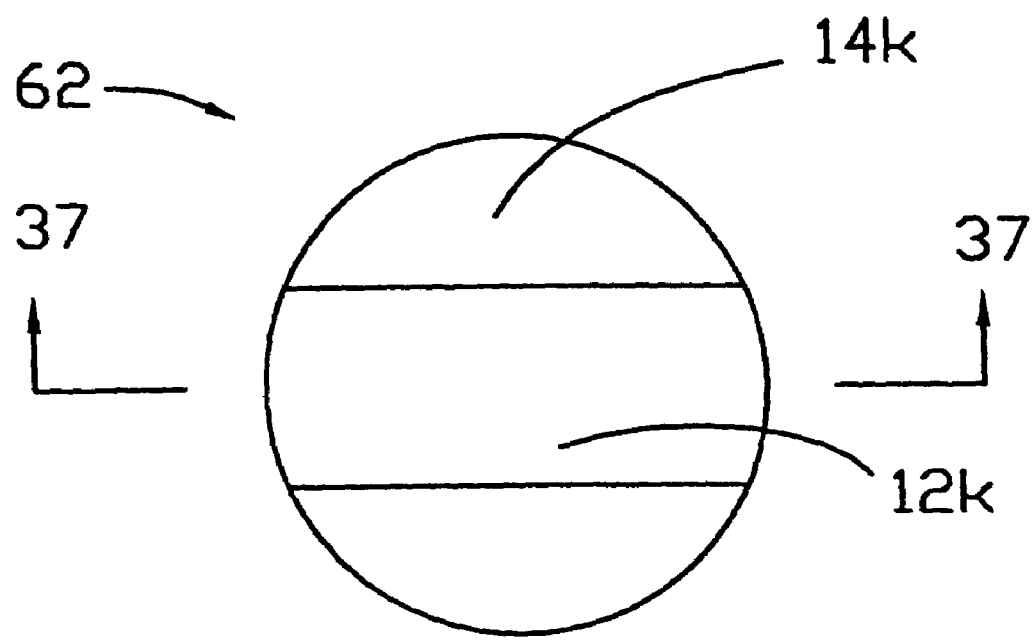
FIG. 36 is a top plan view of an intermediate article in the manufacture of an additional embodiment of the invention.
Figure 37:
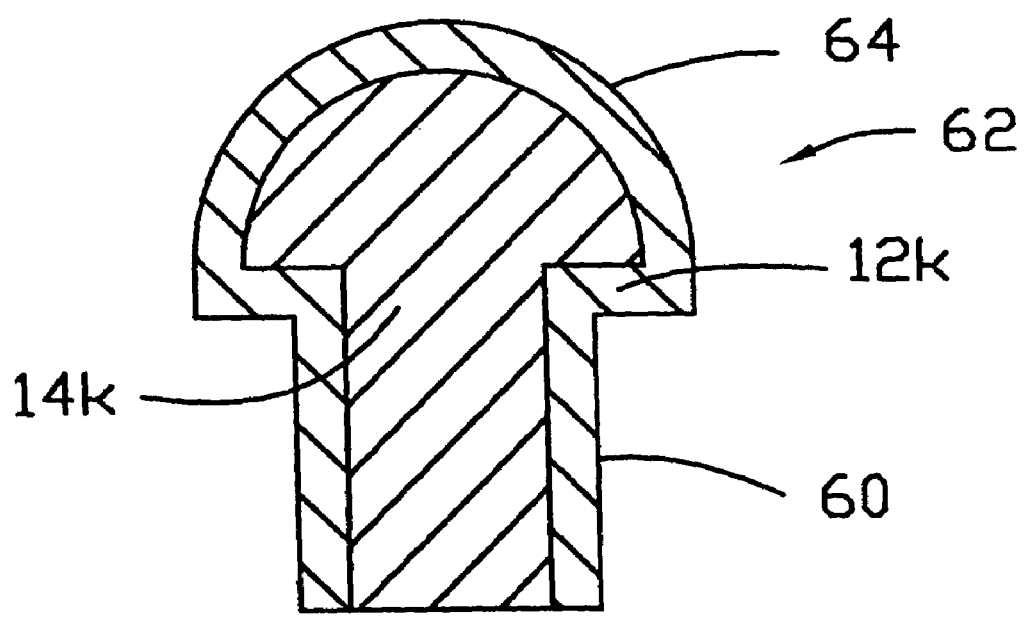
FIG. 37 is a sectional view taken substantially from the perspective of line 37-37 of FIG. 36.

Referring now to FIG. 36, there is shown a top plan view of an article, generally referred to as 62. Article 62 comprises electrically insulating material 14*k* and DER material 12*k*. FIG. 37, a sectional view taken substantially from the perspective of line 37-37 of FIG. 36, shows article 62 to have a mushroom shape. DER material 12*k* has the form of a stripe extending up the sides of the stem 60 of mushroom shaped article 62, then over the head 64 and then back down the opposite side of mushroom shaped article 62. Article 62 can be readily produced by known two shot molding techniques.

Figure 38:
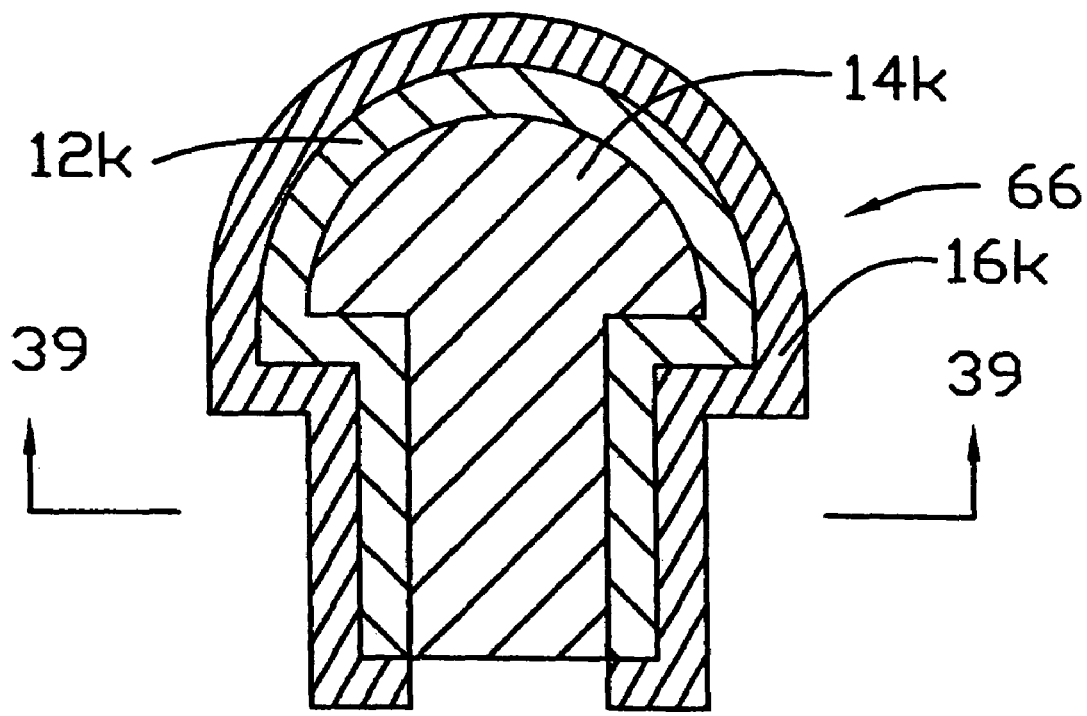
FIG. 38 is a sectional view of the article embodied in FIGS. 36 and 37 following additional processing.
Figure 39:
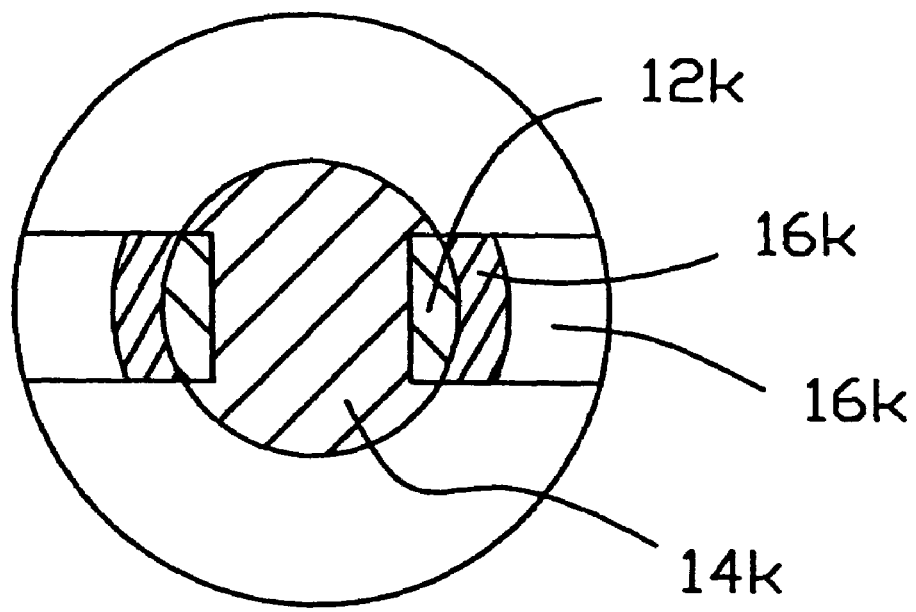
FIG. 39 is a sectional view taken substantially from the perspective of line 39-39 of FIG. 38.

FIGS. 38 and 39 illustrate the article 62 of FIGS. 36 and 37 following an additional processing step of electroplating the DER material 12*k*. Electrodeposit 16*k* extends up, over and back down the opposite side of the mushroom shaped article, now identified as article 66 to indicate this additional process step. FIG. 39 is a sectional view of article 66 from the perspective of line 39-39 of FIG. 38. Those skilled in the art will quickly recognize that production of a highly conductive trace such as that shown in FIGS. 38 and 39 would be very difficult using conventional photomask and etching techniques available to the art and that more complicated three dimensional conductive traces could be indeed impossible to produce using photomask/etching techniques.

The embodiment of FIGS. 36 through 39 illustrate material 14*k* as a solid insulating support for DER material 12*k* (and subsequent electrodeposit 16*k*). In some cases it may be advantageous to consider a hollow structure. This could specifically be advantageous in the case of antenna design, wherein air could be considered as a dielectric.

Hollow structures can be readily produced using the teachings of the present invention. Hollow structures comprising selective patterns of metal-based materials are taught in the following in conjunction with FIGS. 40 through 50. The "mushroom shape" format will be used in conjunction with FIGS. 40 through 50.

Figure 40:
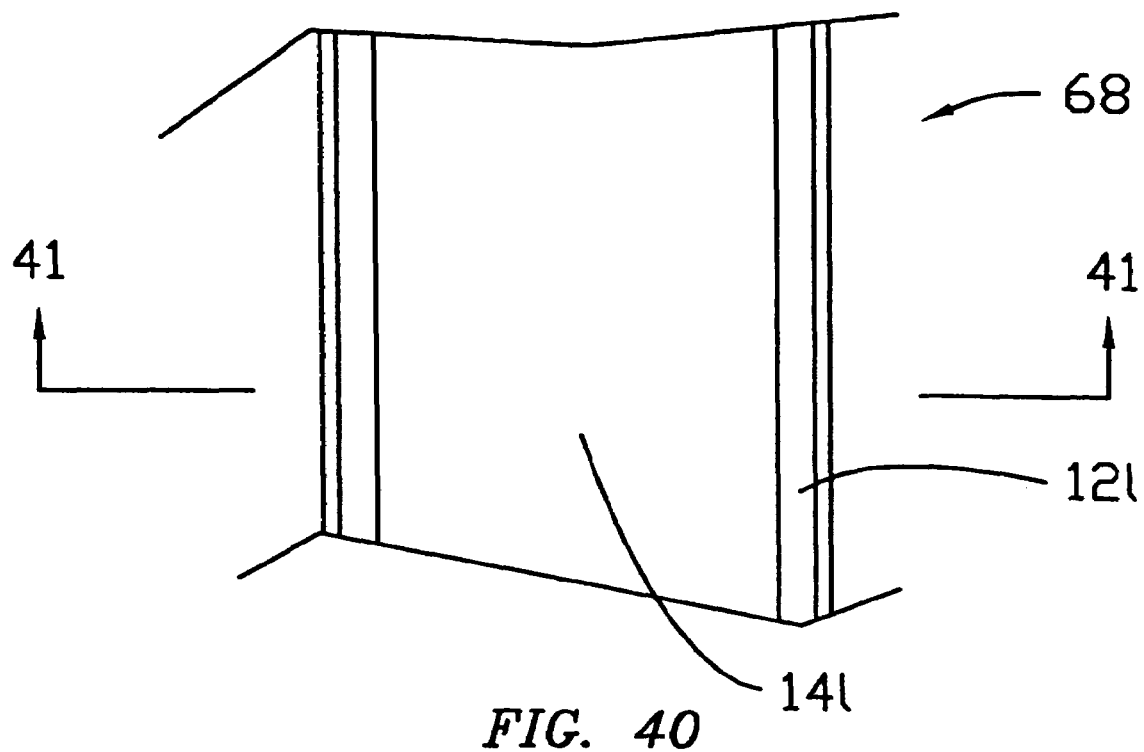
FIG. 40 is a vertical plan view of an intermediate article in production of yet another embodiment of the invention.
Figure 41:
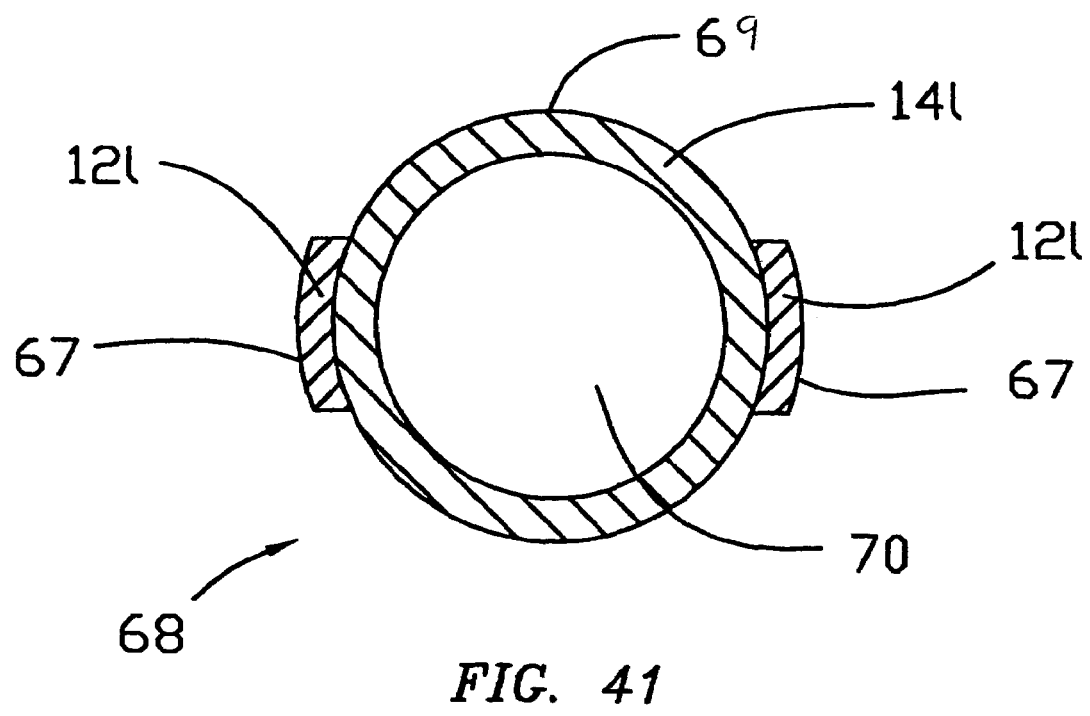
FIG. 41 is a sectional view taken substantially from the perspective of line 41-41 of FIG. 40.

Referring now to FIG. 40, there is shown in vertical plan view a structure 68 commonly referred to in the plastics processing art as a parison. A parison is a hollow structure, often tubular in cross section, comprised of molten or semi-molten polymeric material. A parison is normally produced by extrusion of thermoplastic through a forming die. FIG. 41 is a sectional view of the parison depicted in FIG. 40 taken substantially from the perspective of line 41-41 of FIG. 40. Combining the views of FIGS. 40 and 41 it is seen that the parison, generally identified by numeral 68, comprises a hollow tube 69 of insulating resin 141 surrounding gaseous space 70. Space 70 most often comprises air. Stripes 67 of electrically conductive resin 121 have been applied to opposite sides of hollow tube 69. Stripes 67 are conveniently applied by simultaneous coextrusion during formation of parison 68, as those knowledgeable in the art will understand. As will become clear in the following, a particularly advantageous choice of material 121 for stripes 67 is a DER.

Figure 42:
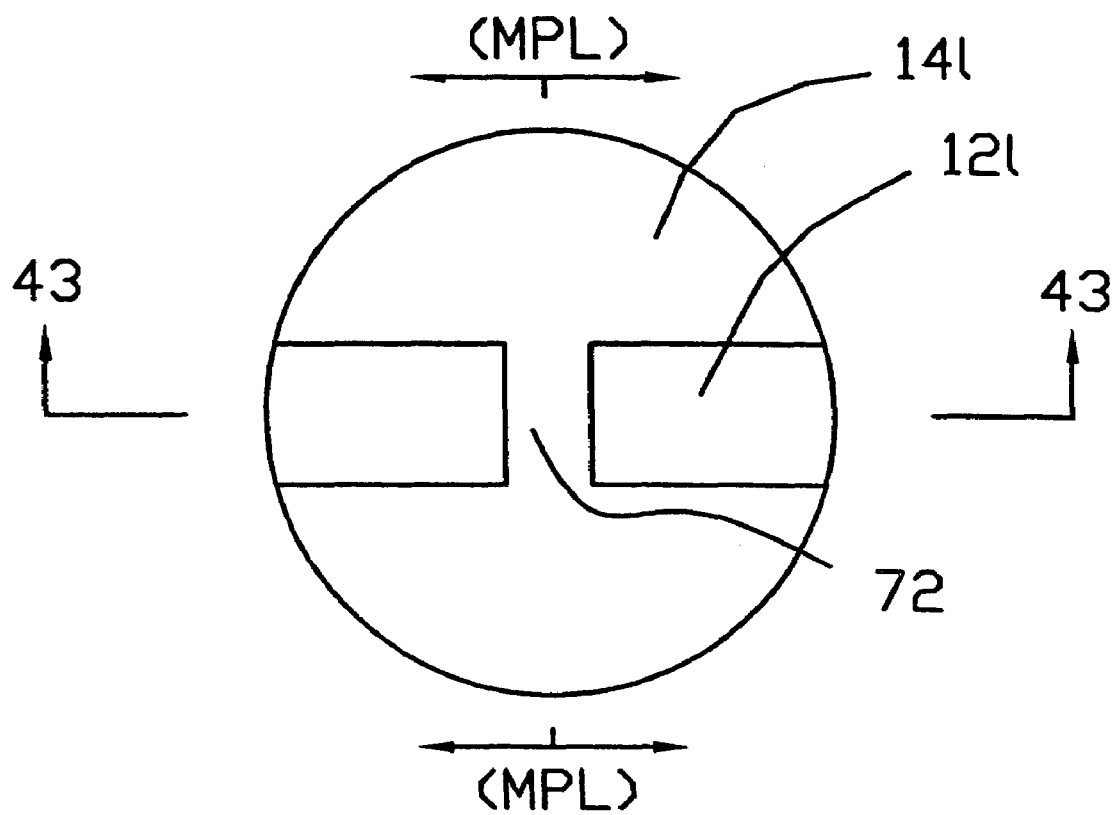
FIG. 42 is a top plan view of the intermediate article embodied in FIGS. 40 and 41 following additional processing steps.
Figure 43:
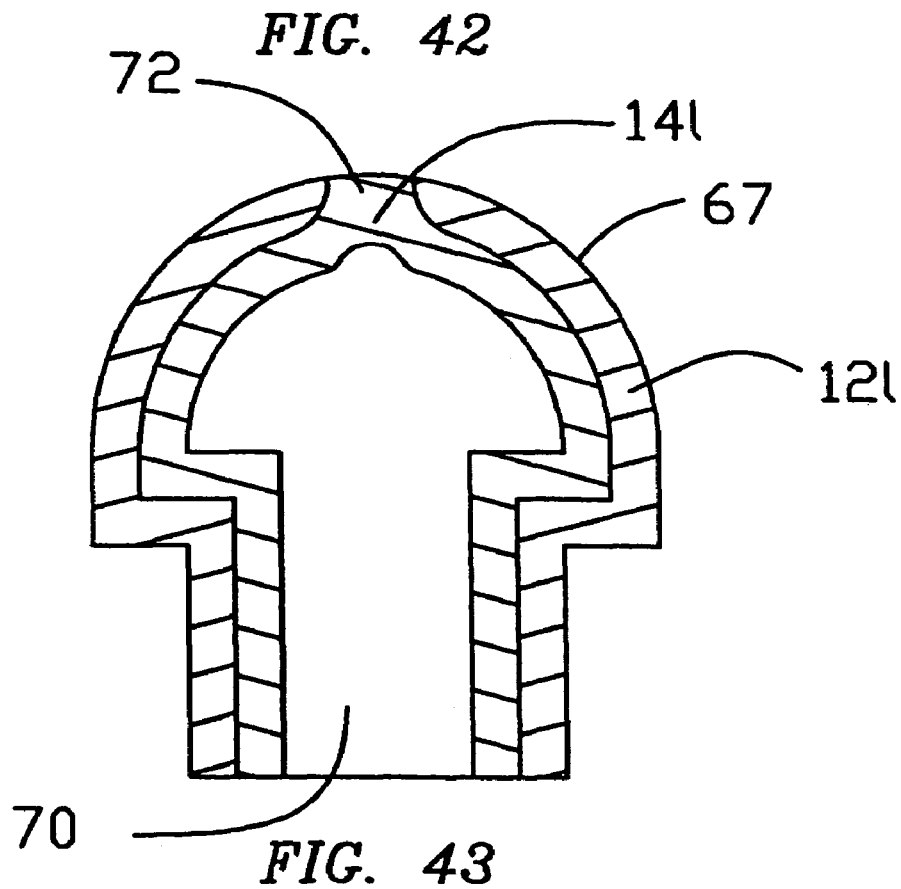
FIG. 43 is a sectional view taken substantially from the perspective of line 43-43 of FIG. 42.

FIGS. 42 and 43 illustrate the structure following additional processing steps. The article of FIGS. 42 and 43 is produced by first bringing the two "halves" of a blow mold (not shown) together to pinch off opposite ends of the parison and then pressurized gas, usually air, is injected into the remaining hollow space between the pinch points to force the molten plastic parison against the interior walls of the mold. Excess material is then trimmed to give the article as depicted and embodied in FIGS. 42 and 43.

In the embodiment of FIGS. 42 and 43, the mold travel during opening and closing is to the left and right, as indicated by "MPL" (Mold Parting Line) in FIG. 42. This gives rise to a separation, indicated as 72 in the FIGS. 42 and 43, between conductive resin stripes 67 positioned on the left and right portions of the blow molded article. This separation is formed as follows. When the mold initially closes on the parison, the inner insulating material 141 on opposite sides of the tubular parison 68 are first pinched together, preventing the material 121 forming stripes 67 on opposite sides of the parison 68 from contacting. After blowing and trimming of excess material, a separation 72 between the oppositely disposed stripes 67 remains.

Figure 44:
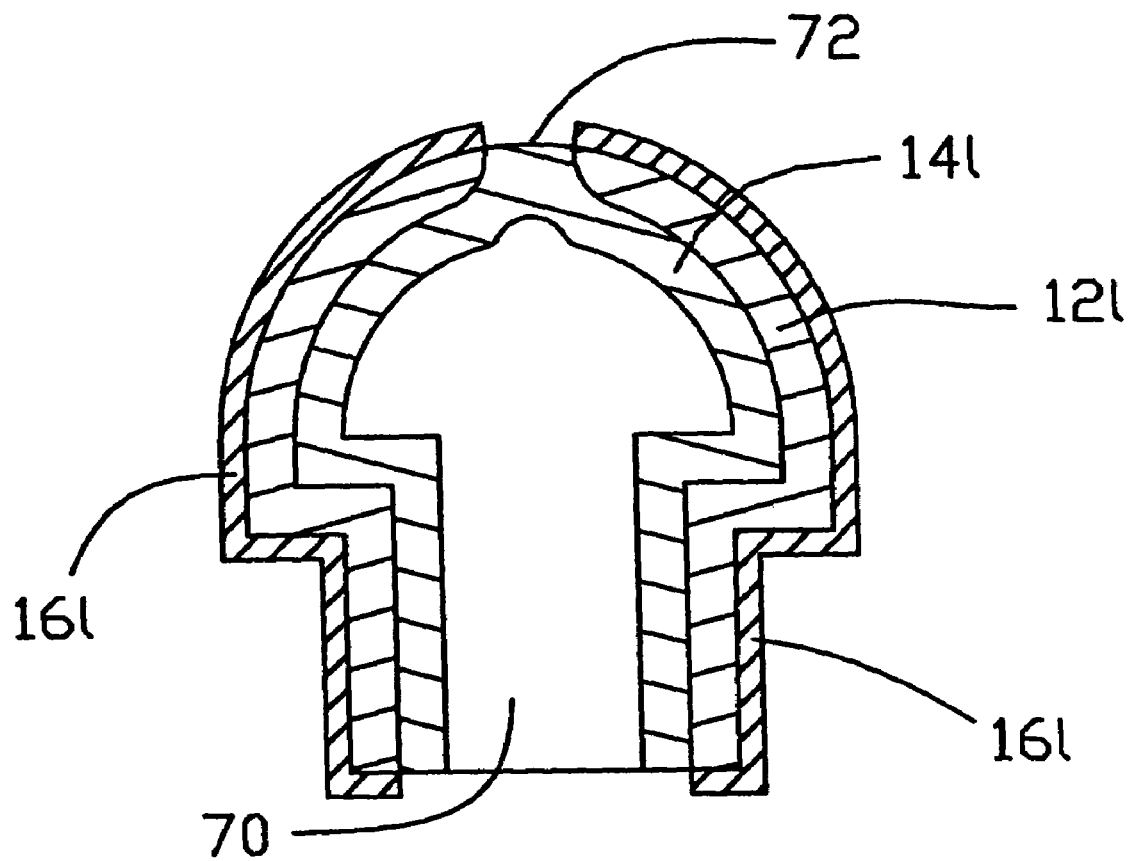
FIG. 44 is a sectional view, similar to FIG. 43, of the article embodied in FIGS. 42 and 43 following additional processing.

FIG. 44 is a sectional view similar to FIG. 43 after an additional optional process step. In FIG. 44, electrodeposited metal-based electrodeposit 161 has been deposited onto electrically conductive resin 121 resulting in oppositely disposed, highly conductive stripes of material positioned on a hollow, insulating, three dimensional structure defined by material 141. As in other embodiments of the current invention, the electrodeposition step is normally facilitated by choice of a DER for material 121, although this is not an absolute requirement to produce the hollow, conductively patterned structures embodied in FIGS. 40 through 44.

In some cases it may be desirable or necessary to establish continuity of the conductive pattern across the parting line of an extrusion blow molded article. Methods and structure for establishing such continuity are taught below in conjunction with FIGS. 45 through 50.

Figure 45:
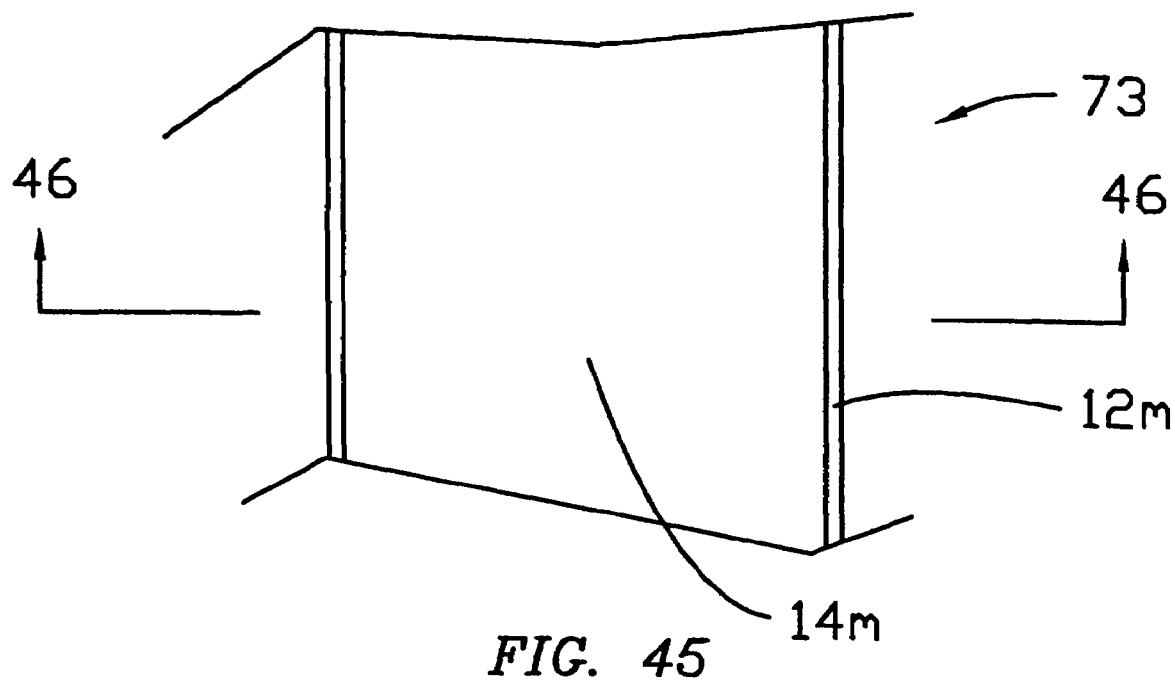
FIG. 45 is a vertical plan view of an intermediate article in production of yet another embodiment of the invention.
Figure 46:
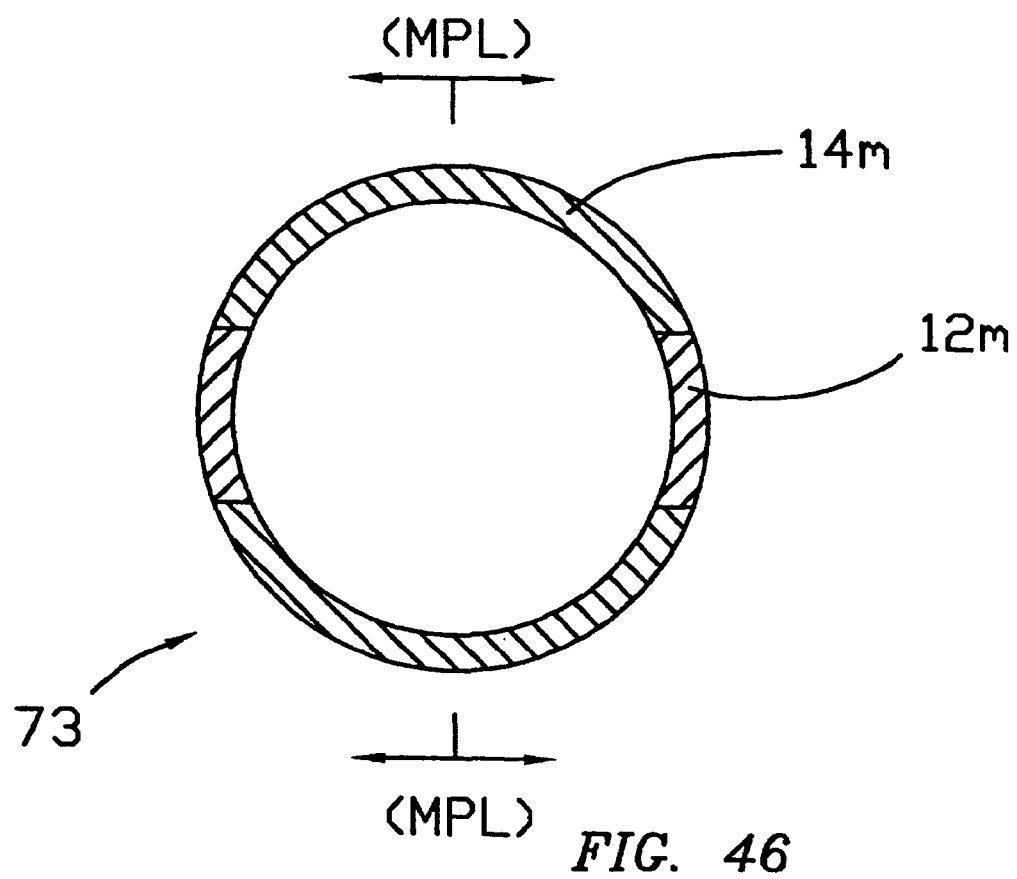
FIG. 46 is a sectional view taken substantially from the perspective of line 46-46 of FIG. 45.

FIG. 45 is a vertical plan view of a parison comprising electrically insulating material 14*m* and electrically conductive resin 12*m*. FIG. 46 is a sectional view taken substantially from the perspective of line 46-46 of FIG. 45. In contrast to the parison embodied in FIGS. 40 and 41, the conductive material 12*m* of the FIGS. 45 and 46 embodiments extends through the annular wall of the cylindrical parison 73 shown. The parison structure of FIGS. 45 and 46 can be achieved by well established techniques such as those used to produce transparent, level indicating "view stripes" commonly present on liquid detergent and oil bottles.

Figure 47:
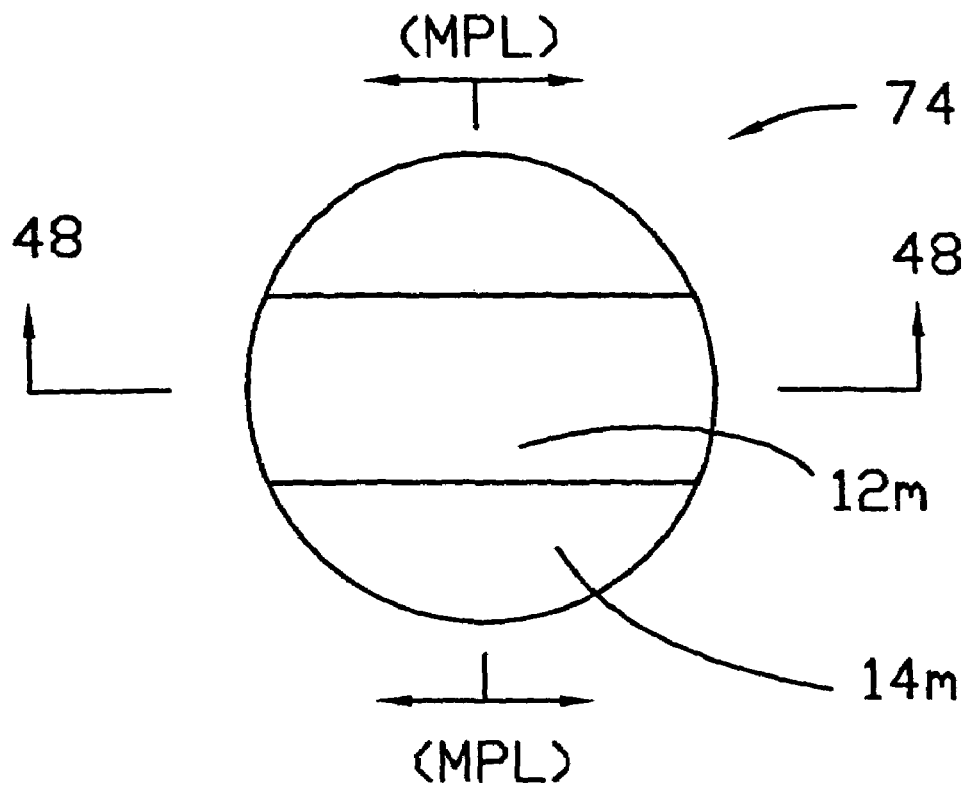
FIG. 47 is a top plan view of the intermediate article embodied in FIGS. 45 and 46 following additional processing steps.
Figure 48:
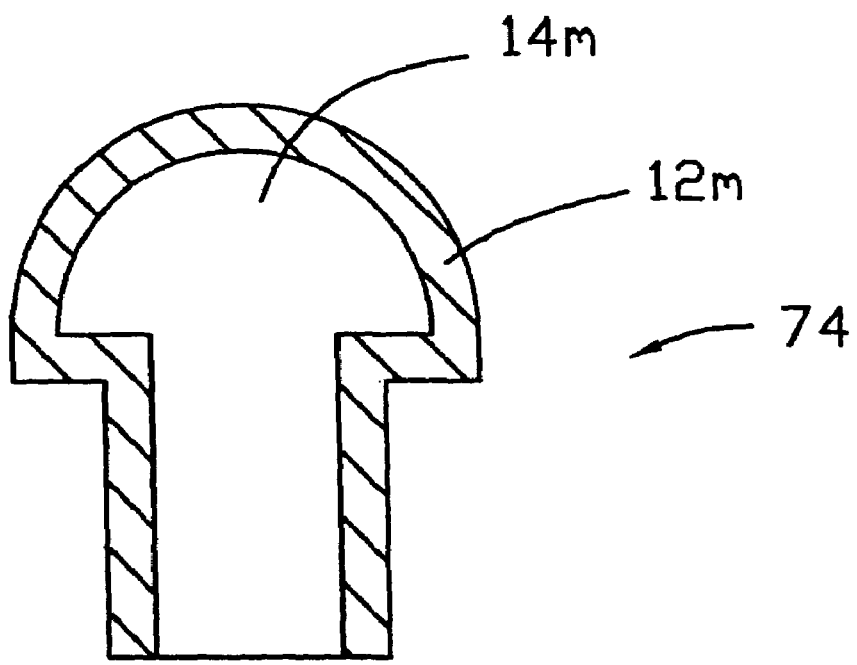
FIG. 48 is a sectional view taken substantially from the perspective of line 48-48 of FIG. 47.

When the blow mold is closed onto the parison of FIGS. 45 and 46 in the direction indicated by "MPL", material 12*m* on opposite sides of the parison is pinched together. Blowing pressurized gas into the cavity of the pinched parison expands the resin against the inner surfaces of the mold. After trimming of excess material, a patterned hollow article, indicated as 74 and embodied in FIGS. 47 and 48 results. FIGS. 47 and 48 continue to employ the mushroom shape to assist teaching the present invention, but such a shape is clearly not necessary to carry out the teachings of the invention. In the FIGS. 47 and 48, it is seen that stripe of material 12m extends continuously over the mold parting line while insulating material 14m completes the hollow, mushroom shaped article.

FIGS. 49 and 50 embody an article 76 following an additional optional processing step using the article 74 embodied in FIGS. 47 and 48. FIG. 49 is a vertical sectional view similar to FIG. 48 while FIG. 50 is a sectional view taken substantially from the perspective of line 50-50 of FIG. 49. In FIGS. 49 and 50, highly conductive electrodeposit 16m has been electrodeposited onto the surface of conductive material 12m. Electrodeposit 16m extends continuously up one side of article 76, over its top and then down the opposite side.

Figure 51:
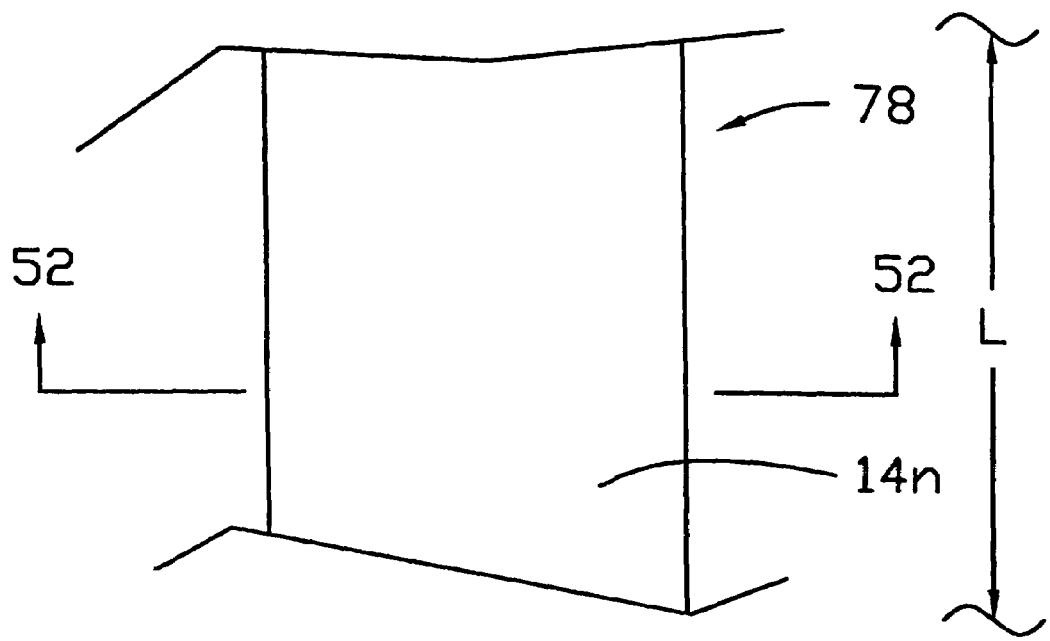
FIG. 51 is a vertical plan view of an intermediate article in the manufacture of yet another embodiment of the current invention.
Figure 52:
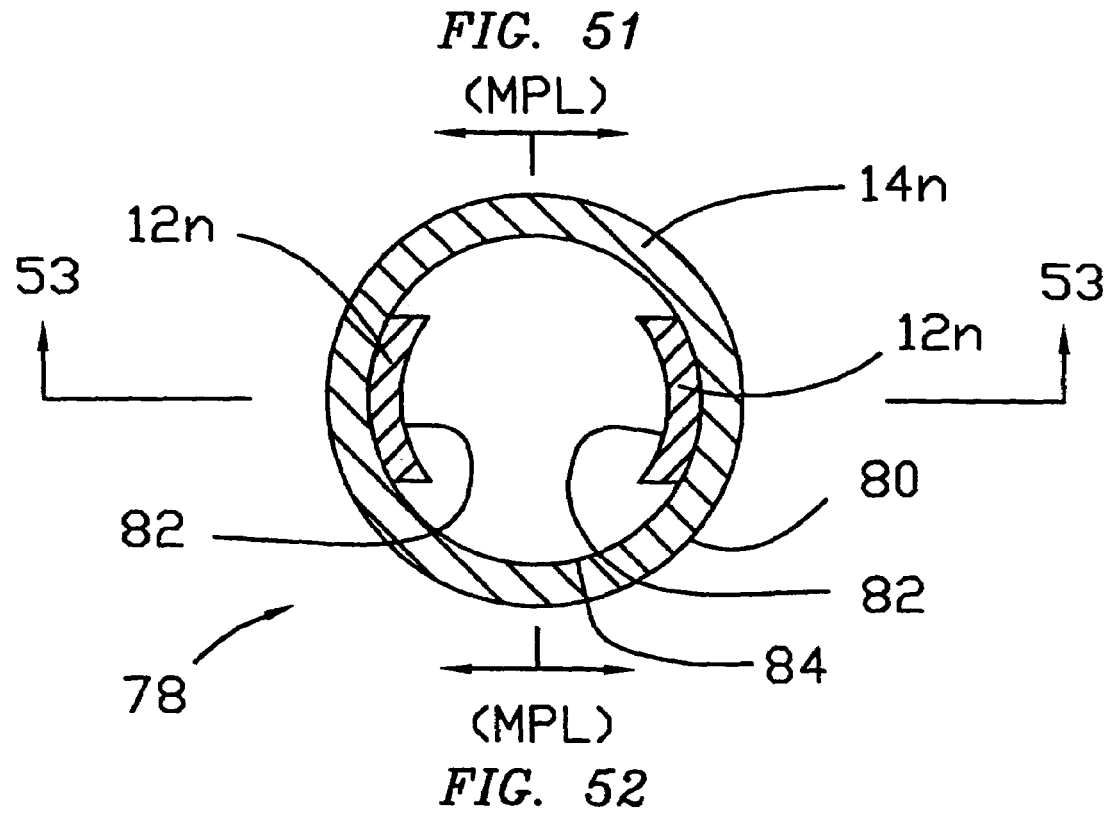
FIG. 52 is a sectional view taken substantially from the perspective of line 52-52 of FIG. 51.
Figure 53:
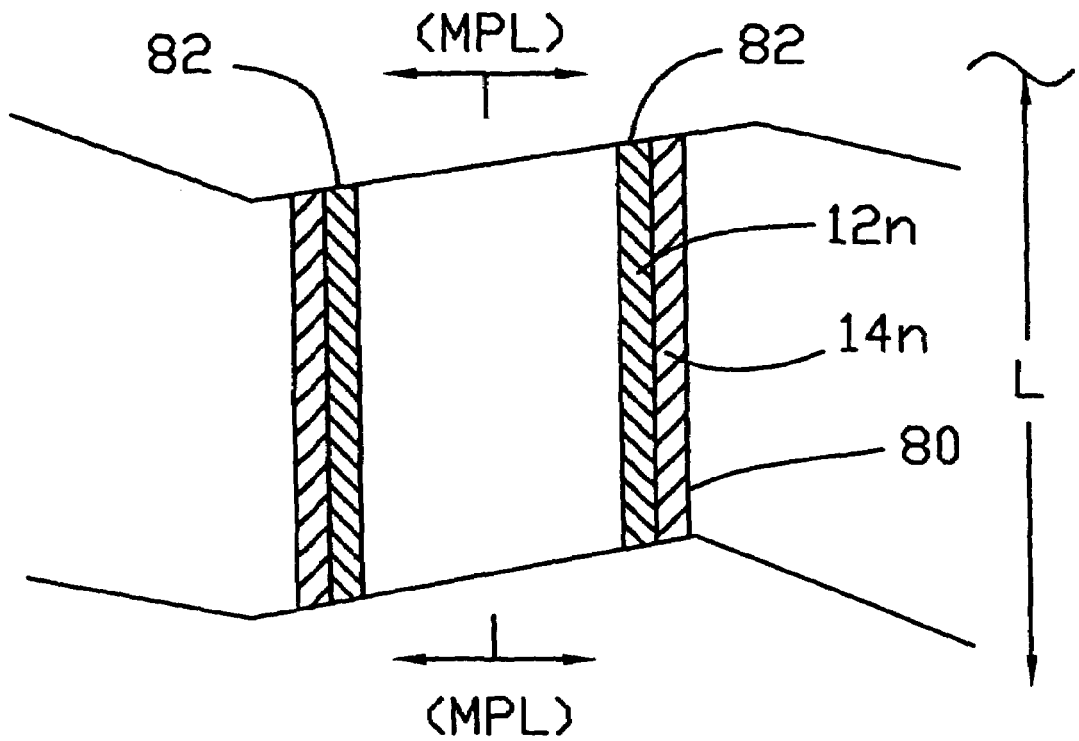
FIG. 53 is a sectional view taken substantially from the perspective of line 53-53 of FIG. 52.

Referring now to FIGS. 51 through 56, structure and methods will be taught for producing a highly conductive pattern on the inside surface of a hollow article. FIG. 51 is a vertical plan view of a parison, indicated as 78, while FIG. 52 is a view taken substantially from the perspective of line 52-52 of FIG. 51. From FIGS. 51 and 52, it is seen that parison 78 comprises a cylindrical ring 80 of insulating material 14n with stripes 82 of electrically conductive resin 12n positioned on opposite sides of the interior surface 84 of cylinder 80. This structural parison arrangement can be produced by know coextrusion techniques. "L" in FIG. 51 indicates the axial direction of cylindrical parison 78. FIG. 53, a sectional view taken substantially from the perspective of line 53-53 of FIG. 52, shows material stripe 82 to extend in the axial direction "L".

Figure 54:
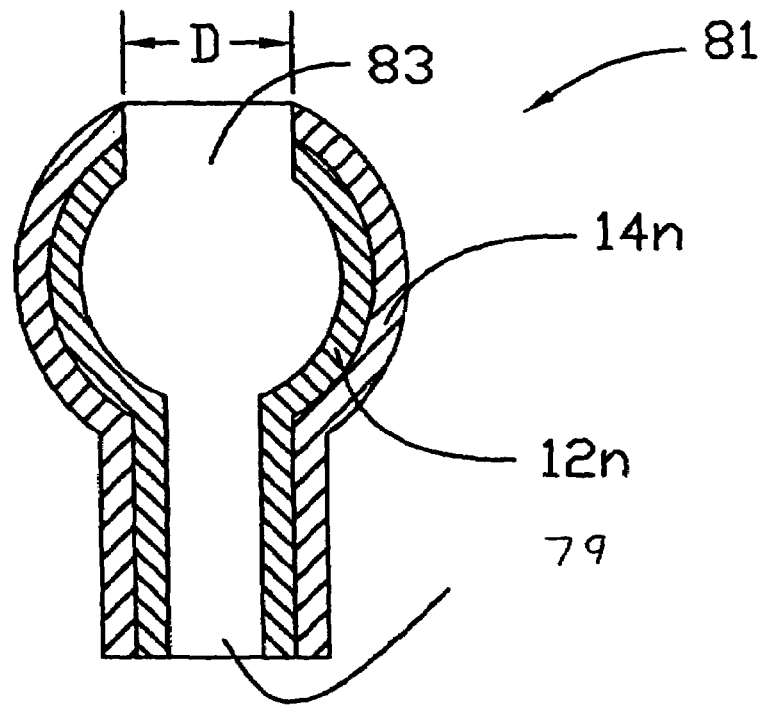
FIG. 54 is a sectional view of the intermediate article embodied in FIGS. 51 through 53 following additional processing steps.

FIG. 54 is a sectional view of a structure 81 produced by additional processing of the parison 78 embodied in FIGS. 51 through 53. The structure embodied in FIG. 54 is produced by first closing the blow mold in the direction "MPL" indicated in FIGS. 52 and 53 to pinch the parison. Pressurized gas is then injected into the cavity of the pinched parison to expand the parison to conform to the inner surface of the blow mold. The resulting object is then trimmed at each end to produce the openings identified as 79 and 83 in the FIG. 54 embodiment. Opening 83 is shown as circular of diameter "D".

Figure 55:
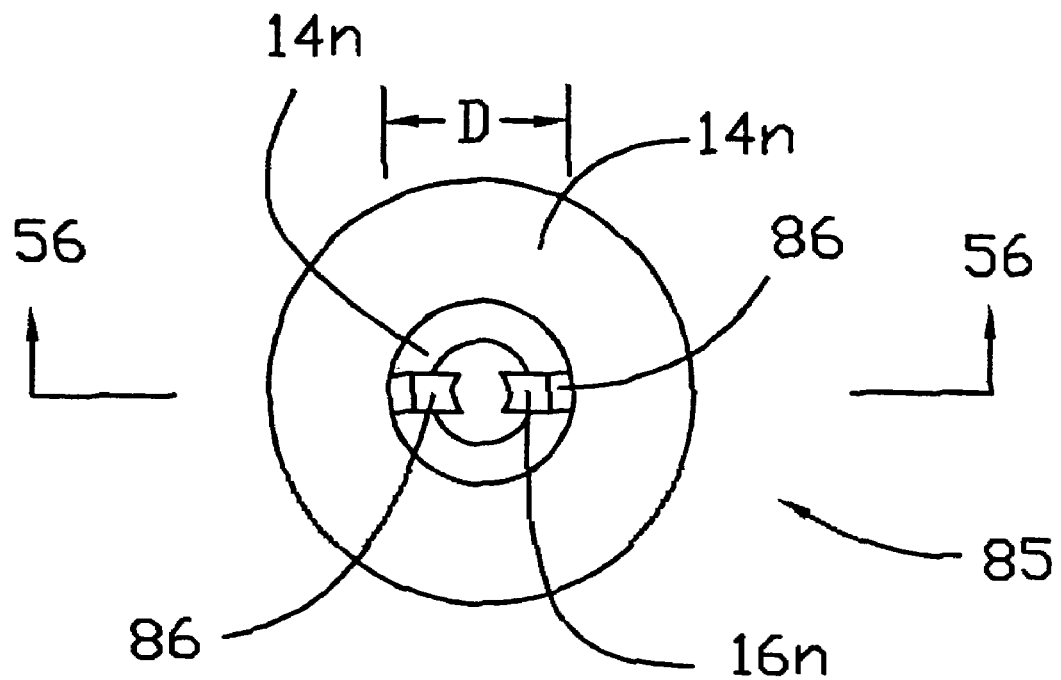
FIG. 55 is a top plan view of the article embodied in FIG. 54 following additional processing steps.
Figure 56:
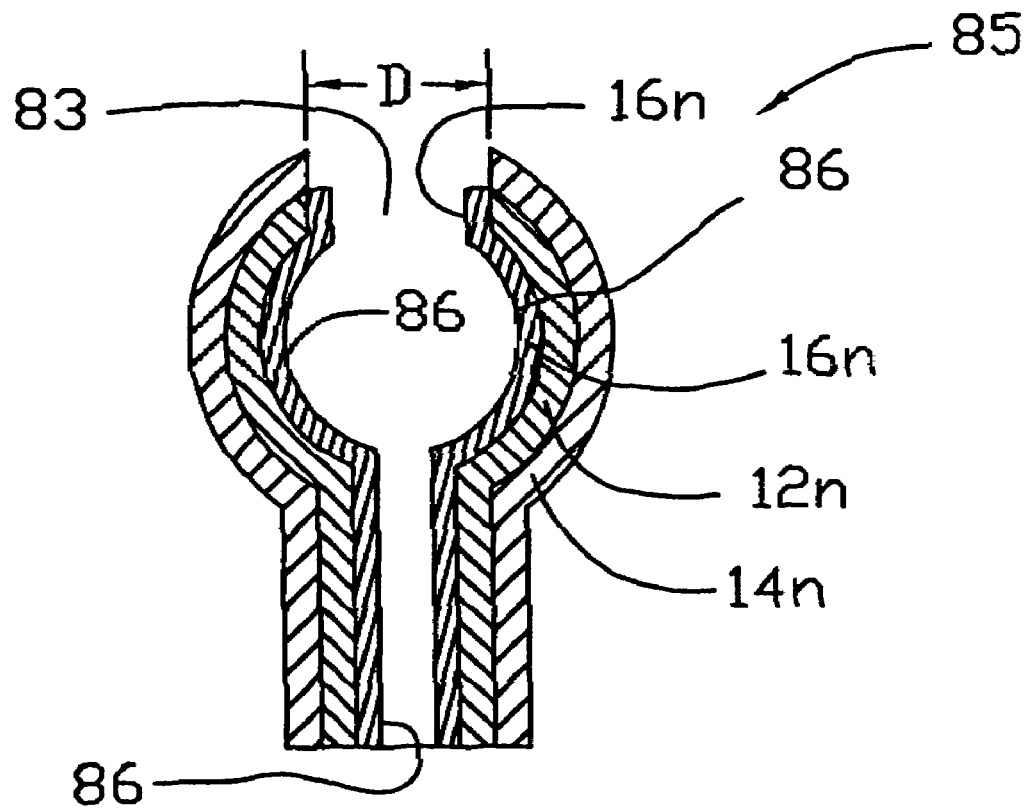
FIG. 56 is a sectional view taken substantially from the perspective of line 56-56 of FIG. 55.

FIGS. 55 and 56 show the article of FIG. 54 following an additional processing step. The structure shown in FIGS. 55 and 56 is now indicated as 85 to reflect this additional processing. Structure 85 includes highly conductive metal-based electrodeposit 16n positioned on opposite inner wall of the hollow structure in the form of oppositely disposed stripes 86.

Those skilled in the art will recognize that electrodeposition of material 16n onto internal stripes 86 of FIGS. 55 and 56 may be facilitated by use of an auxiliary anode. One also appreciates that selective metal placement on the interior surfaces of a hollow article would be difficult, if not impossible, using conventional photoetching techniques.

In the embodiments of hollow structures taught above, a process know in the art as extrusion blow molding has been embodied to produce the initial intermediate articles of manufacture comprising electrically conductive resin and insulating resin. It is understood that alternate manufacturing techniques can be employed. For example, the well-known process of injection blow molding can be considered. In this process, a "preform" is first produced by injection molding. A two-component injection molding, combining conductive resin and insulating resin, can be used to produce the preform. This "preform" is subsequently blown with pressurized gas to the expanded hollow article. Since the originally injection molded "preform" can have very good line definition, the pattern definition of conductive material combined with insulating material associated with the eventual blow molded article can be expected to be improved compared to the extrusion blow molded articles.

In the hollow structures taught in conjunction with the FIGS. 40 through 56, a number of electrically conductive resin formulations can be considered for material 12*l*, 12m, or 12n. However, if the conductive resin is to be electroplated to achieve high conductivity surface patterns on these hollow articles, it is understood that a preferred choice for the materials 12*l*, 12m or 12n is a DER.

Figure 57:
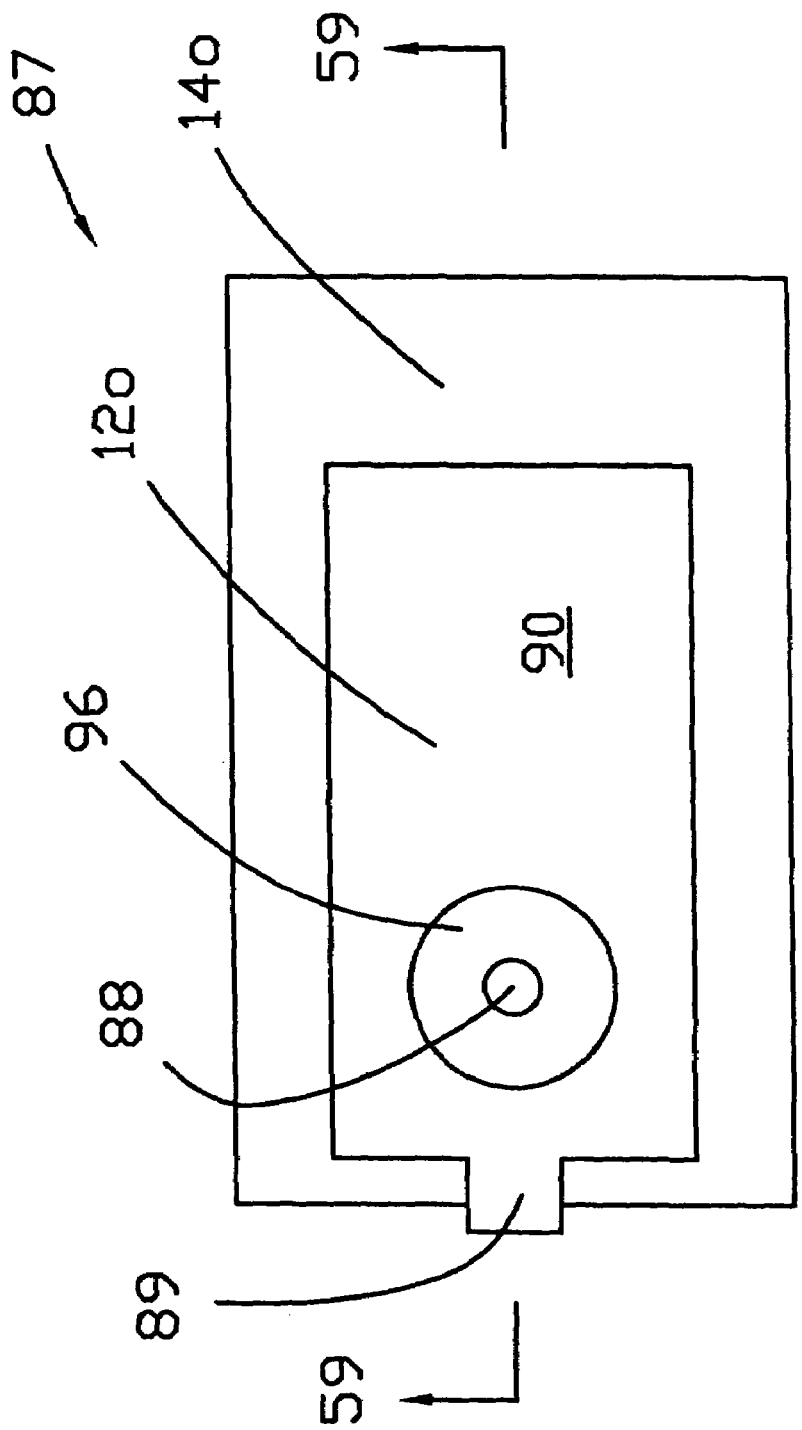
FIG. 57 is a top plan view of an intermediate article in the manufacture of yet another embodiment of the current invention.
Figure 58:
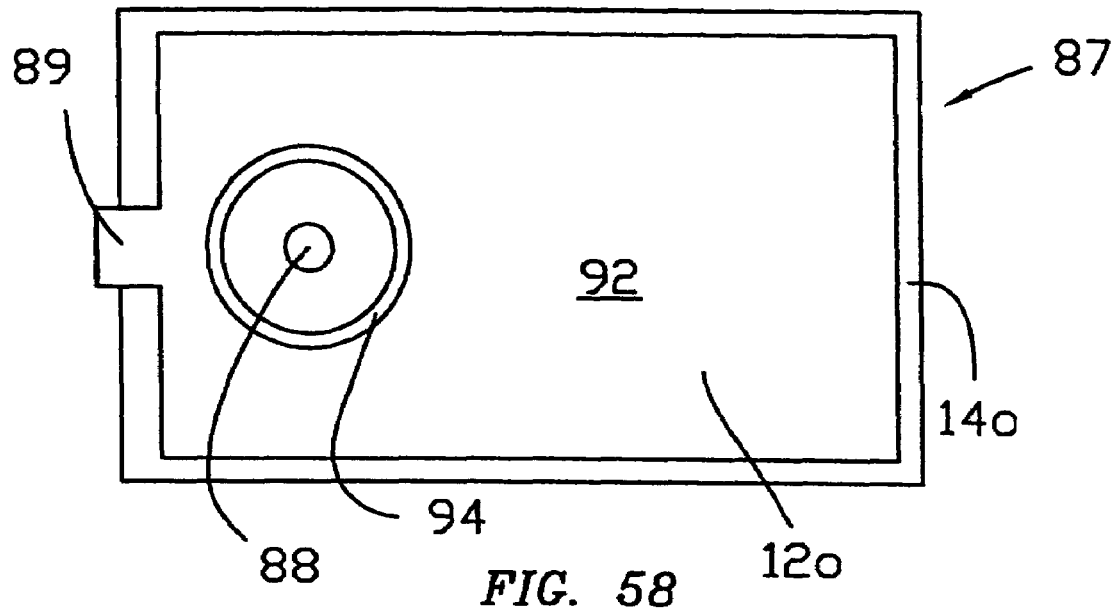
FIG. 58 is a bottom plan view of the intermediate article of manufacture embodied in the top plan view of FIG. 57.

A further embodiment of the current invention is illustrated in FIGS. 57 through 60. FIG. 57 is a top plan view of an intermediate article in the manufacture of an antenna, while FIG. 58 is a bottom plan view of the intermediate article. The intermediate article, generally indicated by numeral 87 comprises a patch 90 of electrically conductive resin 12o on its top surface supported by insulating dielectric material 14o. Article 87 further comprises a patch 92 of electrically conductive resin 12o on its bottom surface supported by material 14o. Hole or via 88 extends from bottom surface to top surface and shorting element 89 connects top patch 90 with bottom patch 92.

Figure 59:
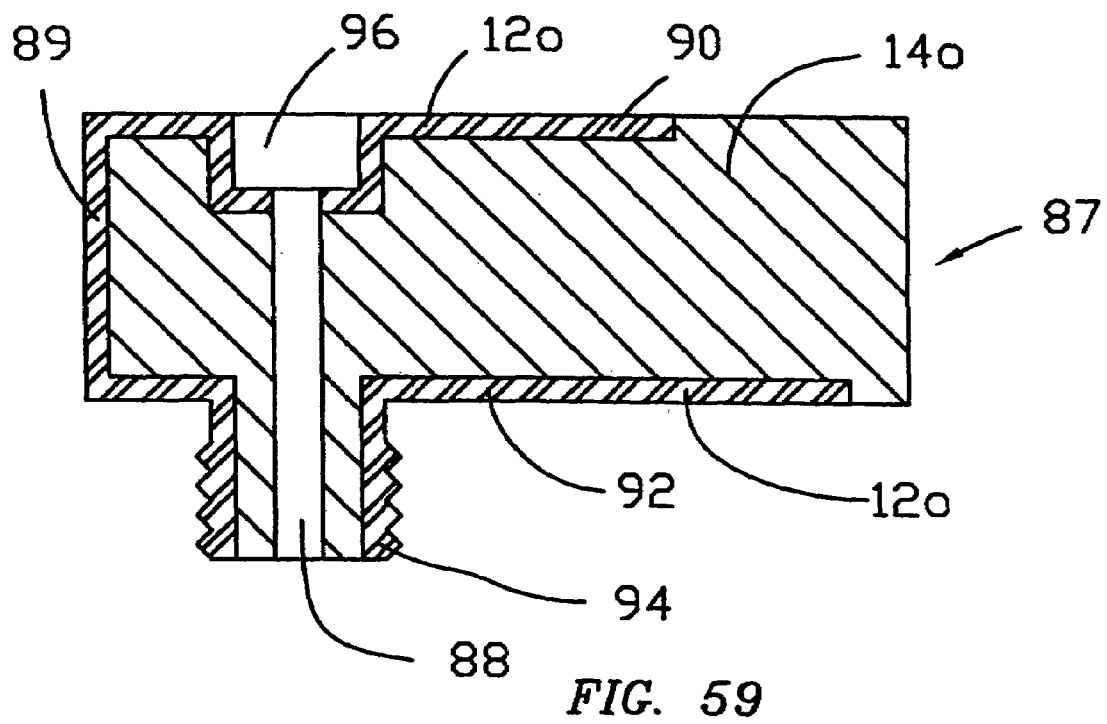
FIG. 59 is a sectional view taken substantially from the perspective of line 59-59 of FIG. 57.

FIG. 59, a sectional view taken substantially along the line 59-59 of FIG. 57, shows material 12o molded into a projecting threaded structure 94 with hole or via 88 extending axially through the structure 94 to well 96 formed on the top surface of article 87. Article 87 can be readily produced by two-shot injection molding techniques.

Figure 60:
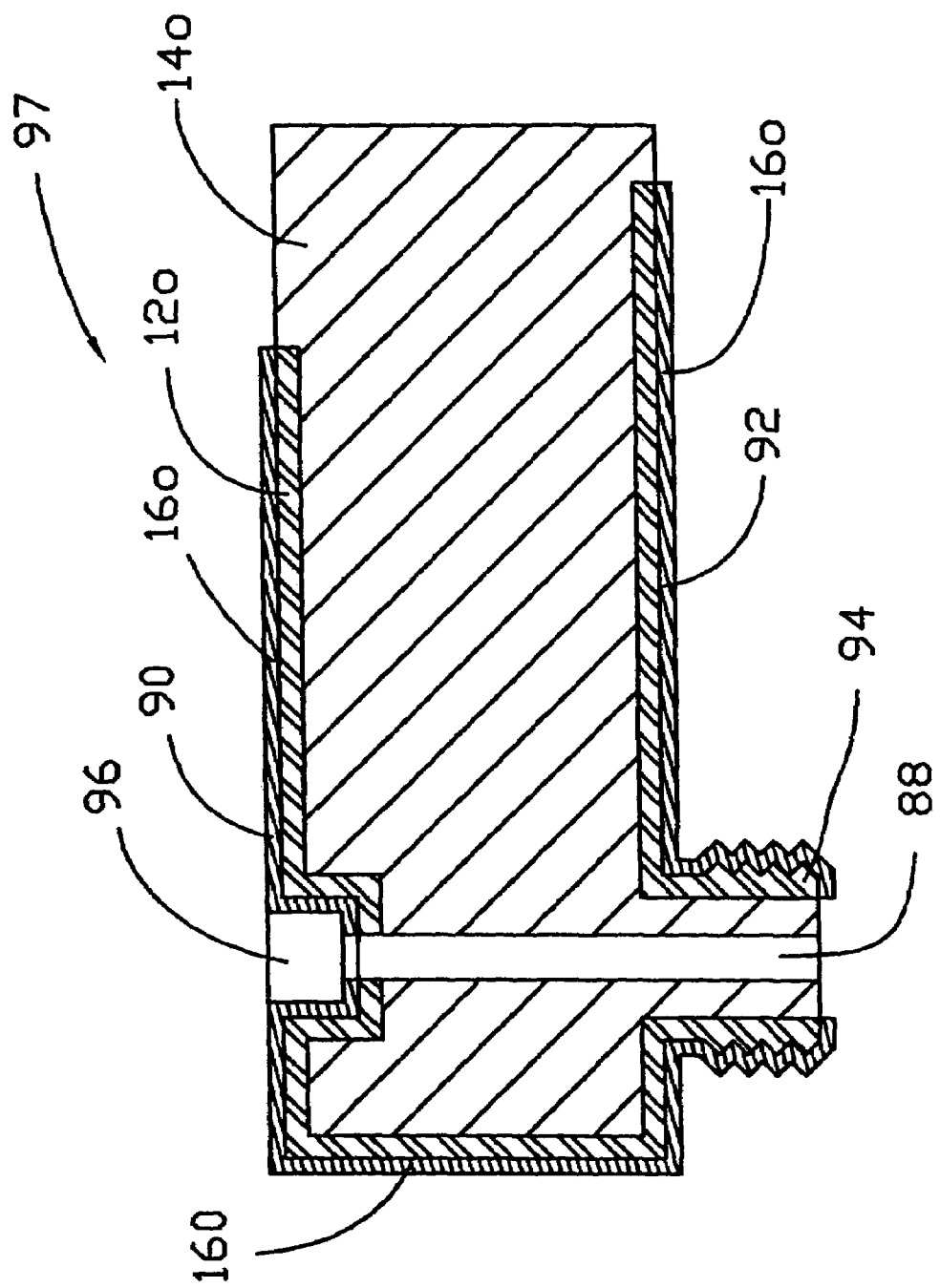
FIG. 60 is a sectional view, similar to FIG. 59, illustrating the article embodied in FIGS. 57 through 59 following additional processing steps.

FIG. 60 embodies an article following an additional processing step to the intermediate article 87 of FIGS. 57 through 59. The article of FIG. 60 is identified by numeral 97 to identify this additional processing step. In article 97, the electrically conductive resin 12o has been coated with a highly conductive metal-based electrodeposit 16o. Threaded portion 94 has also been electroplated and now forms a convenient, low resistance connecting structure for the external conductor of an input/output coaxial cable. Hole or via 88 supplies a channel whereby the internal conductor of the cable can be extended to the top patch 90 of the antenna. Well 96 forms a convenient depository for solder, conductive adhesive or mechanical connecting of the inner conductor of the input/output cable to the top patch.

As stated above, material 12o can be chosen from a number of electrically conductive resins. However, due to its characteristic rapid electrodeposit coverage and excellent electrodeposit adhesion, a DER is a preferred choice for conductive resin 12o.

Figure 61:
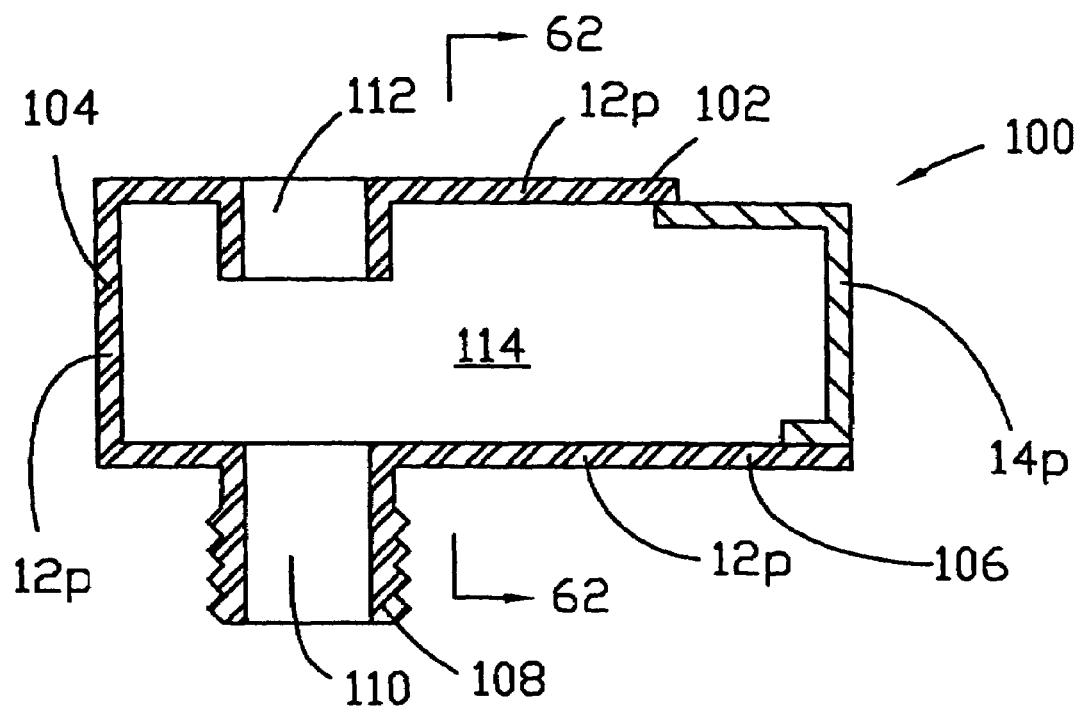
FIG. 61 is a sectional view of an intermediate article in the production of yet another embodiment of the current invention.
Figure 62:
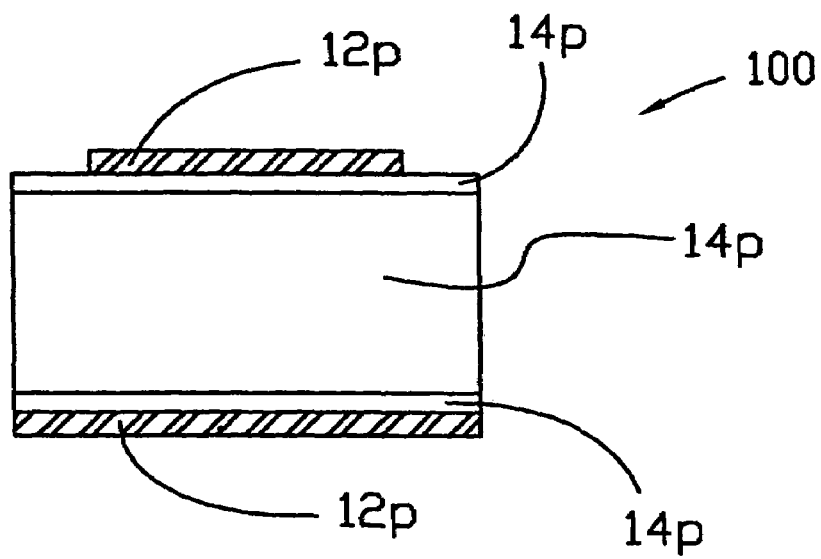
FIG. 62 is a sectional view taken substantially from the perspective of line 62-62 of FIG. 61.
Figure 63:
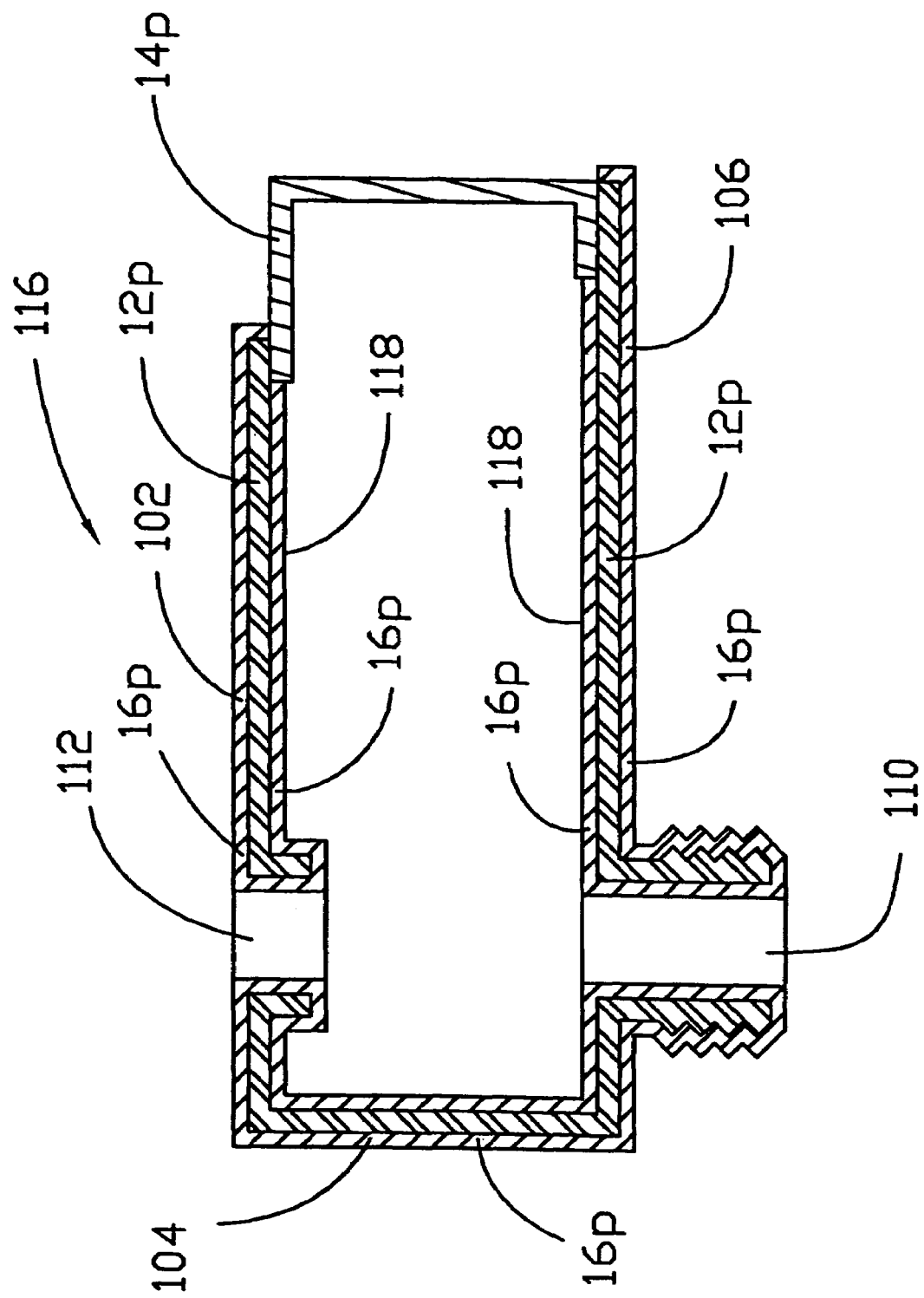
FIG. 63 is a sectional view, similar in perspective to FIG. 61, of the article embodied in FIGS. 61 and 62 following additional processing steps.

Referring now to FIGS. 61 through 63, another embodiment of a dual patch antenna is illustrated. FIG. 61, a sectional view similar in perspective to FIG. 59, shows an intermediate article of manufacture indicated by numeral 100. Article 100 comprises top patch 102, shorting element 104, bottom patch 106, threaded structure 108 and holes 110 and 112 all formed from electrically conductive resin 12p. In a preferred embodiment, the electrically conductive resin 12p is a DER. Air 114 separates top patch 102 from bottom patch 106. Optionally, insulating material 14p serves as additional support to maintain spacing between patches 102 and 106.

FIG. 63 embodies an article, identified by numeral 116, produced by further processing the article 100 embodied in FIGS. 61 and 62. As in prior embodiments, article 116 is produced by electrodepositing highly conductive metal-based material onto electrically conductive resinous material 12p. Article 116 of FIG. 63 differs from article 97 of FIG. 60 in two important respects. First, Article 116 envisions air as a dielectric separating top and bottom conductive patches 102 and 106 respectively. Second, article 116 of FIG. 63 comprises an electrodeposited metal-based layer on inner surface (indicated by numeral 118, FIG. 63) whereas article 97 has no highly conductive metal-based pattern on the inner surface of material 12o.

The present invention further contemplates use of profile extrusion as a valuable processing technique for production of novel three-dimensional conductive traces and antennas. An example of the materials, processes and structures possible employing profile extrusion techniques is embodied in FIGS. 64 through 68.

Figure 64:
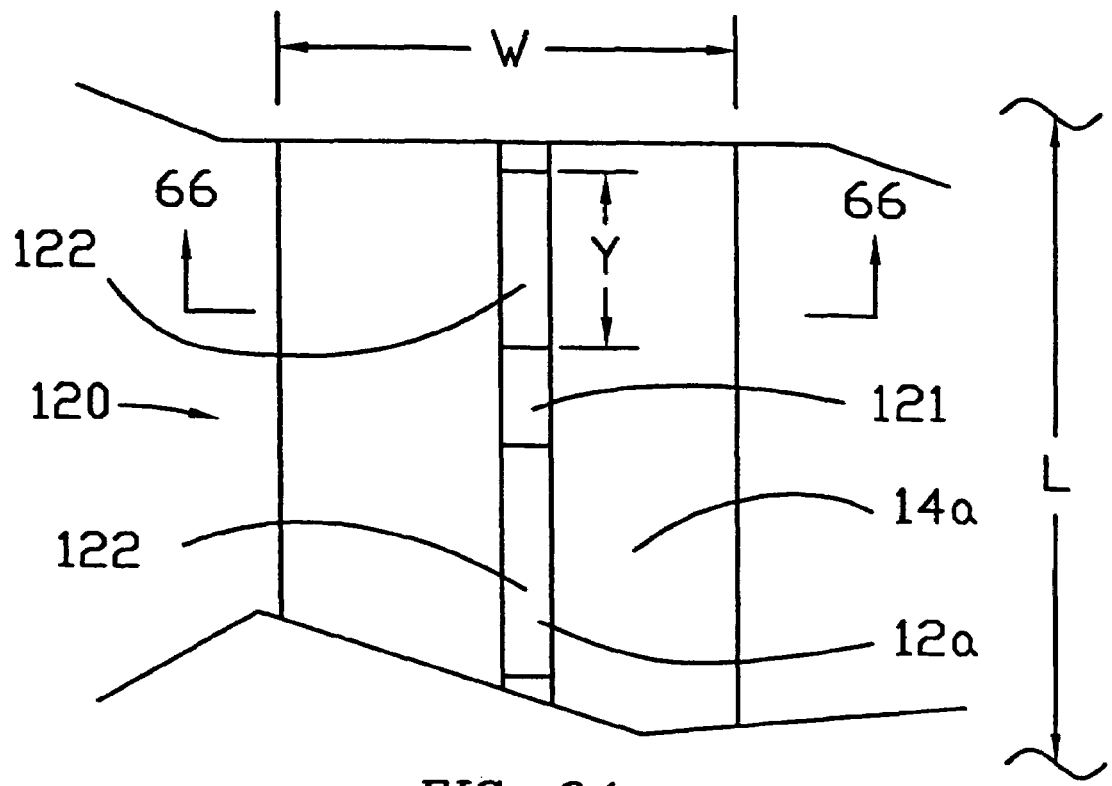
FIG. 64 is a top plan view of an intermediate article in the manufacture of yet another embodiment of the current invention.
Figure 65:
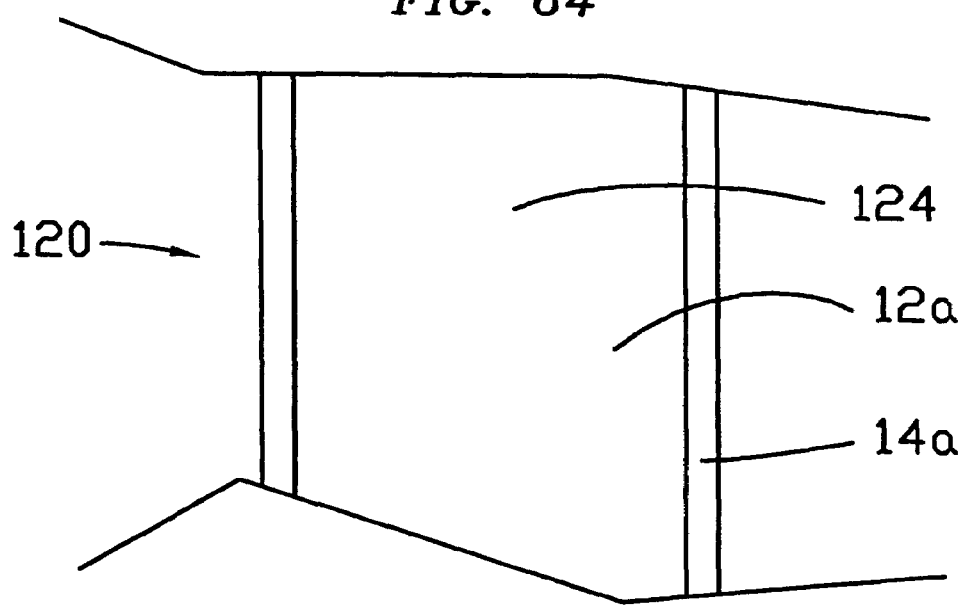
FIG. 65 if a bottom plan view of the article embodied in top plan view in FIG. 64.
Figure 66:
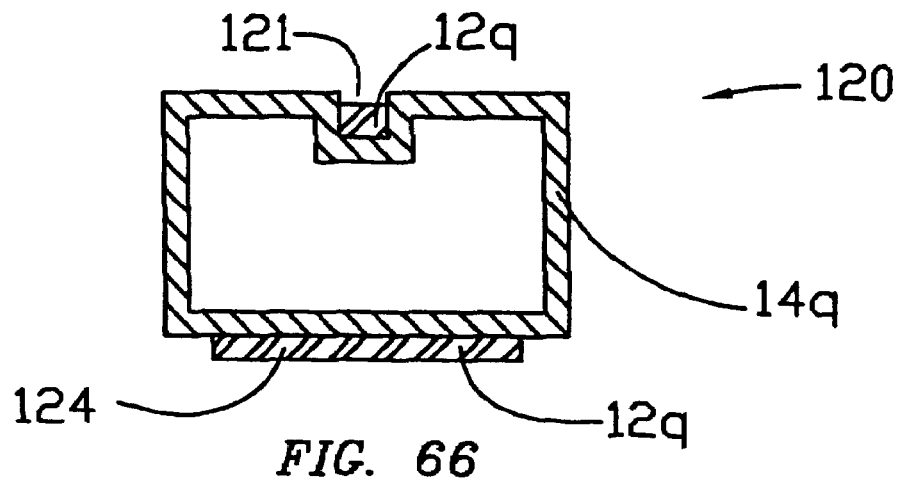
FIG. 66 is a sectional view taken substantially from the perspective of line 66-66 of FIG. 64.

FIG. 64 is a top plan view of a structure, indicated by numeral 120, produced by profile extrusion. FIG. 65 is a bottom plan view of said structure 120. FIG. 66 is a sectional view taken from the perspective of line 66-66 of FIG. 64. Reference to FIGS. 64 through 66 shows the extended structure 120 to comprise a hollow, box-like cross section of insulating material 14q extending in the direction of length "L" of FIG. 64 and having formed therein a trench 121, also extending in the direction "L". Electrically conductive resin material 12q is deposited intermittently in the trench in strips 122 of length "Y" (FIG. 64). It is contemplated that strips 122 of material 12q are formed by intermittent coextrusion, printing, screening or other known techniques. FIG. 65 shows that material 12q is positioned on the bottom surface of structure 120 as a continuous strip 124 of width slightly less than the width "W" of box-like structure 120. Material forming strip 124 need not be the same composition as that forming strip 122, and deposition techniques employed for depositing strips 122 and 124 may differ.

Figure 67:
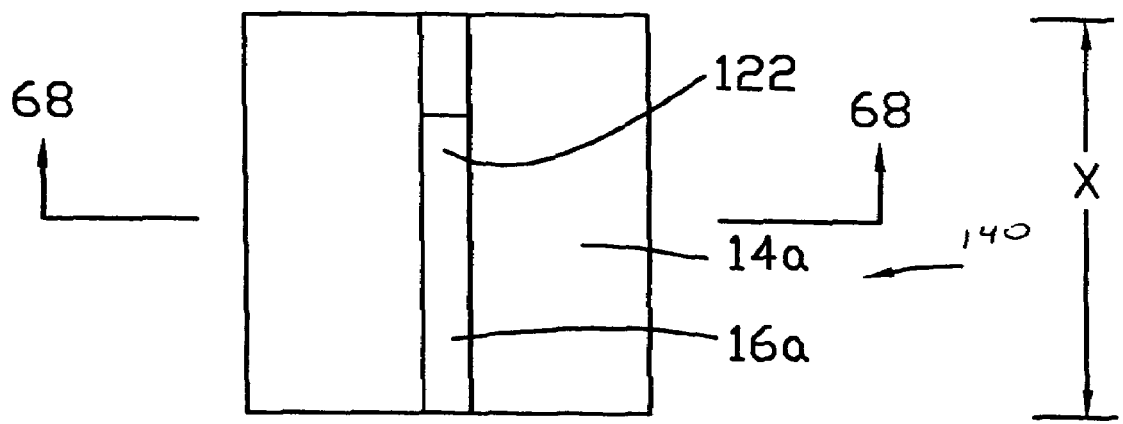
FIG. 67 is a top plan view of the article embodied in FIGS. 64 through 66 following additional processing steps.
Figure 68:
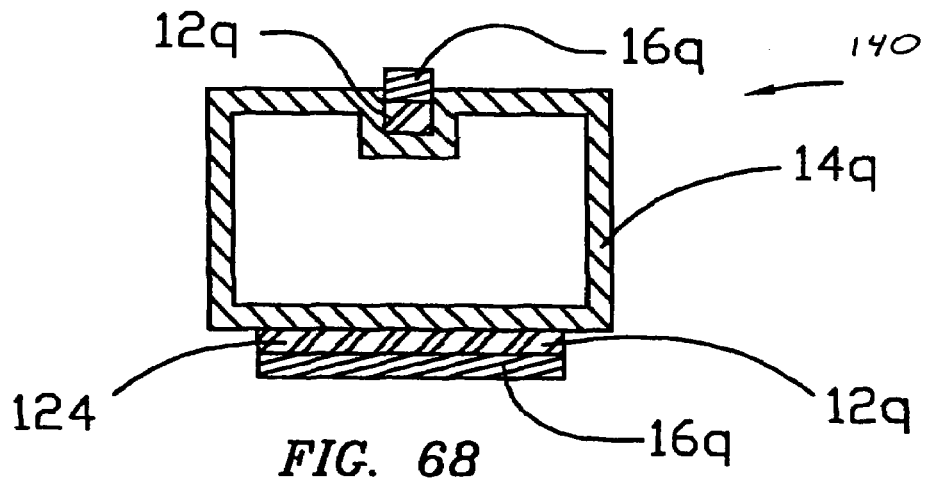
FIG. 68 is a sectional view taken substantially from the perspective of line 68-68 of FIG. 67.

FIGS. 67 and 68 embody an article achieved by additional processing of profile extrusion 120. The article of FIGS. 67 and 68 is now indicated by numeral 140 to indicate this additional processing. Article 140 is produced by first subdividing the generally continuous profile structure 120 into discrete lengths, defined as "X" in FIG. 67. The thus produced individual articles are then further processed by electrodeposition of highly conductive metal-based material onto the surface of conductive resin 12q. For reasons previously taught in this disclosure, a preferred material for electrically conductive resin 12q is a DER.

The article 140 of FIGS. 67 and 68 can constitute a very consistent, inexpensive microstrip antenna component.

EXAMPLE 1

The following solid ingredients were weighed out:
1. 33 grams of Kraton (Kraton 1450—Kraton Polymers)
2. 16.5 grams of carbon black (Vulcan XC-72—Cabot Corporation)
3. 0.5 grams of elemental sulfur These solid ingredients were mixed and dissolved in approximately 10 ounces of a Trichlorethylene solvent. This produced a fluid ink/coating formulation which, after drying, consisted of:
1. Kraton—66%
2. Carbon Black—33%
3. Sulfur—1%

This ink/coating solution was then silk screened onto a piece of Mylar plastic film in the form of an RFID antenna pattern. The antenna pattern was allowed to dry and then was immersed as a cathode in a standard Watts nickel plating bath. The antenna pattern covered quickly with nickel electrodeposit. An approximately 0.0003 inch thick copper layer was subsequently electroplated on the nickel surface from a standard acid copper bath. This resulted in a highly conductive antenna pattern. The structure so obtained performed well when tested as an antenna.

EXAMPLE 2

A DER composition comprising a polypropylene copolymer at 65%, conductive carbon black at 30%, zinc oxide at 2%, MBTS at 2% and sulfur at 1% was compounded. This DER composition was then combined with a non-conductive polypropylene copolymer using dual shot (or two shot) molding, whereby the DER composition formed an antenna pattern. The molded part was immersed as a cathode in a standard Watts nickel plating bath. The DER antenna pattern covered quickly with nickel electrodeposit. An approximately 0.0005 inch thick copper layer was subsequently electroplated on the nickel surface from a standard acid copper bath. This resulted in a highly conductive antenna pattern. The selectively electroplated antenna comprising a DER so obtained performed well when tested.

EXAMPLE 3

The following solid ingredients were weighed out:
1. 34.6 grams of Kraton 1901x polymer (Kraton Corporation)
2. 18.2 grams of carbon black (Vulcan XC-72—Cabot Corporation)
3. 1.1 grams of elemental sulfur
4. 1.1 grams of MBTS (Vulkacit DM/C—Bayer Corporation)

These ingredients were added to an Intelli Torque mixer from Brabender Corporation. The temperature was set at 190C and the ingredients were mixed for 5 minutes at 100 rpm.

The resulting solid material was then dissolved in Hisol 10 solvent supplied by Ashland Corporation. 50 grams of solid material were used for every 165 grams of solvent. This mixture was then ball milled for approximately 48 hours.

The resulting DER ink was then flexographically printed onto a roll of Melinex 535 PET film from Dupont Corporation. The printed structures comprised RFID antenna patterns perpendicularly attached with a 1 inch repeat spacing to a continuous buss strip. The ink formulation once dry was measured at approximately 1.25 microns thick and consisted of approximately the following:
1. Kraton 1901x—63%
2. Carbon Black XC-72—33%
3. Elemental sulfur—2%
4. MBTS—2%

The printed antenna and buss structures were then continuously electroplated in a standard Watts nickel bath. The temperature of the bath was approximately 135 degrees F. and the ph was approximately 3.80. The buss structure was cathodically contacted with a contact placed under the level of the solution. Metal was observed to grow away from the contact over the surface of the DER buss and then subsequently over the surfaces of the DER antennas. The Melinex film was pulled through the nickel plating bath at a rate of approximately 3 inches per minute with an imposed potential of 6 volts. Thus RFID antennas were selectively electroplated in a continuous manner with each antenna pattern being electroplated with approximately 10 microns of nickel.

EXAMPLE 4

The following solid ingredients were weighed out:
1. 34.6 grams of Kraton 1901x polymer (Kraton Corporation)
2. 18.2 grams of carbon black (Vulcan XC-72—Cabot Corporation)
3. 1.1 grams of elemental sulfur
4. 1.1 grams of MBTS (Vulkacit DM/C—Bayer Corporation)

These ingredients were added to a Intelli Torque mixer from Brabender Corporation. The temperature was set at 190C and the ingredients were mixed for 5 minutes at 100 rpm.

The resulting solid material was then dissolved in Hisol 10 solvent from Ashland Corporation. 50 grams of material were used for every 165 grams of solvent. This mixture was then ball milled for approximately 48 hours.

The resulting DER ink was then rotary screen printed onto a roll of Melinex 535 PET film from Dupont Corporation. The printed structures comprised RFID antenna patterns having a 1.33 inch repeat spacing perpendicularly attached to a continuous DER buss strip. The ink formulation once dry was measured at approximately 2.5-4 microns thick and consisted of the approximately the following:
1. Kraton 1901x—63%
2. Carbon Black XC-72—33%
3. Elemental sulfur—2%
4. MBTS—2%

The printed antenna and buss structures were then continuously electroplated in a standard Watts nickel bath followed by a bright acid copper bath. The buss structure came into contact with both an exterior contact as well as a contact placed under the level of the solution. Metal was observed to grow away from the "under solution" contact over the surface of the DER buss and then subsequently over the surfaces of the DER antennas. The Melinex film was first pulled through the nickel plating bath and then the copper plating bath at a rate of approximately 3 inches per minute. Approximately 8 microns of nickel followed by 5 microns of copper was deposited on each antenna. Thus RFID antenna patterns were selectively electroplated in a continuous manner. Following the electroplating the buss was separated by slitting to result in distinct RFID antennas. The antennas thus produced performed well when tested.

Although the present invention has been described in conjunction with preferred embodiments, it is to be understood that modifications, alternatives and equivalents may be included without departing from the spirit and scope of the invention, as those skilled in the art will readily understand. Such modifications, alternatives and equivalents are considered to be within the purview and scope of the invention and following claims.

EXAMPLE 5

Two strips of ink were coated onto a PET substrate, both strips electrically contacting a common metal cathodic contact. A first strip was formed of the ink as prepared as described in Example 3. This first strip comprised a "single coat" of material applied with an artist's brush. The strip was 1 inch wide and had a length of 8 inches extending from the contact. The thickness of this first strip was determined to be approximately 0.00075 inches and its surface resistivity was measured as 2,000 ohms per square. The second strip was formed from material as for Example 3, but absent the sulfur and MBTS. This second strip comprised multiple coats of ink applied with the artist's brush. The second strip also was 1 inch wide and extended 8 inches from the cathodic contact. The thickness of the second strip was determined to be approximately 0.004 inches and its surface resistivity was measured as 300 ohms per square. Thus the second strip has approximately 6-7 times the current carrying capacity of the first strip.

The two material strips supported on the PET substrate were immersed in a standard Watts electroplating bath at 3 volts applied potential. The bath temperature was 135 degrees F. and the ph was 3.9.

It was observed that the first strip (comprising sulfur and MBTS) covered rapidly and all 8 inches of length was completely covered with nickel electrodeposit in 75 seconds. During this time the second strip (without the sulfur and MBTS) covered approximately 1 inch with nickel electrodeposit. The second strip was left in the electroplating bath for 10 additional minutes at 3 volts of applied potential. After the 10 minutes the second strip had covered only approximately 5 inches from the contact (3 inches remained uncovered).

This comparative example clearly demonstrates the benefits of a "growth rate accelerator" (in this case sulfur and MBTS combination) as taught in this specification and claims. It is noted that despite having far greater current carrying capacity than the first strip, the second strip absent the "coverage rate accelerator" covered far slower than the first strip comprising the "coverage rate accelerator".

What is claimed is:

1. An antenna having a structural pattern, at least a portion of said structural pattern being defined by a Directly Electroplateable Resin.

2. An antenna according to claim 1 wherein said Directly Electroplateable Resin comprises an electrically conductive filler.

3. An antenna according to claim 2 wherein said electrically conductive filler comprises carbon black.

4. An antenna according to claim 1 wherein the electrodeposit coverage rate accelerator of said Directly Electroplateable Resin comprises an element chosen from Group VI.

5. An antenna according to claim 4 wherein at least a portion of said electrodeposit coverage rate accelerator is a source of sulfur.

6. An antenna according to claim 5 wherein said source of sulfur is elemental sulfur.

7. An antenna according to claim 5 wherein said source of sulfur comprises a sulfur donor.

8. An antenna according to claim 1 comprising an electrodeposit in direct contact with at least a portion of said Directly Electroplateable Resin.

9. An antenna according to claim 8 wherein said electrodeposit is a metal based electrodeposit.

10. An antenna according to claim 8 wherein said electrodeposit comprises a Group VIII metal or Group VIII metal based alloy.

11. An antenna according to claim 10 wherein said Group VIII metal or Group VIII metal based alloy comprises a metal chosen from the group nickel, cobalt and iron.

12. An antenna according to claim 8 wherein said electrodeposit is selectively deposited in direct contact with said portion of said Directly Electroplateable Resin.

13. An antenna according to claim 8 wherein at least one additional metal based layer is joined to said electrodeposit.

14. An antenna according to claim 1 further characterized as having a low profile.

15. An antenna according to claim 1 suitable for use in an RFID tag.

16. An antenna, at least a portion of which comprises an electrodeposited metal or metal based alloy, said portion being in direct contact with a directly electroplateable resin (DER).

17. Multiple antennas, each of said multiple antennas having a structural pattern, at least a portion of said structural patterns being defined by a polymeric resin, said multiple antennas further characterized as comprising electrodeposited metal overlaying portions of said polymeric resin, said multiple antennas further being positioned on a common web.

18. The multiple antennas of claim 17 further characterized as having said polymeric resin comprising an electrically conductive polymer.

19. Multiple antennas as in claim 18 wherein said electrodeposited metal is in direct contact with said electrically conductive polymer.

20. Multiple antennas as in claim 18 wherein said electrically conductive polymer is a Directly Electroplateable Resin.

21. Multiple antennas as in claim 17 further characterized by being initially connected by an electrically conductive buss.

22. The multiple antennas of claim 21 wherein said electrically conductive buss comprises an electrically conductive polymer.

23. The multiple antennas of claim 22 wherein said electrically conductive polymer associated with said buss comprises a Directly Electroplateable Resin.

24. An antenna having a structural pattern, at least a portion of said structural pattern being defined by a polymeric resin and an electrodeposit overlaying a portion of said polymeric resin, said antenna further characterized by having an additional conductive surface positioned vicinal said structural pattern, said electrodeposit extending from said structural pattern to said additional conductive surface.

25. An antenna according to claim 24 wherein said additional conductive surface is a lead surface to an electrical device.

26. An antenna according to claim 25 wherein said device comprises a chip.

27. An antenna according to claim 24 wherein said polymeric resin comprises an electrically conductive resin.

28. An antenna according to claim 27 wherein said electrically conductive resin comprises a Directly Electroplateable Resin.

29. The multiple antennas of claim 17 wherein said electrodeposited metal comprises copper.

30. The multiple antennas of claim 17 wherein said electrodeposited metal comprises a metal from Group VIII of the Periodic Table of Elements.

31. The multiple antennas of claim 30 wherein said metal is chosen from the group nickel, iron and cobalt.

32. Multiple antennas, each of said multiple antennas having a structural pattern, at least a portion of said structural patterns being defined by a patterned polymeric resin, said multiple antennas further characterized as comprising metal overlaying portions of said patterned polymeric resin, said multiple antennas further being positioned on a common web.

33. The multiple antennas of claim 32 wherein said patterned polymeric resin is a printed pattern.

34. The multiple antennas of claim 32 wherein said patterned polymeric resin comprises an electrically conductive polymer.

35. The multiple antennas of claim 34 wherein said electrically conductive polymer comprises a Directly Electroplateable Resin (DER).

36. The multiple antennas of claim 32 wherein said antennas have a low profile suitable for use in an RFID tag.

37. The multiple antennas of claim 32 wherein said metal comprises an electrodeposit.

* * * * *